(12) United States Patent
Iizuka et al.

(10) Patent No.: US 10,410,720 B2
(45) Date of Patent: Sep. 10, 2019

(54) MULTI-LAYER RESISTIVE MEMORY DEVICE WITH VARIABLE RESISTANCE ELEMENTS

(71) Applicant: Toshiba Memory Corporation, Tokyo (JP)

(72) Inventors: Takahiko Iizuka, Yokohama Kanagawa (JP); Daisaburo Takashima, Yokohama Kanagawa (JP); Ryu Ogiwara, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,957

(22) Filed: Sep. 4, 2017

(65) Prior Publication Data
US 2018/0277202 A1     Sep. 27, 2018

(30) Foreign Application Priority Data
Mar. 23, 2017   (JP) .................. 2017-057798

(51) Int. Cl.
*G11C 13/00*   (2006.01)
*H01L 23/528*   (2006.01)
(Continued)

(52) U.S. Cl.
CPC .............. *G11C 13/004* (2013.01); *G11C 7/04* (2013.01); *G11C 13/003* (2013.01); *G11C 13/0004* (2013.01); *G11C 13/0023* (2013.01); *G11C 13/0033* (2013.01); *G11C 13/0069* (2013.01); *H01L 23/528* (2013.01); *H01L 27/2409* (2013.01); *H01L 27/2481* (2013.01);
(Continued)

(58) Field of Classification Search
CPC .............. G11C 13/0069; G11C 13/004; G11C 13/0004
See application file for complete search history.

(56) References Cited

U.S. PATENT DOCUMENTS 7,092,282 B2   8/2006  Asao
7,317,469 B2   1/2008  Kim et al.
(Continued)

FOREIGN PATENT DOCUMENTS

JP   2005346900 A   12/2005
JP   2007201081 A   8/2007
(Continued)

*Primary Examiner* — Mushfique Siddique
(74) *Attorney, Agent, or Firm* — Kim & Stewart LLP

(57) ABSTRACT

A semiconductor memory device includes a first conductor extending in a first direction and a second conductor extending in a second direction and disposed above the first conductor in a third direction. Third and fourth conductors extend in the first direction and adjacent to each other in the second direction. The third and fourth conductors are above the second conductor. A fifth conductor includes a variable resistance unit and is between the first and second conductors. A sixth conductor includes a variable resistance unit and is between the third and second conductors. A seventh conductor includes a variable resistance unit and is between the fourth and second conductors. A center point of the fifth conductor along a width of the fifth conductor is does not fully overlap with either of the sixth or seventh conductors along the third direction.

9 Claims, 37 Drawing Sheets

(51) Int. Cl.
  *H01L 45/00* (2006.01)
  *H01L 27/24* (2006.01)
  *G11C 7/04* (2006.01)

(52) U.S. Cl.
  CPC .......... *H01L 45/06* (2013.01); *H01L 45/1233* (2013.01); *H01L 45/1253* (2013.01); *H01L 45/144* (2013.01); *G11C 13/0026* (2013.01); *G11C 13/0028* (2013.01); *G11C 13/0038* (2013.01); *G11C 2013/0045* (2013.01); *G11C 2013/0078* (2013.01); *G11C 2213/71* (2013.01); *G11C 2213/72* (2013.01)

(56) References Cited

U.S. PATENT DOCUMENTS

| | | | |
|---|---|---|---|
| 7,372,726 B2 | 5/2008 | Matsuoka et al. | |
| 7,405,964 B2 | 7/2008 | Philipp et al. | |
| 7,532,508 B2 | 5/2009 | Fuji | |
| 8,384,061 B2* | 2/2013 | Mikawa | H01L 27/101 257/2 |
| 8,542,519 B2 | 9/2013 | Asao et al. | |
| 8,717,840 B2 | 5/2014 | Higashi et al. | |
| 9,136,468 B2 | 9/2015 | Nakai et al. | |
| 9,412,449 B2 | 8/2016 | Ogiwara et al. | |
| 2002/0018355 A1* | 2/2002 | Johnson | G11C 11/5692 365/103 |
| 2008/0310211 A1* | 12/2008 | Toda | G11C 13/0004 365/148 |
| 2009/0003047 A1* | 1/2009 | Toda | G11C 13/00 365/163 |
| 2009/0141532 A1* | 6/2009 | Nagashima | G11C 5/02 365/51 |
| 2009/0201710 A1* | 8/2009 | Ueda | G11C 7/062 365/51 |
| 2011/0026301 A1* | 2/2011 | Ozawa | G11C 5/02 365/148 |
| 2012/0014164 A1* | 1/2012 | Kamoshida | G11C 13/0004 365/148 |
| 2012/0217461 A1* | 8/2012 | Kobayashi | H01L 45/08 257/2 |
| 2012/0294073 A1 | 11/2012 | Lee | |
| 2013/0250652 A1* | 9/2013 | Toda | G11C 13/0069 365/148 |
| 2014/0098594 A1* | 4/2014 | Azuma | H01L 27/2418 365/148 |
| 2014/0321194 A1* | 10/2014 | Sonehara | G11C 13/0097 365/148 |
| 2016/0180930 A1 | 6/2016 | Ogiwara et al. | |

FOREIGN PATENT DOCUMENTS

| | | |
|---|---|---|
| JP | 2008071473 A | 3/2008 |
| JP | 4322481 B2 | 9/2009 |
| JP | 4834542 B2 | 12/2011 |
| JP | 5502635 B2 | 5/2014 |
| JP | 5624573 B2 | 11/2014 |
| JP | 5826779 B2 | 12/2015 |

* cited by examiner

COMPARATIVE EXAMPLE

FIRST EXEMPLARY EMBODIMENT

COMPARATIVE EXAMPLE

SECOND EXEMPLARY EMBODIMENT

MULTI-LAYER RESISTIVE MEMORY DEVICE WITH VARIABLE RESISTANCE ELEMENTS

CROSS-REFERENCE TO RELATED APPLICATION

This application is based upon and claims the benefit of priority from Japanese Patent Application No. 2017-057798, filed Mar. 23, 2017, the entire contents of which are incorporated herein by reference.

FIELD

Embodiments described herein relate generally to a semiconductor memory device.

BACKGROUND

There is known a semiconductor memory device using a variable resistance element in a memory cell.

BRIEF SUMMARY OF THE INVENTION

Figure 1:
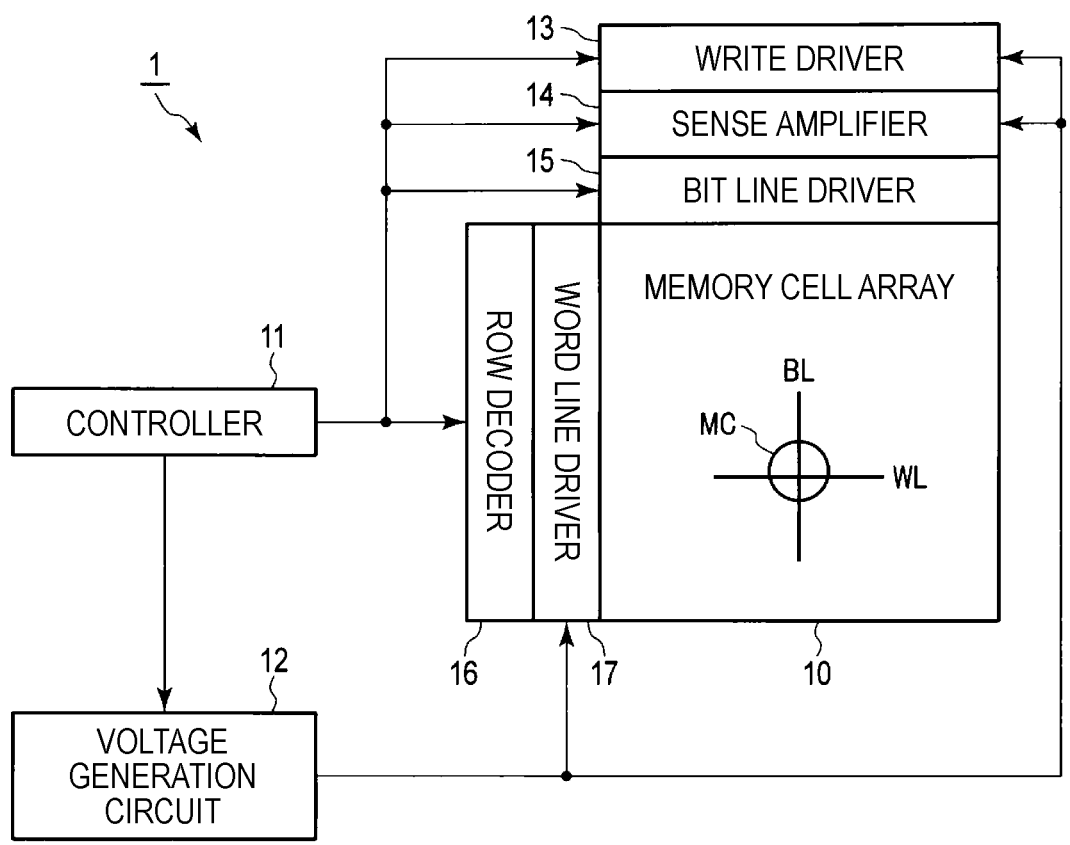
FIG. 1 is a block diagram of a semiconductor memory device according to a first embodiment.

In general, according to one embodiment, a semiconductor memory device includes a first conductor extending in a first direction and a second conductor extending in a second direction different from the first direction. The second conductor is above the first conductor in a third direction orthogonal to the first and second directions. Third and fourth conductors are each extending in the first direction and are adjacent to each other in the second direction. The third and fourth conductors are above the second conductor in the third direction. A fifth conductor includes a variable resistance unit and is between the first and second conductors in the third direction. A sixth conductor includes a variable resistance unit and is between the third and second conductors in the third direction. A seventh conductor includes a variable resistance unit and is between the fourth and second conductors in the third direction. A center point of the fifth conductor along a width of the fifth conductor in the second direction does not fully overlap with either of the sixth or seventh conductors along the third direction.

DETAILED DESCRIPTION

Hereinafter, example embodiments will be described with reference to the drawings. The drawings are schematic. Each described embodiment exemplifies an apparatus or a method embodying the technical concepts the present disclosure. The present disclosure is not necessarily limited to specific materials, shapes, structures, arrangements, etc. of constituent parts as those examples described below. In the following description, elements having substantially the same function and configuration are denoted by the same reference numerals. In certain cases, an indexing number or other character may be appended to a reference numeral to distinguish between multiple instances of elements having the same configuration. When there is no need to distinguish between multiple instances of the same element, then only the base reference numeral is used.

A semiconductor memory device according to present disclosure is a resistance change memory incorporating a variable resistance element in a memory cell, and is, for example, a phase change memory such as a phase change memory (PCM), an interfacial phase change memory (iPCM), or a phase-change RAM (PRAM).

[1] First Embodiment

Hereinafter, a semiconductor memory device according to a first embodiment will be described by taking a phase change memory as an example.

[1-1] Configuration
[1-1-1] Entire Configuration of Semiconductor Memory Device 1

First, the entire configuration of a semiconductor memory device 1 according to a first embodiment will be described with reference to FIG. 1. FIG. 1 illustrates a block diagram of the semiconductor memory device 1. As illustrated in FIG. 1, the semiconductor memory device 1 includes a memory cell array 10, a controller 11, a voltage generation circuit 12, a write driver 13, a sense amplifier 14, a bit line driver 15, a row decoder 16, and a word line driver 17.

The memory cell array 10 is a plurality of memory cells MC associated with word lines WL and bit lines BL. Each memory cell MC includes a variable resistance element, and stores data, in a non-volatile manner, according to a resistance value of the variable resistance element. The variable resistance element may be placed in, for example, either a high resistance state or a low resistance state, and in such a case, the memory cell MC stores one bit of data. Specifically, for example, it is defined that when the variable resistance element is placed in a high resistance state, the memory cell MC stores data of having a value of "1," and when the variable resistance element is placed in a low resistance state, the memory cell MC stores data having a value of "0." The data allocation is not limited to this, and may be set to any arbitrary value.

The controller 11 controls the overall operation of the semiconductor memory device 1. For example, the controller 11 controls the voltage generation circuit 12, the write driver 13, and the sense amplifier 14 based on a command received from an external memory controller, and controls the bit line driver 15 and the row decoder 16 based on address information received from the external memory controller.

The voltage generation circuit 12 generates a voltage required for writing and reading data or the like based on the control of the controller 11. Then, the voltage generation circuit 12 supplies the generated voltage to, for example, the write driver 13, the sense amplifier 14, and the word line driver 17. The voltage generation circuit 12 includes, for example, a step-up circuit, a step-down circuit, and a bandgap reference (BGR) circuit. The BGR circuit generates a constant voltage independent of temperature or an external power supply, and the voltage generated by the BGR circuit is used as, for example, a reference voltage.

The write driver 13 applies a desired voltage to a selected bit line BL during a write operation. Specifically, the write driver 13 transmits a write voltage generated by the voltage generation circuit 12 to the selected bit line BL.

The sense amplifier 14 senses a current on a selected bit line BL during a read operation, thereby determining which data has been stored in the memory cell MC. Specifically, the sense amplifier 14 determines the data stored in the memory cell by comparing a reference current generated by a reference current generation circuit to the current flowing through the selected bit line BL and the memory cell MC. The sense amplifier 14 may determine which data is stored in the memory cell MC by sensing a voltage corresponding to the current flowing through the selected bit line.

The bit line driver 15 selects a bit line BL based on the control of the controller 11. Specifically, the bit line driver 15 electrically connects the selected bit line BL to the write driver 13 during a write operation, and electrically connects the selected bit line BL to the sense amplifier 14 during a read operation.

The row decoder 16 receives, for example, a row address signal from the controller 11, and decodes the row address signal. Then, the row decoder 16 transmits the decoded row address signal to the word line driver 17.

The word line driver 17 selects one word line WL based on the row address signal decoded by the row decoder 16. Then, the word line driver 17 applies a desired voltage to each of the selected word line WL and the unselected word line WL.

Meanwhile, the configuration of the semiconductor memory device 1 as described above is not limited thereto. For example, the semiconductor memory device may include a register that holds address information and commands received from the external memory controller, and a buffer that holds write data received from the outside or read data read from the memory cell array 10. Data or the like transmitted and received between the semiconductor memory device 1 and the external memory controller is transmitted and received via an input/output circuit (not illustrated) provided in the semiconductor memory device 1.

[1-1-2] Circuit Configuration of Memory Cell Array 10 and Bit Line Driver 15

Figure 2:
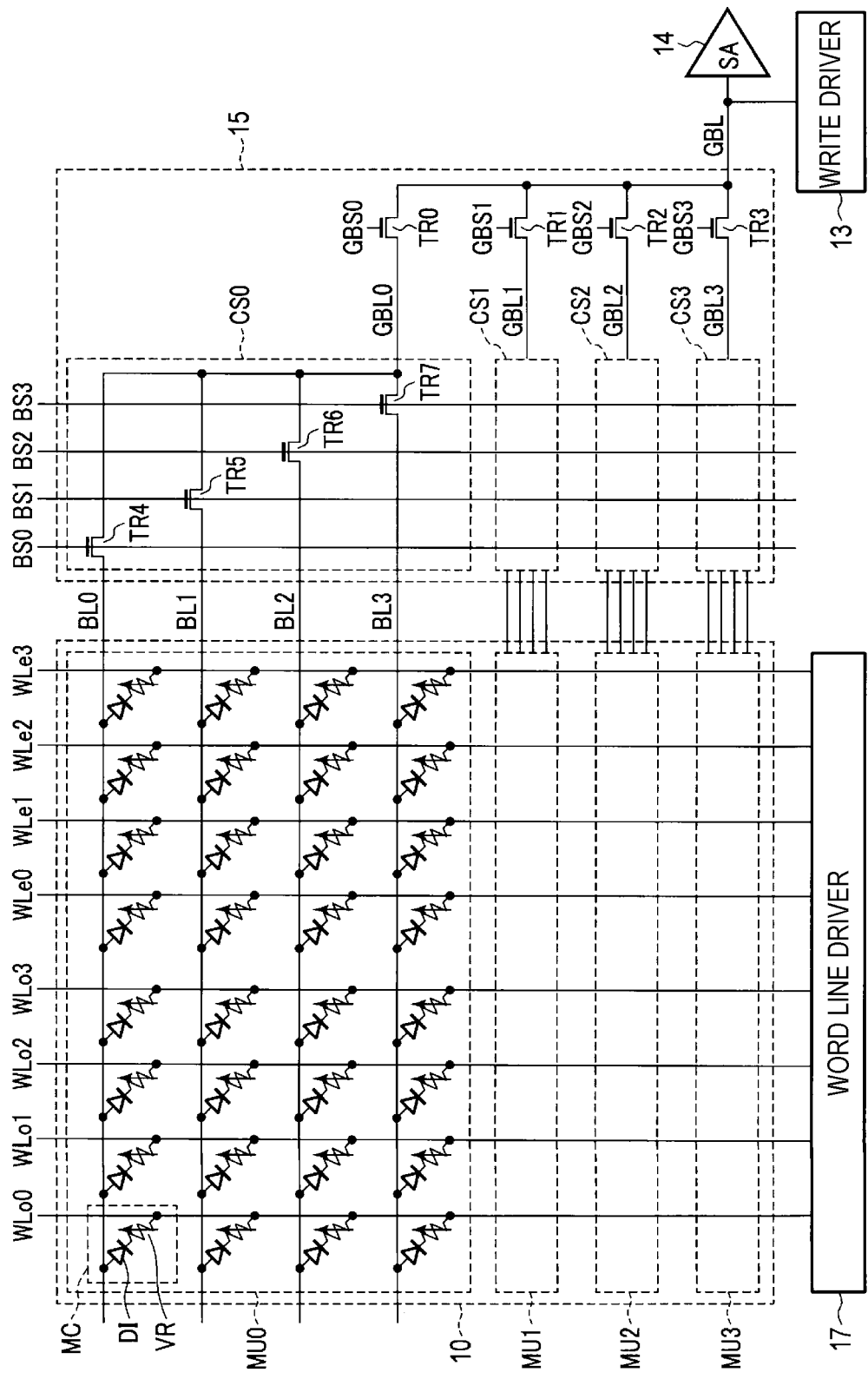
FIG. 2 is a circuit diagram of a memory cell array and a bit line driver provided in the semiconductor memory device according to the first embodiment.

Hereinafter, the circuit configuration of the memory cell array 10 and the bit line driver 15 according to the first embodiment will be described with reference to FIG. 2. FIG. 2 illustrates a detailed circuit configuration of the memory cell array 10 and the bit line driver 15. As illustrated in FIG. 2, the memory cell array 10 includes memory units MU0 to MU3, and the bit line driver 15 includes transistors TR0 to TR3 and column switches CS0 to CS3.

A memory unit MU is a set memory cells MC. Each memory unit MU shares a plurality of word lines WL, and a plurality of bit lines BL are provided for each memory unit MU. Specifically, for example, the memory units MU share word lines WLo0 to WLo3 and word lines WLe0 to WLe3, and (local) bit lines BL0 to BL3 are provided for each memory unit MU. The word lines WLo correspond to the set of odd-numbered word lines WL starting from the lowermost layer and the word lines WLe correspond to a set of even-numbered word lines WL starting from the lowermost layer.

In the memory unit MU0, each memory cell MC is connected between a bit line BL and a word line WL crossing each other. Specifically, the memory cell MC includes, for example, a variable resistance element VR and a diode DI, and one end of the variable resistance element VR is connected to a corresponding word line WL, the other end of the variable resistance element VR is connected to a cathode of the diode DI, and an anode of the diode DI is connected to a corresponding bit line BL. In this manner, the diode DI is connected such that a direction from the corresponding bit line BL to the variable resistance element VR is the forward-biased direction. As the variable resistance element VR, a chalcogenide material containing germanium (Ge), antimony (Sb), and tellurium (Te), a superlattice material obtained by laminating GeTe and SbTe, a binary metal transition oxide, a ternary metal transition oxide, an oxide containing Au, Cu or the like, a chalcogenide material or the like may be used. As the diode DI, a PN junction diode, a Schottky diode, or the like can be used.

In the bit line driver 15, the transistors TR0 to TR3 are connected to a global bit line GBL on one end, and on the other end the transistors TR0 to TR3 are connected to global bit lines GBL0 to GBL3, respectively, so that control signals GBS0 to GBS3 are input to gates of the transistors TR0 to TR3, respectively. The global bit line GBL is connected to the write driver 13 and the sense amplifier 14, and the global bit lines GBL0 to GBL3 are connected to the column switches CS0 to CS3, respectively.

The column switches CS0 to CS3 are provided corresponding to the memory units MU0 to MU3, respectively. Each column switch CS includes transistors TR4 to TR7. In the column switch CS0, the transistors TR4 to TR7 are connected to the global bit line GBL0 on one end, and the other ends of the transistors TR4 to TR7 are connected to the bit lines BL0 to BL3, respectively, corresponding to the memory unit MU0 so that control signals BS0 to BS3 are input to gates of the transistors TR4 to TR7, respectively.

In the circuit configuration of the memory cell array 10 and the bit line driver 15 as described above, circuit configurations of the memory units MU1 to MU3 are similar to the circuit configuration of the memory unit MU0, and circuit configurations of the column switches CS1 to CS3 are similar to the circuit configuration of the column switch CS0, and thus descriptions and illustrations thereof will be omitted.

The control signals GBS0 to GBS3 and the control signals BS0 to BS3 as described above are generated based on, for example, address signals received by the controller 11 from the external memory controller. In various operations, the controller 11 may select one memory unit MU by controlling the control signals GBS0 to GBS3, and may select one bit line BL by controlling the control signals BS0 to BS3.

The number of memory units MU provided in the memory cell array 10 described above and the number of column switches CS provided in the bit line driver 15 described above are not limited thereto. For example, the number of memory units MU may be arbitrarily selected. In this case, the column switches CS are provided corresponding to the number of memory units MU.

The number of bit lines BL and the number of word lines WL wired in each memory unit MU described above are not limited thereto. For example, the number of bit lines BL and the number of word lines WL wired in the memory unit MU may be arbitrarily selected. In this case, transistors TR provided in each column switch CS are provided corresponding to the number of bit lines BL wired in the corresponding memory unit MU.

The arrangement of the variable resistance element VR and the diode DI within each memory cell MC described above is not limited thereto. For example, the variable resistance element VR and the diode DI may be connected in the reverse configuration. Specifically, a cathode of the diode DI may be connected to a corresponding word line WL, an anode of the diode DI may be connected to one end of the variable resistance element VR, and the other end of the variable resistance element VR may be connected to a corresponding bit line BL.

[1-1-3] Structure of Memory Cell Array 10

Hereinafter, the structure of a memory cell array 10 according to the first embodiment will be described.

Figure 3:
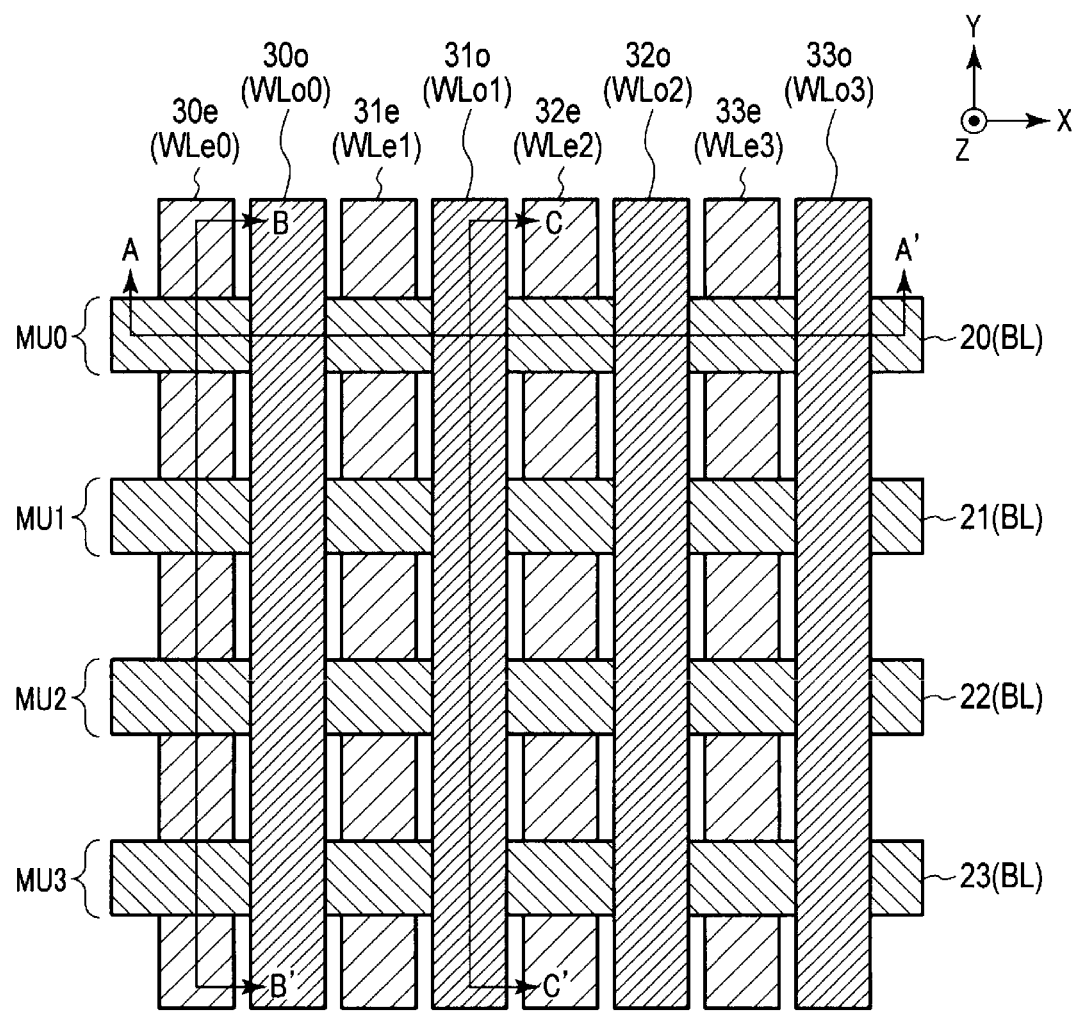
FIG. 3 is a plan view layout diagram of the memory cell array provided in the semiconductor memory device according to the first embodiment.

First, a plan view layout of the memory cell array 10 in the first embodiment will be described with reference to FIG. 3. FIG. 3 illustrates an example of the plan view layout in the memory cell array 10. In the following description, it is assumed that X, Y, and Z axes illustrated in each drawing intersect, and the Z direction corresponds to a vertical direction (a stacking direction) with respect to the surface of a semiconductor substrate. As illustrated in FIG. 3, in the memory cell array 10, conductors 20 to 23 corresponding to bit lines BL, conductors 30e to 33e corresponding to word lines WLe, and conductors 30o to 33o corresponding to word lines WLo are provided.

The conductors 20 to 23 serve as the bit lines BL corresponding to the memory units MU0 to MU3, respectively. The conductors 20 to 23 are provided extending in the X direction, and sequentially arranged along the Y direction. Specifically, the conductors 20 to 23 are spaced from each other along the Y direction in the following order of conductor 23, 22, 21, and 20.

The conductors 30e to 33e serve as the word lines WLe0 to WLe3, respectively. The conductors 30o to 33o serve as the word lines WLo0 to WLo3, respectively. Each conductor corresponding to a word line WLe and each conductor corresponding to a word line WLo are provided extending in the Y direction and are arranged along the X direction in alternating fashion with each other. Specifically, the conductors 30e to 33e and 30o to 33o are arranged along the X direction in the following order of conductor 30e, 30o, 31e, 31o, 32e, 32o, 33e, and 33o along the X direction. That is, in the plan view (overhead) layout of the memory cell array 10 illustrated in FIG. 3, the conductors corresponding to the word lines WLe are shown as between the conductors corresponding to adjacent word lines WLo. Similarly, the conductors corresponding to the word lines WLo are shown as between the conductors corresponding to adjacent word lines WLe.

Figure 4:
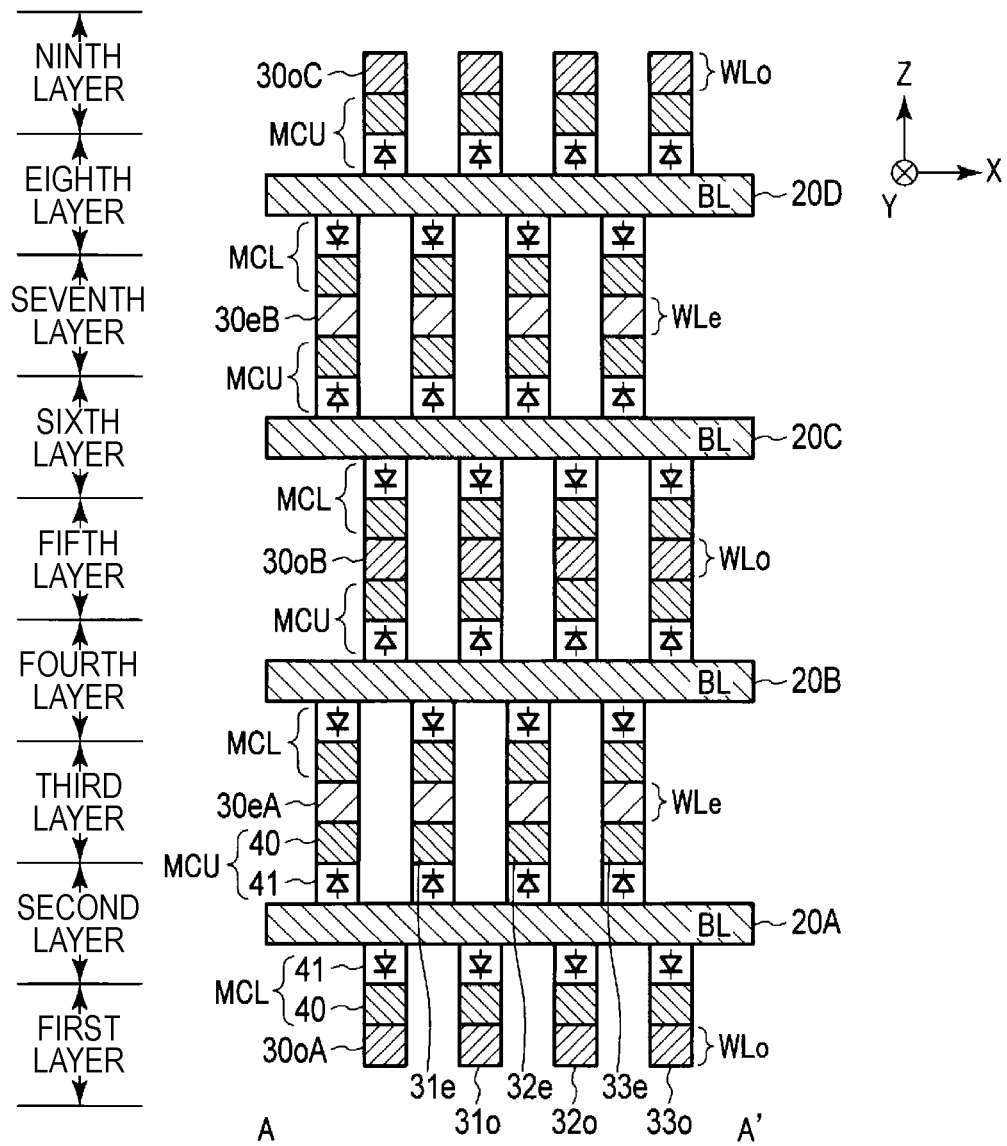
FIG. 4 is a cross-section view of the memory cell array taken along line A-A' in FIG. 3.
Figure 5:
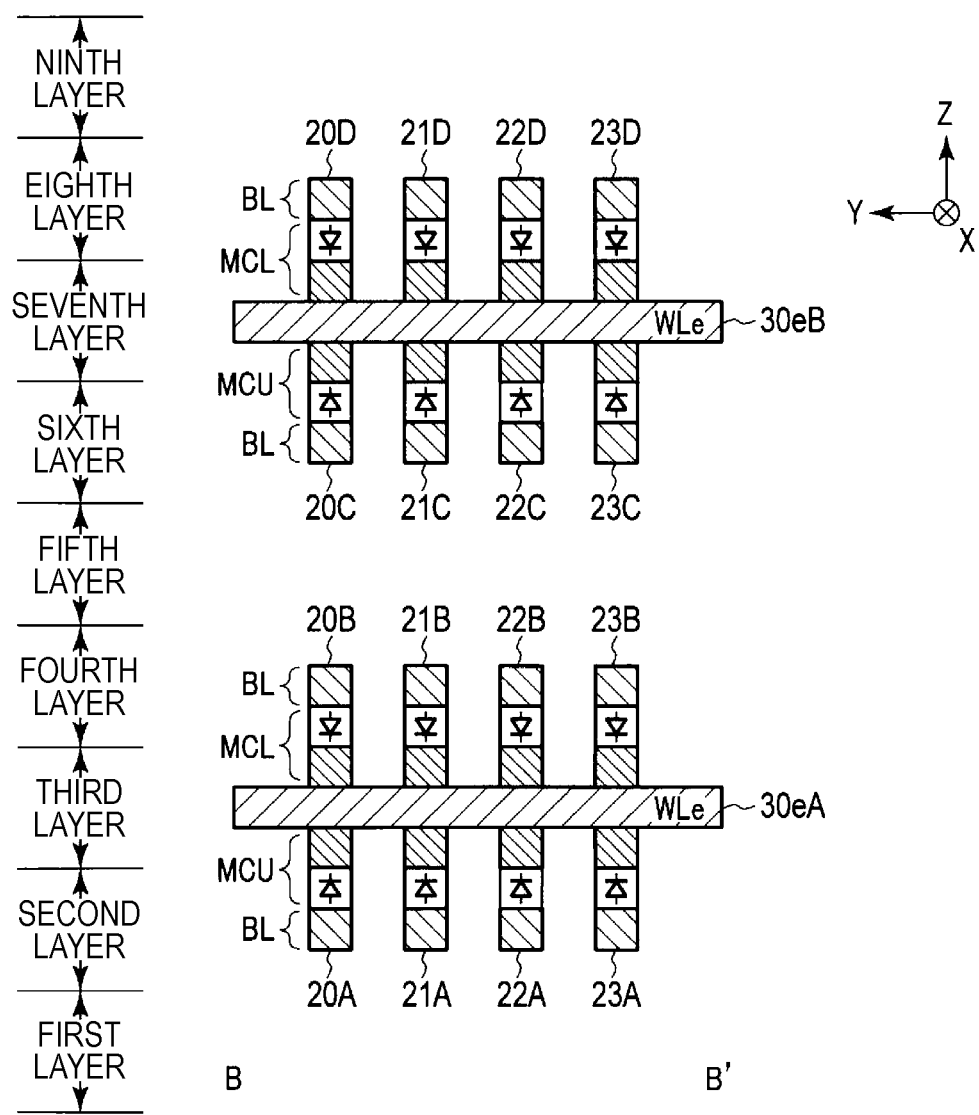
FIG. 5 is a cross-section view of the memory cell array taken along line B-B' in FIG. 3.
Figure 6:
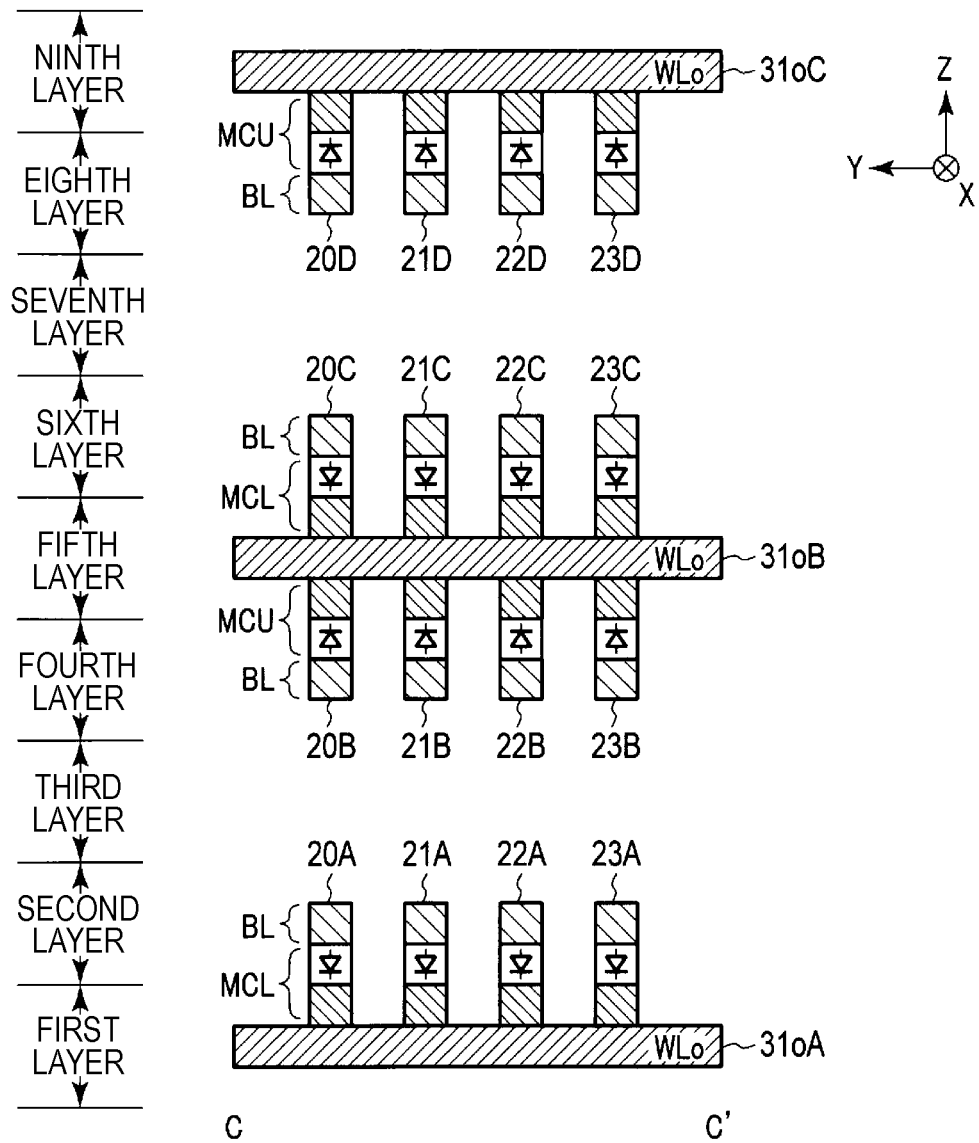
FIG. 6 is a cross-section view of the memory cell array taken along line C-C' in FIG. 3.

Next, a cross-sectional structure of the memory cell array 10 in the first embodiment will be described with reference to FIGS. 4 to 6. FIGS. 4 to 6 are cross-section views of the memory cell array 10 taken along lines A-A', B-B', and C-C' in FIG. 3, respectively. In the cross-section views illustrated below, in order to simplify the depictions, a cross-sectional structure of an interlayer insulating film and a diode DI is omitted. As such, in a region corresponding to the diode DI, so as to depict and explain a forward direction of the diode, circuit symbols for diodes (with an anode side and a cathode side) are schematically illustrated. In the cross-section views discussed below, the wiring layers (device layers) in which word lines WL and bit lines BL are provided are enumerated as the first to ninth layers in a sequence from the lowermost layer nearest the substrate and then upwards proceeding in the stacking direction. Specifically, the first layer, the fifth layer and the ninth layer correspond to wiring layers in which the conductors corresponding to word lines WLo are provided. The third layer and the seventh layer correspond to wiring layers in which the conductors corresponding to word lines WLe are provided. The second layer, the fourth layer, the sixth layer and the eighth layer correspond to wiring layers in which the conductors corresponding to bit lines BL are provided.

As illustrated in FIG. 4, in the cross-section along the extension direction of the bit line BL corresponding to the memory unit MU0, a conductor 20A corresponding to the bit line BL0 is provided in the second layer, a conductor 20B (corresponding to the bit line BL1) is provided in the fourth layer, a conductor 20C (corresponding to the bit line BL2) is provided in the sixth layer, and a conductor 20D (corresponding to the bit line BL3) is provided in the eighth layer. In this manner, the bit lines BL0 to BL3 for the memory unit MU0 are arranged along the Z direction. That is, the bit lines BL0 to BL3 for the memory unit MU0 overlap one another when viewed from the Z direction. The configuration of the bit lines BL of each of the memory units MU1 to MU3 is similar to the memory unit MU0, and thus descriptions thereof will be omitted.

As illustrated in FIGS. 4 and 5, in the cross-section along the extension direction of the word line WLe0, conductors 30eA and 30eB (corresponding to the word line WLe0) are provided in the third layer and the seventh layer, respectively. In this manner, the conductors 30e corresponding to the word line WLe are arranged along the Z direction. That is, the conductors 30eA and 30eB corresponding to the word line WLe overlap each other when viewed from the Z direction. No conductor 30o is provided between the adjacent conductors 30e. More specifically, no conductor serving as a word line WL is provided on any line in the X direction connecting the centers of the adjacent conductors 30e. The conductors 30e corresponding to the word lines WLe are electrically connected to each other in another region of the device not particularly illustrated. The configuration of conductors corresponding to the word lines WLe1 to WLe3 is similar to the configuration of the word line WLe0, and thus descriptions thereof will be omitted.

As illustrated in FIGS. 4 and 6, conductors 31oA, 31oB, and 31oC (corresponding to the word line WLo1) are provided in the first layer, the fifth layer and the ninth layer, respectively. In this manner, the conductors 31o corresponding to word lines WLo are arranged along the Z direction. That is, the conductors 31oA, 31oB, and 31oC corresponding to the word lines WLo are provided so as to overlap when viewed from the Z direction. There is no conductor 31e provided between the adjacent conductors 31o. More specifically, no conductor serving as a word line WL is provided on any line connecting centers of the adjacent conductors 310 along the X direction. The conductors 31oA, 31oB, and 31oC corresponding to the word lines WLo are electrically connected to each other in a region (not illustrated). The configuration of each of conductors corresponding to the word lines WLo0, WLo2, and WLo3 is similar to the configuration of each conductor corresponding to the word line WLo1, and thus descriptions thereof will be omitted.

Between a conductor 30oA corresponding to the word line WLo0 in the first layer and a conductor 20A corresponding to the bit line BL0 in the second layer, a memory cell MCL is provided. Specifically, on the conductor 30oA in a region between the conductor 30oA and the conductor 20A, a variable resistance unit 40 corresponding to the variable resistance element VR and a diode unit 41 corresponding to the diode DI are sequentially provided, and the conductor 20A is provided on the diode unit 41. That is, one end of the memory cell MCL in the Z direction is in contact with the conductor 30oA, and the other end is in contact with the conductor 20A. In the region, the diode unit 41 has a structure in which an anode of the diode DI is formed in the upper layer, and a cathode is formed in the lower layer. In this manner, the memory cell MCL corresponds to a memory cell MC capable of allowing a current to flow from the upper-layer bit line BL to the lower-layer word line WL during various operations. Similarly, memory cells MCL are provided between each word line WL provided in the first layer and each bit line BL provided in the second layer, between each word line WL provided in the third layer and each bit line BL provided in the fourth layer, between each word line WL provided in the fifth layer and each bit line BL provided in the sixth layer, and between each word line WL provided in the seventh layer and each bit line BL provided in the eighth layer, respectively.

Between the conductor 30eA corresponding to the word line WLe0 in the third layer and the conductor 20A corresponding to the bit line BL0 in the second layer, a memory cell MCU is provided. Specifically, on the conductor 20A in a region between the conductor 30eA and the conductor 20A, a diode unit 41 and a variable resistance unit 40 are sequentially provided, and the conductor 30eA is provided on the variable resistance unit 40. That is, one end of the memory cell MCU in the Z direction is in contact with the conductor 30eA, and the other end is in contact with the conductor 20A. In the region, the diode unit 41 has a structure in which an anode of the diode DI is formed in the lower layer, and a cathode is formed in the upper layer. In this manner, the memory cell MCU corresponds to a memory cell MC capable of allowing a current to flow from the lower-layer bit line BL to the upper-layer word line WL during various operations. Similarly, memory cells MCU are provided between each word line WL provided in the third layer and each bit line BL provided in the second layer, between each word line WL provided in the fifth layer and each bit line BL provided in the fourth layer, between each word line WL provided in the seventh layer and each bit line BL provided in the sixth layer, and between each word line WL provided in the ninth layer and each bit line BL provided in the eighth layer, respectively.

In the above described memory cell array 10 in the first embodiment, respective word lines WLo provided in the first layer, the fifth layer, and the ninth layer are arranged to overlap in the plane extending in the X direction and the Y direction, and respective word lines WLe provided in the third layer and the seventh layer are arranged to overlap. In the section of the memory cell array 10, for example, word lines WLo0 provided in the first layer, the fifth layer, and the ninth layer, and word lines WLe0 provided in the third layer and the seventh layer are arranged to be alternately shifted from adjacent word lines WL. That is, in the plane extending in the X direction and the Y direction and passes through the X-direction center of a conductor corresponding to a word line WLo provided at an odd-numbered position when viewed from the lowermost layer and extends along the stacking direction, no conductor corresponding to an even numbered word line WLe when viewed from the lowermost layer is provided.

That is, in the plane formed by the X and Y directions, for example, the X-direction center of the conductor corresponding to the word line WLo is located between two adjacent conductors corresponding to the word lines WLe. Similarly, in the plane formed by the X and Y directions, for example, the X-direction center of the conductor corresponding to the word line WLe is located between two adjacent conductors corresponding to the word lines WLo. That is, in the plane formed by the X and Y directions, the X-direction center of the conductor constituting the memory cell MCL is located between two conductors constituting the memory cells MCU sharing the bit line with the memory cell MCL and adjacent to the memory cell MCL. Similarly, the X-direction center of the conductor constituting the memory cell MCU is located between two conductors constituting the memory cells MCL sharing the bit line with the memory cell MCU and adjacent to the memory cell MCU.

In the above described structure of the memory cell array 10, the wiring width of each bit line BL and an interval between adjacent bit lines BL are designed to be, for example, substantially the same. In the following description, it is assumed that the wiring width of various wires refers to a dimension of a conductor corresponding to a wire in a direction perpendicular to the extension direction of the conductor in the XY plane. For example, the wiring width of the bit line BL corresponds to a dimension of the conductor 20 in the Y direction.

The wiring width of the word lines WLo and the wiring width of the word lines WLe are designed to be, for example, substantially the same as each other. The wiring width of each word line WLo and an interval between adjacent word lines WLo are designed to be, for example, substantially the same as each other, and the wiring width of each word line WLe and an interval between adjacent word lines WLe are designed to be, for example, substantially the same. In such a case, the respective word lines WL provided in odd-numbered wiring layers are in a relationship of being shifted in parallel by the wiring width of the word lines WL in each wiring layer.

Figure 7:
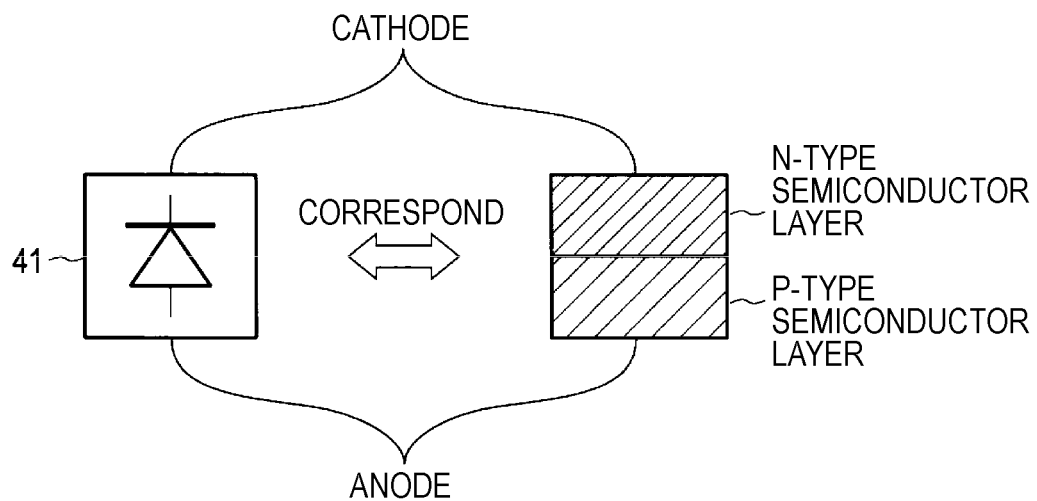
FIG. 7 is a cross-section view of a diode disposed in a memory cell provided in the semiconductor memory device according to the first embodiment.
Figure 8:
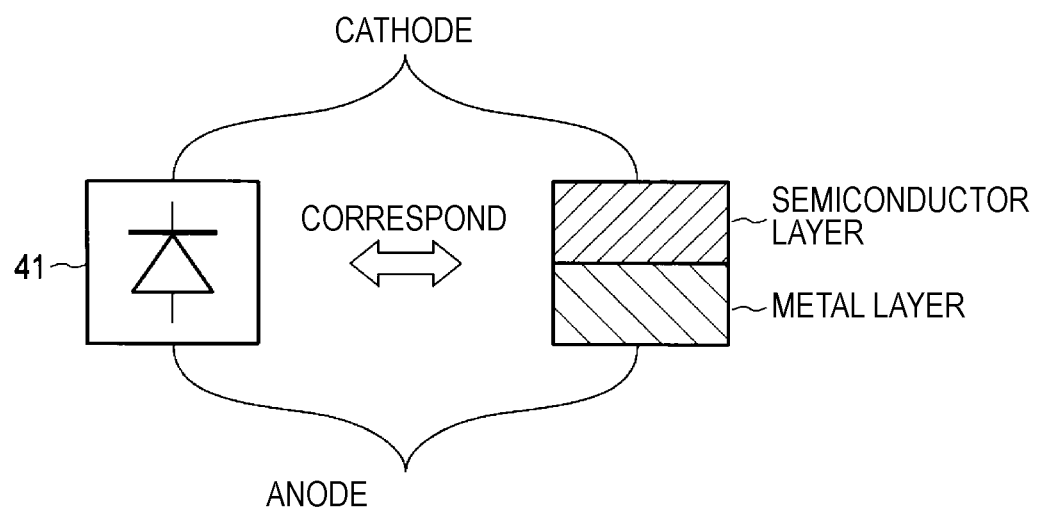
FIG. 8 is a cross-section view of a diode disposed in a memory cell provided in the semiconductor memory device according to a modification of the first embodiment.

The particular cross-sectional structure of the diodes DI was omitted in FIGS. 4 to 6. However, examples of these structures are illustrated in FIGS. 7 and 8. FIG. 7 illustrates a cross-section view of the diode unit 41 when the diode DI is a PN junction diode, and FIG. 8 illustrates a cross-section view of the diode unit 41 when the diode DI is a Schottky diode.

As illustrated in FIG. 7, when the diode DI is a PN junction diode, the diode unit 41 has a structure in which a P-type semiconductor layer and an N-type semiconductor layer are stacked. In such a structure, the P-type semiconductor layer corresponds to an anode of the diode unit 41, and the N-type semiconductor layer corresponds to a cathode of the diode unit 41.

As illustrated in FIG. 8, when the diode DI is a Schottky diode, the diode unit 41 has a structure in which a metal layer and a semiconductor layer are stacked. In such a structure, the metal layer corresponds to an anode of the diode unit 41, and the semiconductor layer corresponds to a cathode of the diode unit 41.

[1-2] Operation

[1-2-1] Read Operation

Figure 9:
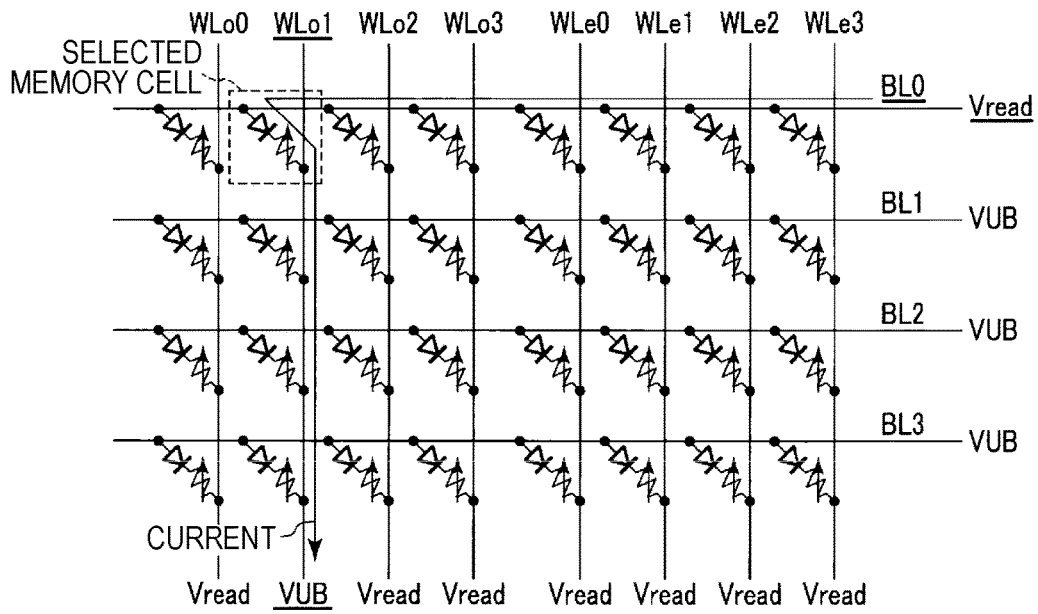
FIG. 9 is a circuit diagram of a memory cell array, which illustrates a read operation of the semiconductor memory device according to the first embodiment.

Hereinafter, a read operation of the semiconductor memory device 1 according to the first embodiment will be described with reference to FIG. 9. FIG. 9 is a circuit diagram in which one memory unit MU is extracted from the circuit diagram of the memory cell array 10 illustrated in FIG. 2. FIG. 9 illustrates the voltage applied to each bit line BL and word line WL when data stored in a memory cell MC connected to a bit line BL0 and a word line WLo1 is read in an example of a read operation.

In the following description, a memory cell MC to be read is referred to as a selected memory cell, and a bit line and a word line corresponding to the selected memory cell are referred to as a selected bit line and a selected word line, respectively, and other bit lines and word lines are referred to as unselected bit lines and unselected word lines. In various operations to be described below, among the transistors TR0 to TR3 within the bit line driver 15, a transistor TR corresponding to the selected memory unit MU is controlled to be placed in the ON state, and among the transistors TR4 to TR7 within the column switch CS, a transistor TR corresponding to the selected bit line BL is controlled to be placed in the ON state. Meanwhile, in the bit line driver 15, transistors TR corresponding to unselected memory units MU and unselected bit lines BL are controlled to be placed in the OFF state.

As illustrated in FIG. 9, when data of the memory cell MC connected to the bit line BL0 and the word line WLo1 is read, the sense amplifier 14 applies a voltage Vread to the selected bit line BL0, and the word line driver 17 applies a voltage VUB to the selected word line WLo1. The voltage Vread is a read voltage used in the read operation. The voltage VUB is, for example, a ground voltage of the semiconductor memory device 1, and is lower than the voltage Vread. Meanwhile, the voltage of the unselected bit line BL is set to VUB, and the voltage of the unselected word line WL is set to Vread. Hereinafter, descriptions will be made on the operation of each of combinations of selected and unselected bit lines BL with selected and unselected word lines WL.

In a combination of the selected bit line BL0 and the selected word line WLo1, a voltage applied to the selected bit line BL0 is higher than a voltage applied to the selected word line WLo1. That is, since a forward bias is applied to the diode DI within the selected memory cell MC, a read current flows from the selected bit line BL0 toward the selected word line WLo1 through the selected memory cell MC.

For a combination of the selected bit line BL0 and the unselected word line WL, the voltage (Vread) applied to the selected bit line BL0 is substantially the same as the voltage applied to the unselected word line WL. Almost no current flows in through corresponding memory cells MC with this combination since no potential difference occurs between an anode and a cathode of the diode DI within such memory cells MC.

In a combination of an unselected bit line BL and a selected word line WLo1, a voltage (VUB) applied to the unselected bit line BL is substantially the same as a voltage applied to the selected word line WLo1. That is, since no potential difference occurs between an anode and a cathode of the diode DI within the memory cell MC connected to the unselected bit line BL and the selected word line WLo1, almost no current flows in the corresponding memory cell MC.

In a combination of an unselected bit line BL and an unselected word line WL, a voltage (VUB) applied to the unselected bit line BL is lower than a voltage (Vread) applied to the unselected word line WL. That is, almost no current flows in the corresponding memory cells MC since a reverse bias is applied to the diode DI within these memory cells MC connected to the unselected bit line BL and the unselected word line WL.

As described above, a read current flows through the selected memory cell MC based on the voltage applied by the sense amplifier 14. Here, since the amount of the current flowing through the selected memory cell MC changes according to the data held by the selected memory cell MC, the sense amplifier 14 can determine the data stored in the selected memory cell MC by comparing the read current with a reference current.

Specifically, for example, during the read operation, when the current flowing through the selected memory cell MC is smaller than the reference current, the sense amplifier 14 determines that the variable resistance element VR within the selected memory cell MC is in the high resistance state, and the selected memory cell MC is storing data of "1." If the current flowing through the selected memory cell MC is larger than the reference current, the sense amplifier 14 determines that the variable resistance element VR within the selected memory cell MC is in the low resistance state, and the selected memory cell MC is storing data of "0."

[1-2-2] Write Operation

Figure 10:
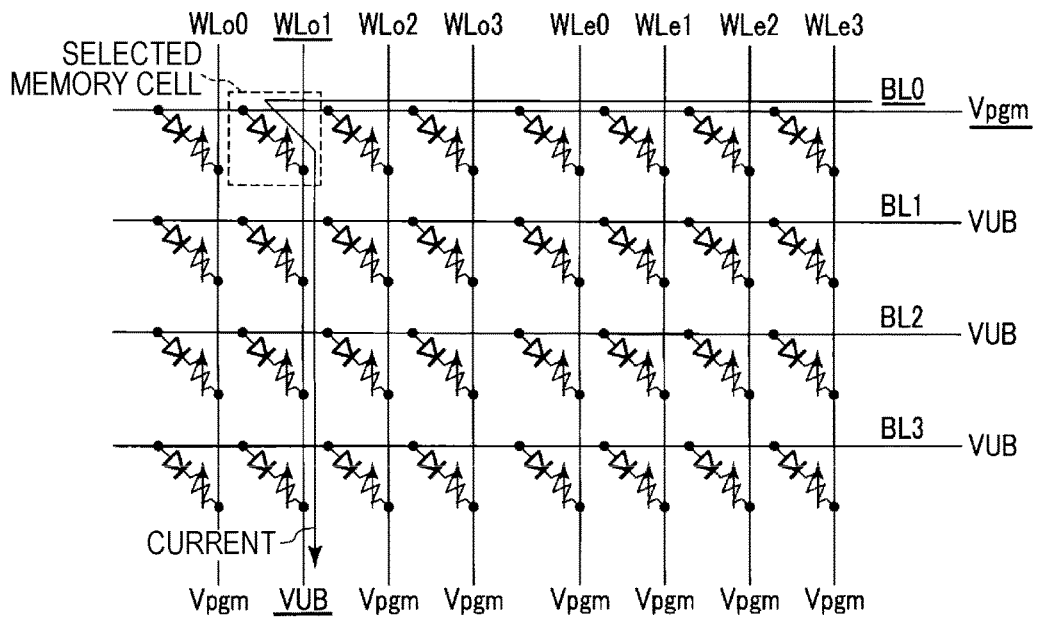
FIG. 10 is a circuit diagram of a memory cell array, which illustrates a write operation of the semiconductor memory device according to the first embodiment.

Hereinafter, a write operation of the semiconductor memory device 1 according to the first embodiment will be described with reference to FIG. 10. FIG. 10 is a circuit diagram in which one memory unit MU has been extracted from the circuit diagram of the memory cell array 10 illustrated in FIG. 2. FIG. 10 illustrates a voltage applied to each bit line BL and word line WL when data is written to a memory cell MC connected to a bit line BL0 and a word line WLo1 in an example write operation.

As illustrated in FIG. 10, when data is written in the memory cell MC connected to the bit line BL0 and the word line WLo1, the write driver 13 applies a voltage Vpgm to the selected bit line BL0, and the word line driver 17 applies a voltage VUB to the selected word line WLo1. The voltage Vpgm is a program voltage used in the write operation, and is higher than the voltage VUB. The voltage of the unselected bit line BL becomes VUB, and the voltage of the unselected word line WL becomes Vpgm.

In a combination of the selected bit line BL0 and the selected word line WLo1, a voltage applied to the selected bit line BL0 is higher than a voltage applied to the selected word line WLo1. That is, since a forward bias is applied to the diode DI within the selected memory cell MC, a write current flows from the selected bit line BL0 toward the selected word line WLo1 through the selected memory cell MC. Operations corresponding to other bit lines BL and other word lines WL are similar to read operations described with reference to FIG. 9. Since no potential difference occurs between an anode and a cathode of the diode DI within the corresponding memory cell MC, or a reverse bias is applied, almost no current flows in the memory cell MC.

As described above, based on the voltage applied by the write driver 13, a write current flows through the selected memory cell MC. Then, the write driver 13 writes, for example, data of "1" and data of "0" in the selected memory cell MC by adjusting a voltage value, a pulse width, a rise time, a fall time, and the like of the voltage Vpgm applied to the selected bit line BL.

Specifically, in a phase change memory, by using the heat generated when a current flows through the selected memory cell MC, the variable resistance element VR provided in the selected memory cell MC is subjected to a phase change between an amorphous state (a high resistance state) and a crystalline state (a low resistance state).

For example, in the write operation, when the variable resistance element VR is subjected to a phase change from an amorphous state to a crystalline state, the variable resistance element VR is heated to about 180° C. (a crystallization temperature), for example, and is then gradually cooled (a set operation). In the write operation, when the variable resistance element VR is subjected to a phase change from a crystalline state to an amorphous state, the variable resistance element VR is heated to a high temperature exceeding 630° C. (a melting point), for example, and is then rapidly cooled (a reset operation).

[1-3] Effect of First Embodiment

In the above described semiconductor memory device 1 according to the first embodiment, the reliability of data stored in the memory cell may be improved. Hereinafter, details of the effect will be described.

A phase change memory (e.g., PRAM) is known as a resistance change type semiconductor memory device that stores data in a non-volatile state using a variable resistance element. As a structure of the resistance change type semiconductor memory device, a cross point type structure in which memory cells are three-dimensionally stacked is known. In the cross point type structure, bit lines and word lines are alternately stacked, and memory cells are arranged in regions in which the bit lines and the word lines intersect. Such a cross point type structure is suitable for increasing the capacity of a semiconductor memory device due to a small area of a memory cell, and is considered to be applicable to, for example, a phase change memory.

In a write operation of the phase change memory, desired data is written by heating a memory cell as a writing target. Then, the heat generated from the selected memory cell by the write operation does not remain in the selected memory cell, but increases the temperature around the selected memory cell. Here, as the temperatures of unselected memory cells located in the vicinity of the selected memory cell increase, the states of these unselected memory cells may be changed. The influence of such a program disturbance caused by the heat is increased at a position closer to the selected memory cell. That is, in the case of a phase change memory with a cross point type structure, the influence of the program disturbance increases particularly in memory cells adjacent to the selected memory cell in the stacking direction through word lines or bit lines.

Figure 11A:
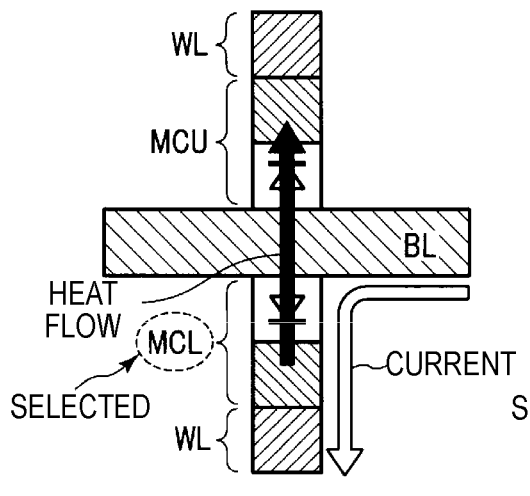
FIGS. 11A and 11B are cross-section views of a memory cell array, which illustrates an operation in the semiconductor memory device according to the first embodiment and a comparative example of the first embodiment, respectively.
Figure 11B:
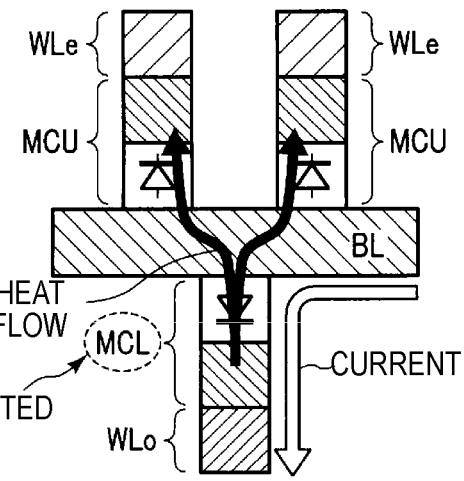

Therefore, in the semiconductor memory device 1 according to the first embodiment, memory cells are shifted in the in-plane direction in each adjacent wiring layer. Specifically, word lines WL, which are respectively provided in wiring layers adjacent to the upper layer side and the lower layer side of a wiring layer in which bit lines BL are provided, are shifted in the in-plane direction. Here, details of the effect of the first embodiment will be described with reference to a comparative example illustrated in FIGS. 11A and 11B. FIG. 11A illustrates an arrangement of memory cells MC in the comparative example of the first embodiment, and FIG. 11B illustrates an arrangement of memory cells MC in the first embodiment. FIGS. 11A and 11B schematically illustrate a heat flow of the heat generated when the illustrated memory cell MCL is selected and a current flows through the memory cell MCL. As illustrate in FIGS. 11A and 11B, memory cells MCL and MCU are provided between a lower layer word line WL and an upper layer word line WL sharing a bit line BL, respectively.

In the comparative example, when the memory cell MCL is selected, the heat flow generated in the memory cell MCL concentratedly flows into the memory cell MCU immediately above the memory cell MCL via the shared bit line BL. In the first embodiment, when the memory cell MCL is selected, the heat flow generated in the memory cell MCL flows into the two memory cells MCU around the memory cell MCL via the shared bit line BL in a dispersed manner. The interval between a selected memory cell MCL and an unselected memory cells MCU In the first embodiment is wider than the interval between a selected memory cell MCL and an unselected memory cell MCU in the comparative example. Thus, the heat generated in the selected memory cell MCL is further diffused until reaching the unselected memory cell MCU.

Figure 12:
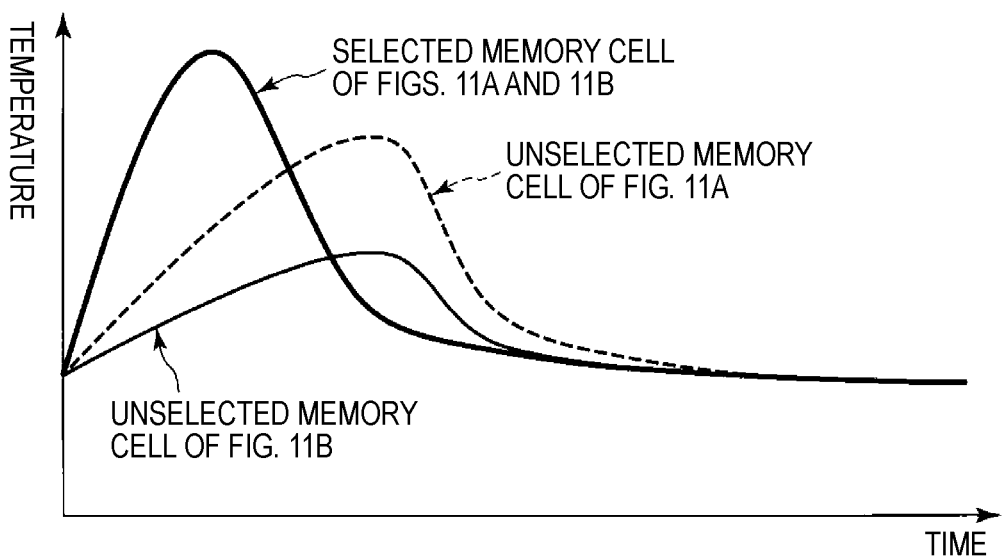
FIG. 12 is a waveform diagram illustrating temperature changes of memory cells in the first embodiment and a comparative example of the first embodiment.

An example of a temperature change of the selected and unselected memory cells MC as described above is illustrated in FIG. 12. FIG. 12 is a schematic view illustrating temperature changes of selected and unselected memory cells MC of FIGS. 11A and 11B, in which the vertical axis and the horizontal axis correspond to a temperature and a time, respectively. FIG. 12 illustrates an example of a process in which a current flows through a selected memory cell MCL, and a temperature of the memory cell rises and then is cooled.

As illustrated in FIG. 12, first, the temperature of each of the selected memory cells MCL illustrated in FIGS. 11A and 11B rises. Accordingly, the temperature of the selected memory cell MC propagates to the adjacent memory cell MC, and the temperature of the unselected memory cell MCU rises later than the selected memory cell MCL. Then, assuming that the same amount of heat is generated in the selected memory cell MCLs in the comparative example and the first embodiment, the amount of heat received by the respective memory cells MC illustrated in FIGS. 11A and 11B becomes smaller in the order of the selected memory cells MCL, the unselected memory cell MCU in the comparative example, and the unselected memory cell MCU in the first embodiment.

As described above, in the semiconductor memory device 1 according to the first embodiment, it is possible to suppress the amount of heat propagating to unselected memory cells in vicinity of a selected memory cell by arranging stacked word lines WL such that the positions of the word lines WL are shifted in the in-plane direction in each wiring layer. Accordingly, the semiconductor memory device 1 according to the first embodiment may suppress the influence of disturbance caused by the heat generated in the selected memory cell, thereby improving the reliability of data stored in the memory cell MC.

In the above description, the effect of the first embodiment is described by taking a write operation as an example, but the present disclosure is not limited thereto. For example, in a read operation as well, it is possible to suppress the influence of the heat generated when a read current flows through a selected memory cell MC, on unselected memory cells in the vicinity of the selected memory cell.

In the structure of the memory cell array 10 as described above, the case where the number of wiring layers in which word lines WL are provided is five, and the number of wiring layers in which bit lines BL are provided is four is described as an example, but the present disclosure is not limited thereto. For example, six or more wiring layers in which word lines WL are provided may be provided in the memory cell array 10, and five or more wiring layers in which bit lines BL are provided may be provided. Even in such a case, the same effect as that described above may be achieved by arranging word lines WLo and WLe, and bit lines BL in the same manner as in FIGS. 3 to 6.

In the structure of the memory cell array 10 as described above, the case where conductors corresponding to the same word lines WLe and WLo are arranged in the stacking direction is described as an example, but the present disclosure is not limited thereto. For example, the conductors corresponding to the same word lines WLe and WLo may be shifted in the in-plane direction. That is, in the semiconductor memory device 1, the above-described effect may be achieved regardless of the type of the corresponding word lines WL when the positions of stacked word lines WL are shifted in the in-plane direction in each wiring layer, so that the memory cells sharing a bit line BL are not arranged on a straight line along the stacking direction.

[2] Second Embodiment

Hereinafter, a semiconductor memory device 1 according to a second embodiment will be described. In the semiconductor memory device 1 according to the second embodiment, a conductor corresponding to an odd-numbered bit line BL from the lowermost layer and a conductor corresponding to an even-numbered bit line BL from the lowermost layer are shifted in the in-plane direction.

[2-1] Configuration

Hereinafter, the structure of the memory cell array 10 in the second embodiment will be described.

Figure 13:
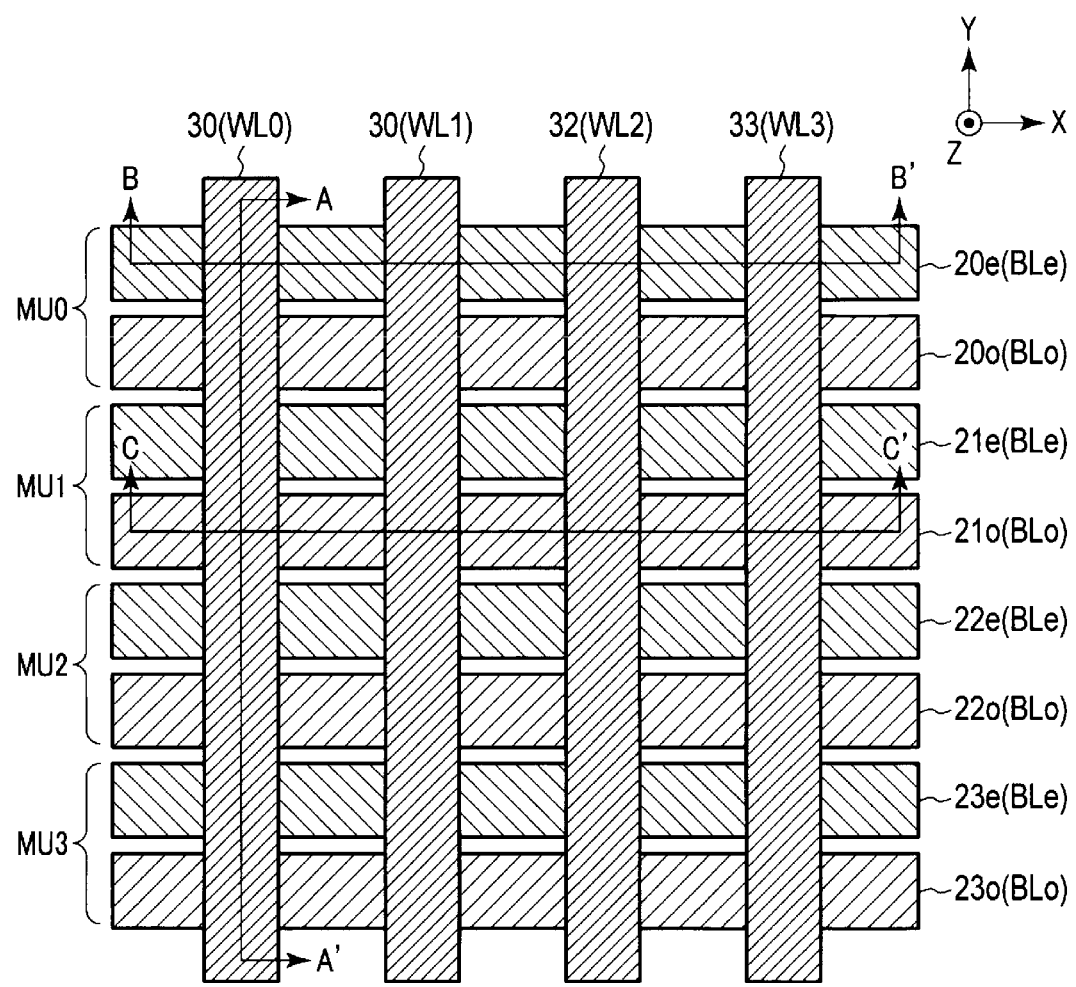
FIG. 13 is a plan view layout diagram of a memory cell array provided in a semiconductor memory device according to a second embodiment.

First, a plan view layout of the memory cell array 10 in the second embodiment will be described with reference to FIG. 13. FIG. 13 illustrates an example of the plan view layout in the memory cell array 10. As illustrated in FIG. 13, in the memory cell array 10, conductors 20e to 23e corresponding to bit lines BLe, conductors 20o to 23o corresponding to bit lines BLo, and conductors 30 to 33 corresponding to word lines WL are provided. Here, the bit lines BLo corresponds to a set of odd-numbered bit lines BL from the lowermost layer and the bit lines BLe correspond to a set of even-numbered bit lines BL from the lowermost layer.

The conductors 20e and 20o serve as the bit lines BL corresponding to the memory unit MU0, the conductors 21e and 21o serve as the bit lines BL corresponding to the memory unit MU1, the conductors 22e and 22o serve as the bit lines BL corresponding to the memory unit MU2, and the conductors 23e and 23o serve as the bit lines BL corresponding to the memory unit MU3. The conductors corresponding to the bit lines BLe and the conductors corresponding to the bit line BLo are each provided to extend in the X direction, and alternately arranged along the Y direction. Specifically, the conductors 20e to 23e and 20o to 23o are arranged in the order of conductors 23o, 23e, 22o, 22e, 21o, 21e, 20o and 20e in the Y direction. That is, in the plan view layout of the memory cell array 10 as illustrated in FIG. 13, each of the conductors corresponding to the bit lines BLe is disposed between conductors corresponding to adjacent bit lines BLo, and each of the conductors corresponding to the bit lines BLo is disposed between conductors corresponding to adjacent bit lines BLe.

The conductors 30 to 33 serve as word lines WL0 to WL3, respectively. The conductors 30 to 33 are provided extending in the Y direction, and sequentially arranged along the X direction. Specifically, the conductors 30 to 33 are arranged in the order of the conductors 30, 31, 32, and 33 along the X direction.

Figure 14:
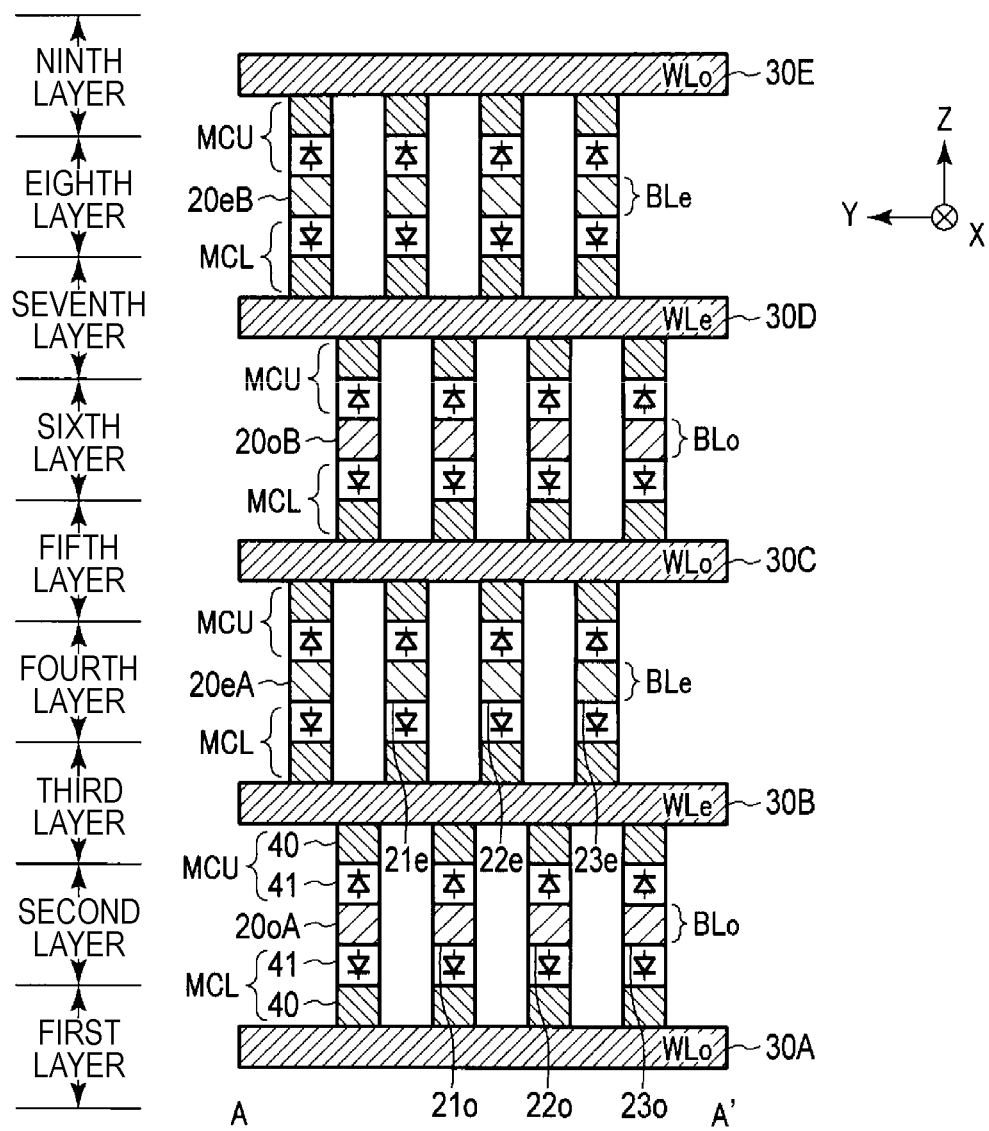
FIG. 14 is a cross-section view of the memory cell array taken along line A-A' in FIG. 13.
Figure 15:
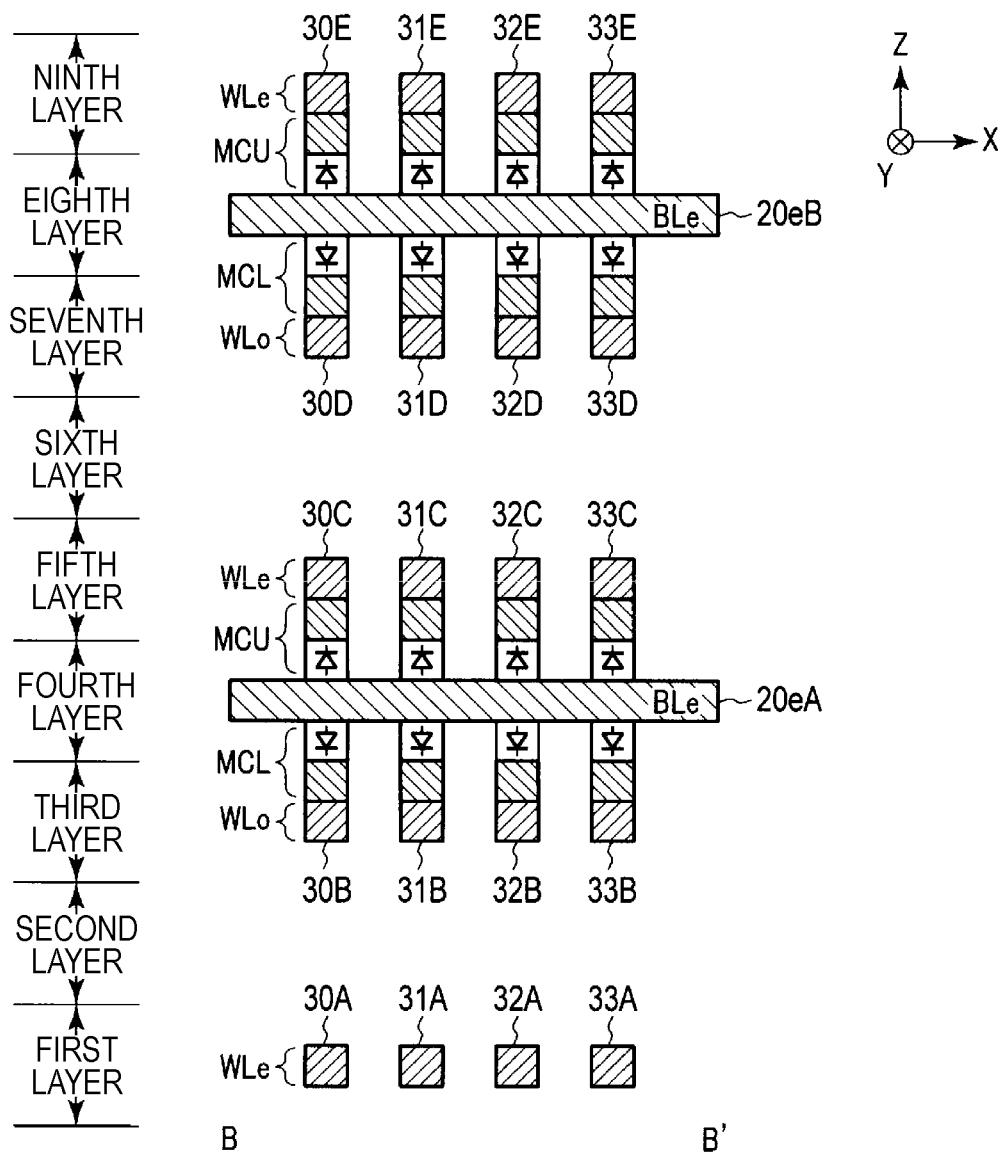
FIG. 15 is a cross-section view of the memory cell array taken along line B-B' in FIG. 13.
Figure 16:
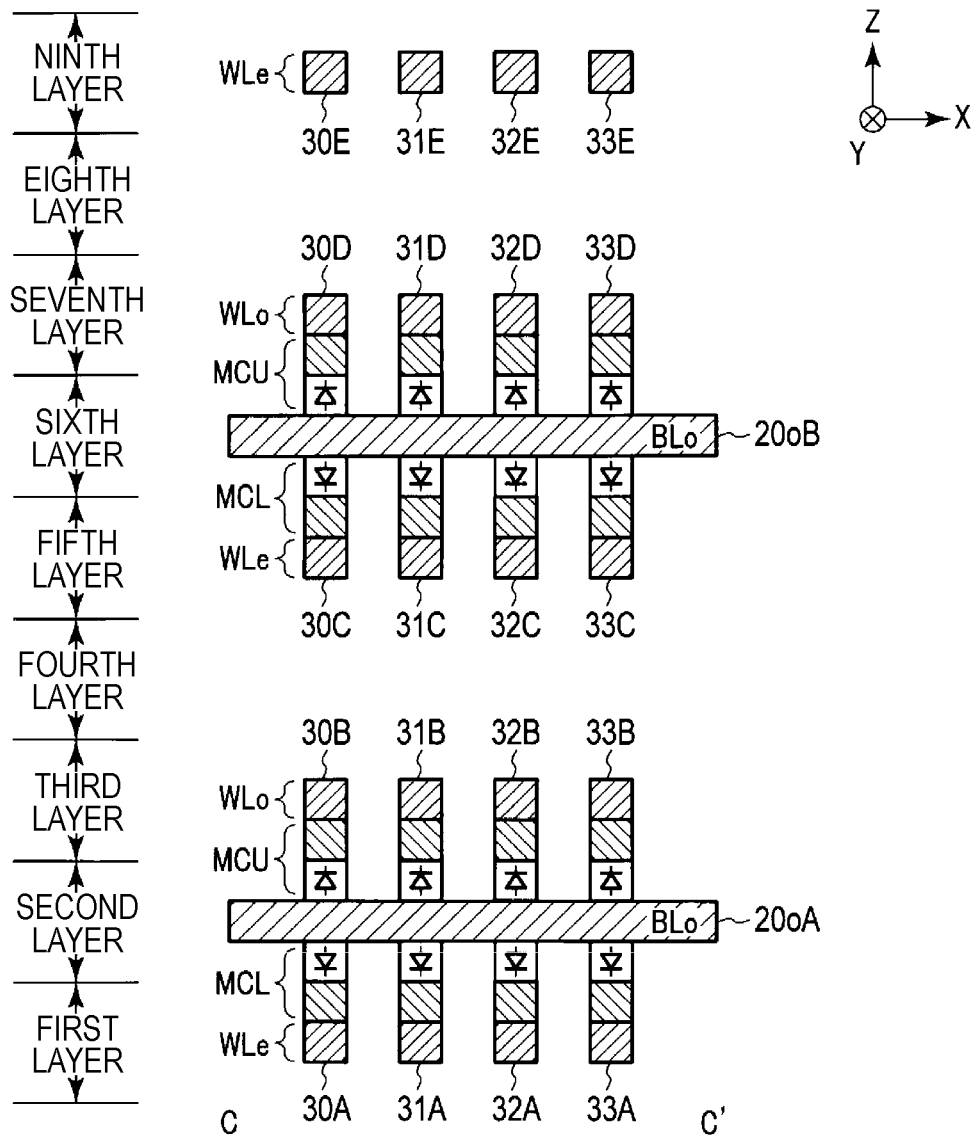
FIG. 16 is a cross-section view of the memory cell array taken along line C-C' in FIG. 13.

Subsequently, a sectional structure of the memory cell array 10 in the second embodiment will be described with reference to FIGS. 14 to 16. FIGS. 14 to 16 are cross-section views of the memory cell array 10 taken along lines A-A', B-B', and C-C' in FIG. 13, respectively.

As illustrated in FIGS. 14 and 15, a conductor 20eA corresponding to a bit line BLe (BL1) is provided in the fourth layer, and a conductor 20eB corresponding to a bit line BLe (BL3) is provided in the eighth layer. In this manner, the conductors 20e corresponding to the bit lines BLe of the memory unit MU0 are arranged in the Z direction. That is, the conductors 20eA and 20eB corresponding to the bit line BLe are arranged to overlap in the Z direction. No conductor 20o is provided between adjacent conductors 20e. More specifically, no conductor serving as a bit line BL is provided on a line connecting centers of the adjacent conductors 20e in the Y direction. The configuration of each of the conductors corresponding to the bit lines BLe of the memory units MU1 to MU3 is similar to the configuration of each of the conductor corresponding to the bit lines BLe of the memory unit MU0, and thus descriptions thereof will be omitted.

As illustrated in FIGS. 14 and 16, a conductor 21oA corresponding to a bit line BLo (BL0) is provided in the second layer, and a conductor 21oB corresponding to a bit line BLo (BL2) is provided in the sixth layer. In this manner, the conductors 21o corresponding to the bit lines BLo of the memory unit MU1 are arranged along the Z direction. That is, the conductors 21oA and 21oB corresponding to the bit lines BLo are provided to overlap in the Z direction. No conductor 21e is provided between adjacent conductors 21o. More specifically, no conductor serving as a bit line BL is provided on the line connecting centers of adjacent conductors 21o in the Y direction. The configuration of each of the conductors corresponding to the bit lines BLo of the memory units MU0, MU2, and MU3 is similar to the configuration of each of the conductors corresponding to the bit lines BLo of the memory unit MU1, and thus descriptions thereof will be omitted.

As illustrated in FIG. 14, conductors 30A, 30B, 30C, 30D, and 30E corresponding to word lines WL0 are provided in the first layer, the third layer, the fifth layer, the seventh layer, and the ninth layer, respectively. In this manner, the conductors 30 corresponding to the word lines WL0 are arranged along the Z direction. That is, the conductors 30A, 30B, 30C, 30D, and 30E corresponding to the memory unit MU0 are provided to overlap in the Z direction. The configuration of each of the conductors corresponding to the word lines WL1 to WL3 is similar to the configuration of each of the conductors corresponding to the word lines WL0, and thus descriptions thereof will be omitted.

As in the first embodiment, in the above described structure of the memory cell array 10, the memory cells MCL and MCU are provided in regions where conductors corresponding to bit lines BL and conductors corresponding to word lines WL intersect in adjacent wiring layers.

In the above described memory cell array 10 in the second embodiment, in the plane extending in the X direction and the Y direction, respective bit lines BLo provided in the second layer and the sixth layer are arranged to overlap and respective bit lines BLe provided in the fourth layer and the eighth layer are arranged to overlap. In the section of the memory cell array 10, bit lines BLo provided in the second layer and the sixth layer, and bit lines BLe provided in the fourth layer and the eighth layer are alternately shifted from adjacent bit lines BL. That is, on the line, which passes through the Y-direction center of a conductor corresponding to a bit line BLo provided in an odd-numbered position when viewed from the lowermost layer and extends along the stacking direction, no conductor corresponding to an even-numbered bit line BLe when viewed from the lowermost layer is provided.

That is, in the plane formed by the X and Y directions, for example, the Y-direction center of the conductors corresponding to bit lines BLo is located between two adjacent conductors corresponding to bit lines BLe. Similarly, in the plane formed by the X and Y directions, for example, the Y-direction center of the conductors corresponding to the bit lines BLe is located between two adjacent conductors corresponding to the bit lines BLo. That is, in the plane formed by the X and Y directions, the Y-direction center of a conductor constituting a memory cell MCL is located between two conductors constituting memory cells MCU sharing a word line WL with the memory cell MCL and located adjacent to the memory cell MCL. Similarly, the Y-direction center of a conductor constituting a memory cell MCU is located between two conductors constituting memory cells MCL sharing a word line WL with the memory cell MCU and located adjacent to the memory cell MCU.

[2-2] Effect of Second Embodiment

In the above described semiconductor memory device 1 according to the second embodiment, the reliability of data stored in the memory cells may be improved. Hereinafter, details of the effect will be described.

Figure 17A:
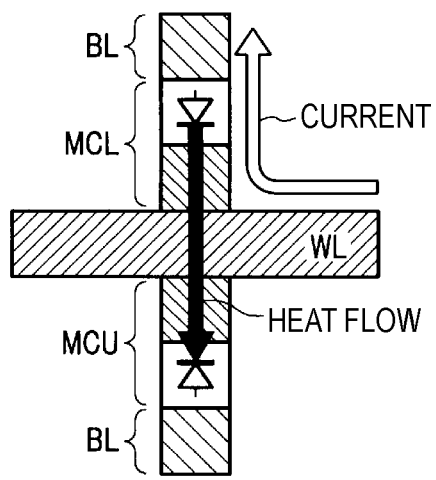
FIGS. 17A and 17B are cross-section views of a memory cell array, which illustrates an operation in the semiconductor memory device according to the second embodiment and a comparative example of the second embodiment.
Figure 17B:
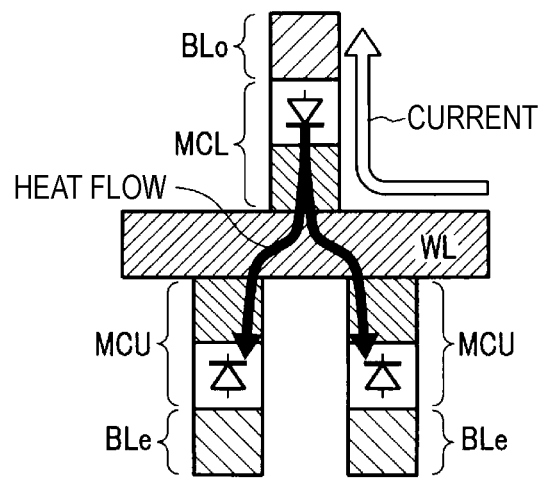

As in the first embodiment, in the semiconductor memory device 1 according to the second embodiment, memory cells are shifted in the in-plane direction in adjacent wiring layers. Specifically, bit lines BL, which are respectively provided in wiring layers adjacent to the upper layer side and the lower layer side of a wiring layer in which word lines WL are provided, are shifted in the in-plane direction. Here, details of the effect of the second embodiment will be described with reference to a comparative example illustrated in FIGS. 17A and 17B. FIG. 17A illustrates an arrangement of memory cells MC in the comparative example of the second embodiment, and FIG. 17B illustrates an arrangement of memory cells MC in the second embodiment. FIGS. 17A and 17B schematically illustrate a heat flow of the heat generated when the illustrated memory cell MCL is selected and a current flows through the memory cell MCL.

As illustrate in FIGS. 17A and 17B, memory cells MCU and MCL are provided between a lower layer bit line BL and an upper layer bit line BL that share a word line WL. As illustrated in FIG. 17A, in the comparative example, the lower-layer bit line BL and the upper-layer bit line BL, which share the word line WL, are adjacent to each other in the stacking direction, and as illustrated in FIG. 17B, in the second embodiment, the lower-layer bit lines BLe and the upper-layer bit line BLo, which share the word line WL, are shifted in the in-plane direction.

In the comparative example, when the memory cell MCL is selected, the heat flow generated in the memory cell MCL concentratedly flows into the memory cell MCU immediately below the memory cell MCL via the shared word line WL. In the second embodiment, when the memory cell MCL is selected, the heat flow generated in the memory cell MCL flows into two memory cells MCU around the memory cell MCL via the shared word line WL in a dispersed manner. The interval between a selected memory cell MCL and an unselected memory cells MCU in the second embodiment is wider than the interval between a selected memory cell MCL and an unselected memory cell MCU in the comparative example. Thus, the heat generated in the selected memory cell MCL is further diffused until reaching the unselected memory cell MCU.

Figure 18:
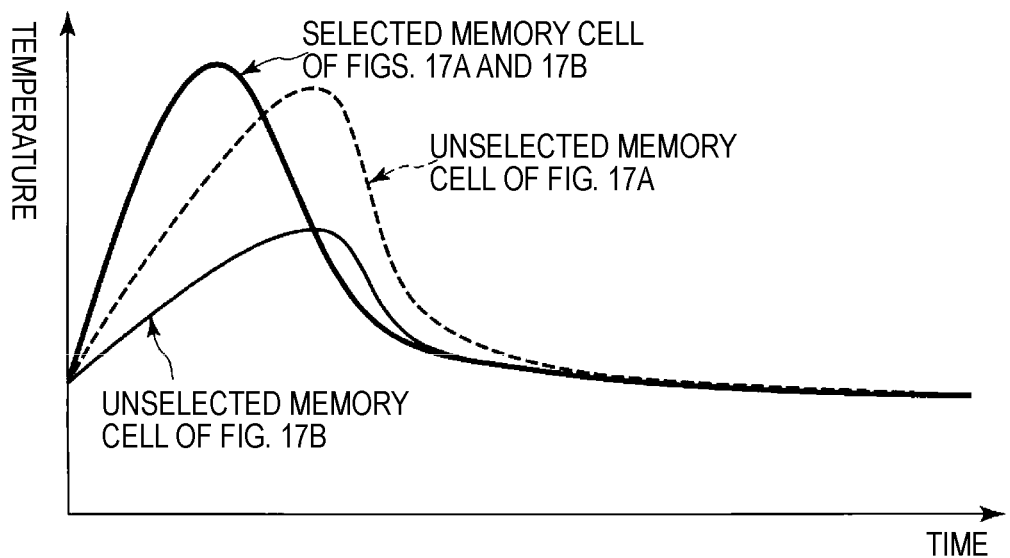
FIG. 18 is a waveform diagram illustrating temperature changes of memory cells in the second embodiment and a comparative example of the second embodiment.

An example of temperature changes of the selected and unselected memory cells MC as described above is illustrated in FIG. 18. FIG. 18 is a schematic view illustrating temperature changes of selected and unselected memory cells MC of FIGS. 17A and 17B, in which the vertical axis and the horizontal axis correspond to a temperature and a time, respectively. FIG. 18 illustrates an example of a process in which a current flows through a selected memory cell MCL, and a temperature of the memory cell rises and then is cooled.

As illustrated in FIG. 18, first, the temperature of each of the selected memory cells MCL illustrated in FIGS. 17A and 17B rises. Accordingly, the temperature of the selected memory cell MC propagates to the adjacent memory cell MC, and the temperature of the unselected memory cell MCU rises later than the selected memory cell MCL. Then, assuming that the same amount of heat is generated in the selected memory cells MCL in the comparative example and the second embodiment, the amount of heat received by each memory cell MC illustrated in FIGS. 17A and 17B becomes smaller in the order of the selected memory cell MCL, the unselected memory cell MCU in the comparative example, and the unselected memory cell MCU in the second embodiment.

As described above, in the semiconductor memory device 1 according to the second embodiment, it is possible to suppress the amount of heat propagating to unselected memory cells in vicinity of a selected memory cell by shifting the positions of stacked bit lines BL in the in-plane direction in each wiring layer. Accordingly, the semiconductor memory device 1 according to the second embodiment may suppress the influence of disturbance caused by the heat generated in the selected memory cells, thereby improving the reliability of data stored in the memory cells MC as in the first embodiment.

[3] Third Embodiment

Hereinafter, a semiconductor memory device 1 according to a third embodiment will be described. The semiconductor memory device 1 according to the third embodiment corresponds to a combination of the first embodiment and the second embodiment, in which conductors corresponding to word lines WL, which are adjacent in the stacking direction, and conductors corresponding to bit lines BL, which are adjacent in the stacking direction, are shifted in the in-plane directions, respectively.

[3-1] Configuration

Hereinafter, the structure of the memory cell array 10 in the third embodiment will be described.

Figure 19:
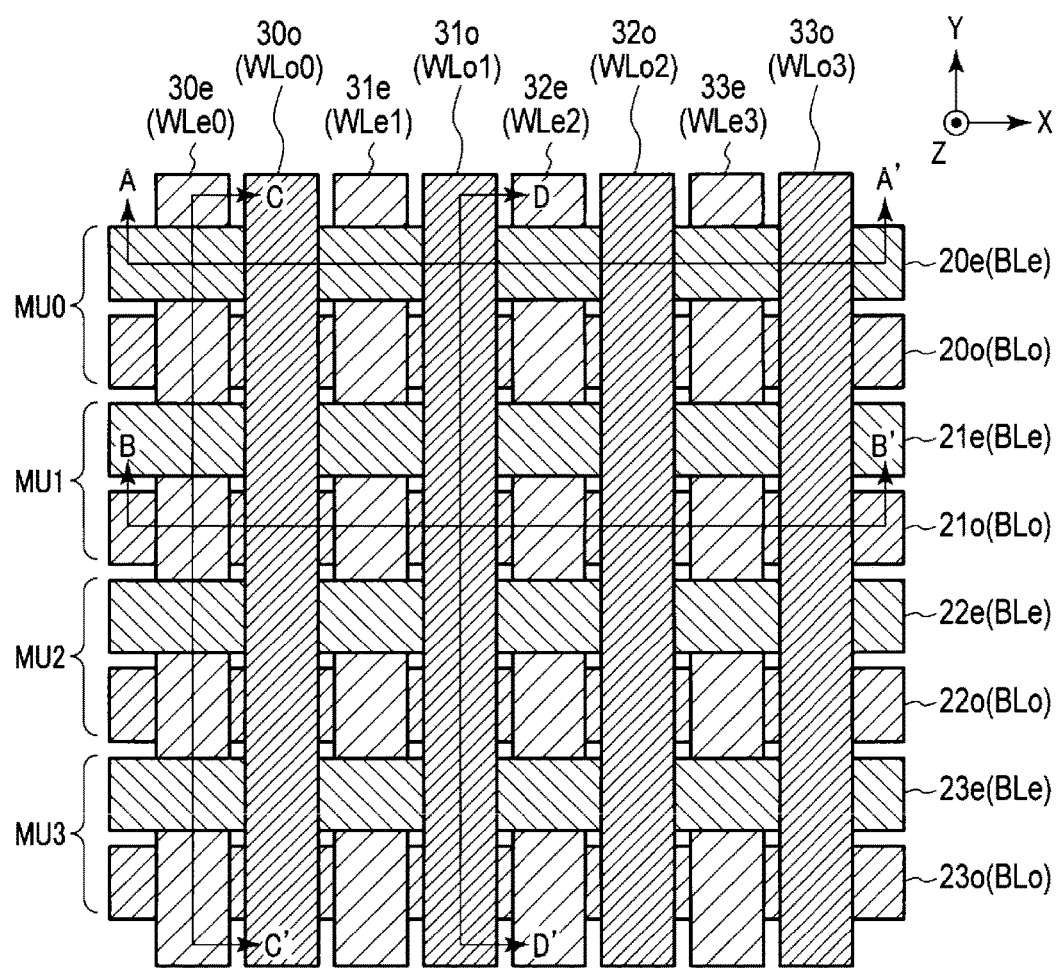
FIG. 19 is a plan view layout diagram of a memory cell array provided in a semiconductor memory device according to a third embodiment.
Figure 20:
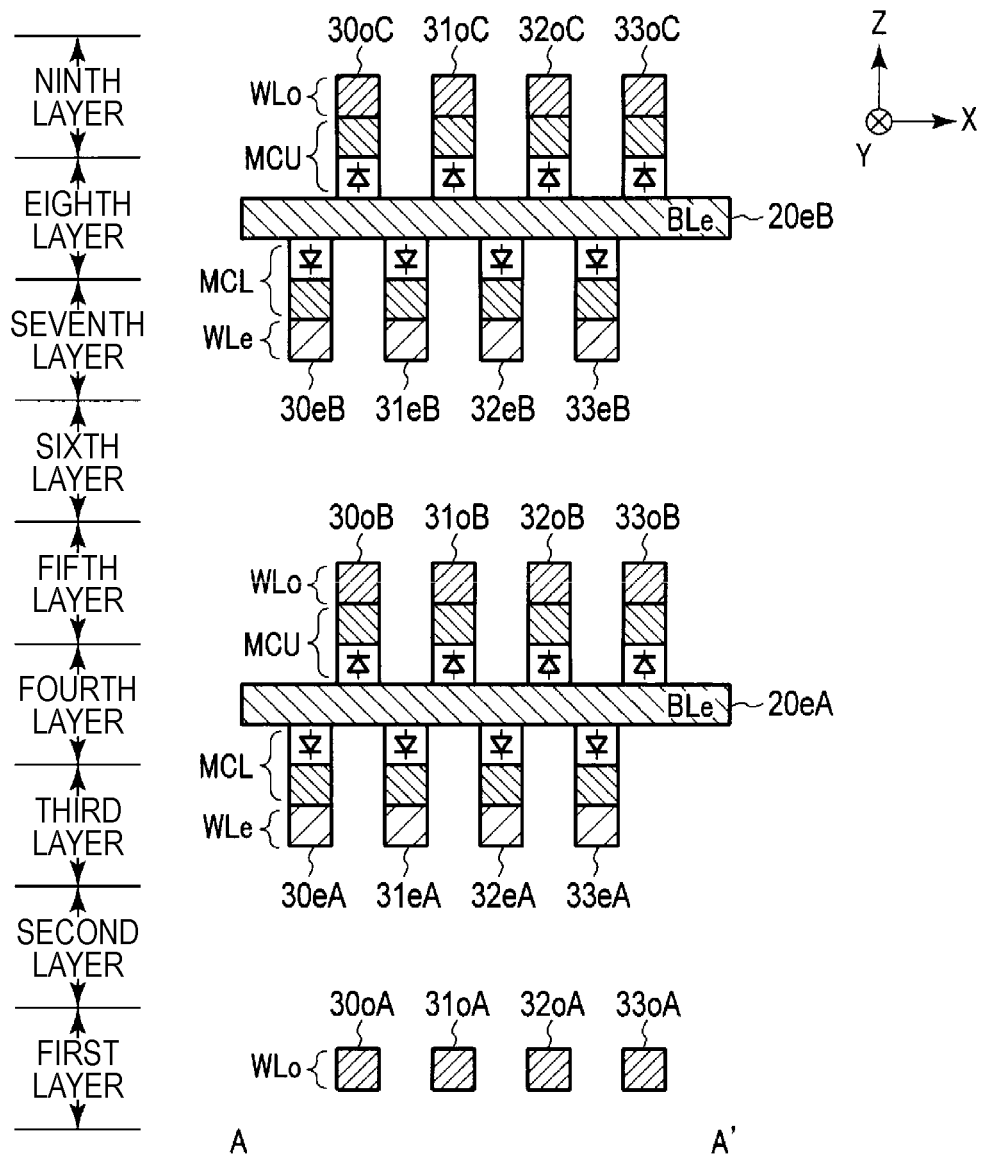
FIG. 20 is a cross-section view of the memory cell array taken along line A-A' in FIG. 19.
Figure 21:
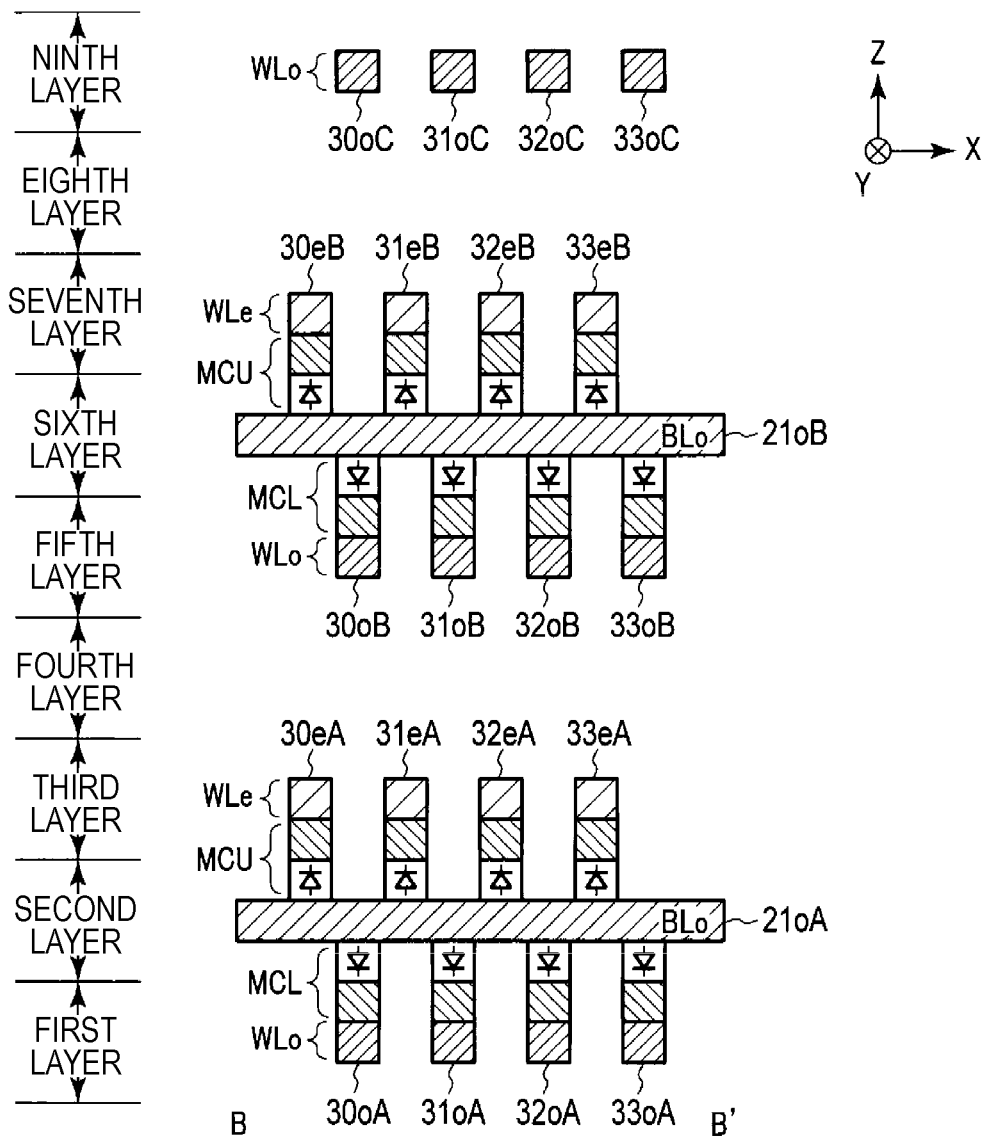
FIG. 21 is a cross-section view of the memory cell array taken along line B-B' in FIG. 19.
Figure 22:
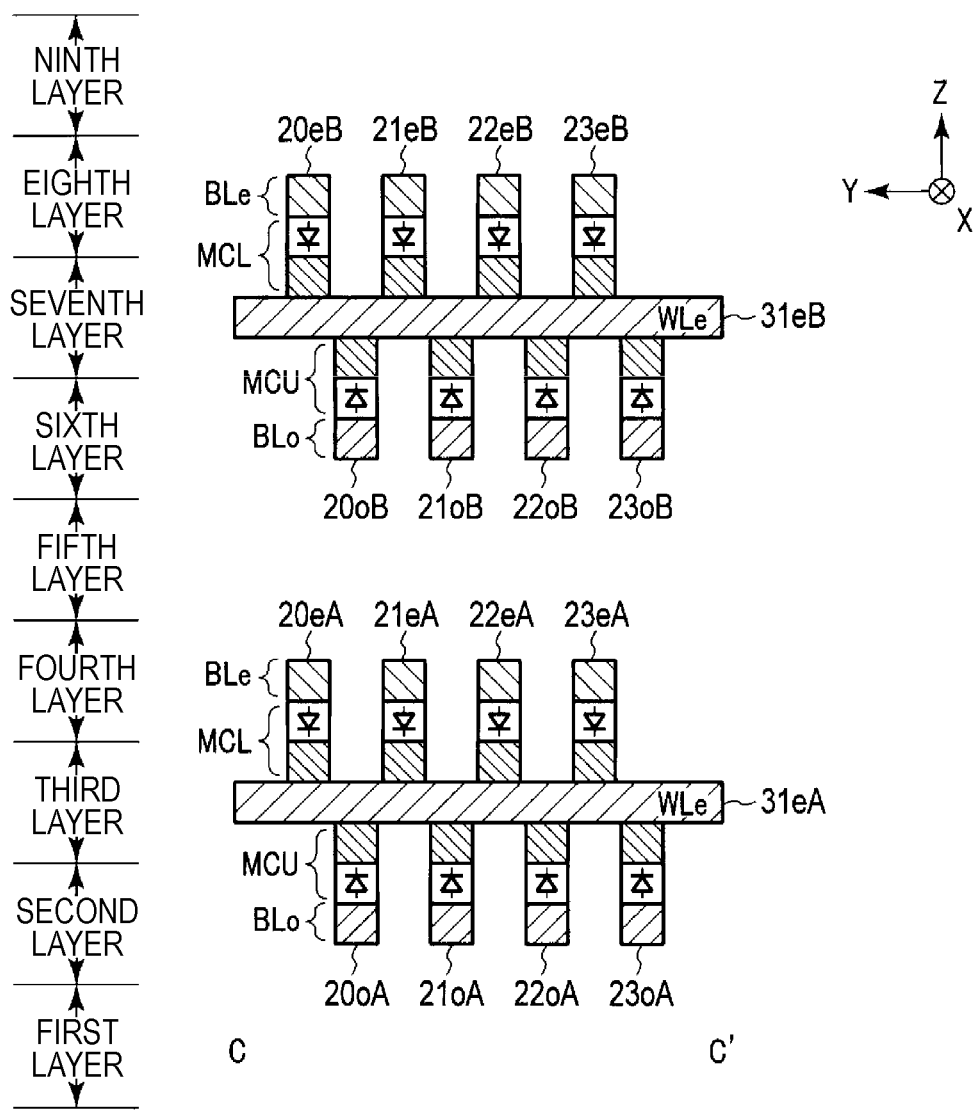
FIG. 22 is a cross-section view of the memory cell array taken along line C-C' in FIG. 19.
Figure 23:
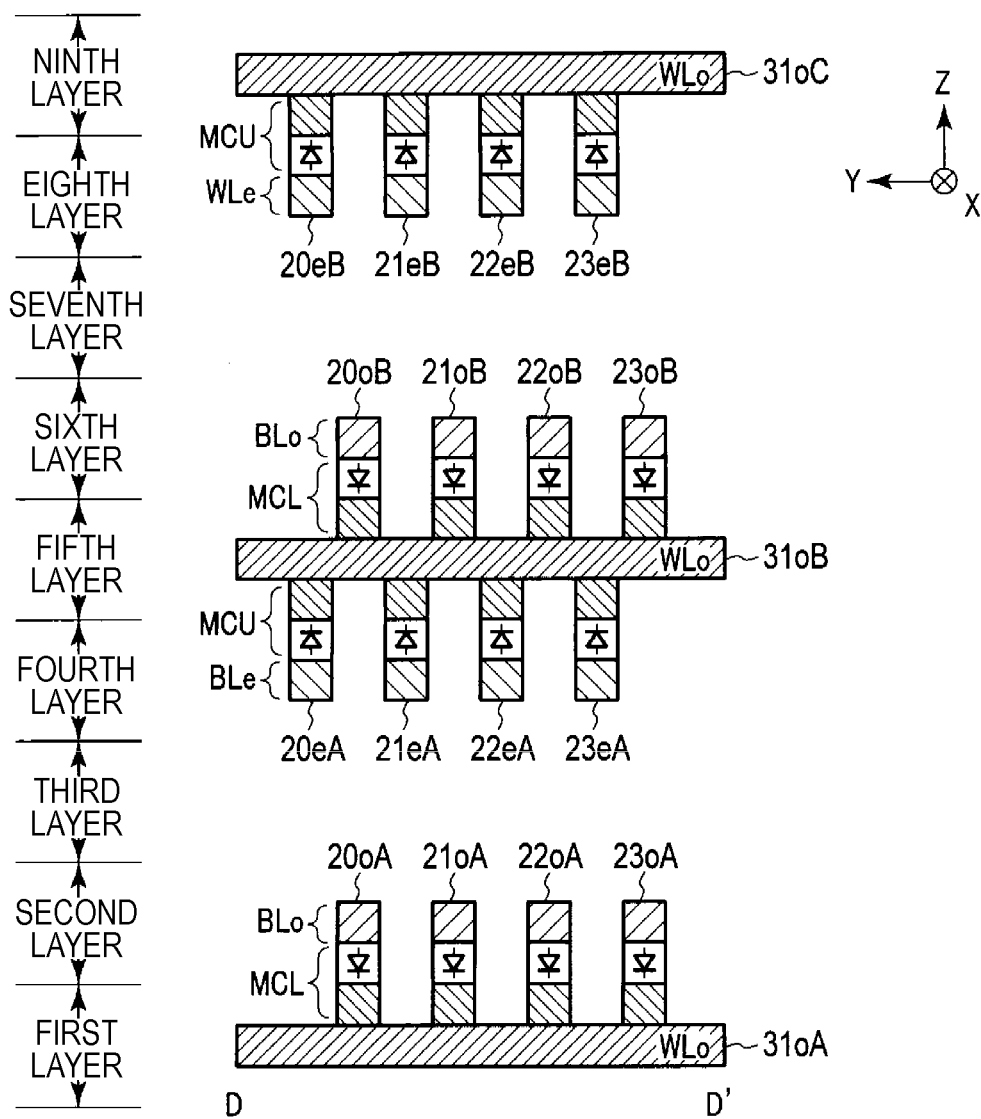
FIG. 23 is a cross-section view of the memory cell array taken along line D-D' in FIG. 19.

First, a plan view layout of the memory cell array 10 in the third embodiment will be described with reference to FIG. 19. As illustrated in FIG. 19, in the memory cell array 10, conductors 20e to 23e corresponding to bit lines BLe, conductors 20o to 23o corresponding to bit lines BLo, conductors 30e to 33e corresponding to word lines WLe, and conductors 30o to 33o corresponding to word lines WLo are provided.

The arrangement of the conductors 20e to 23e and the conductors 20o to 23o is the same as the arrangement of the conductors 20e to 23e and the conductors 20o to 23o described in the second embodiment with reference to FIG. 13, and the arrangement of the conductors 30e to 33e, and 30o to 33o is the same as the arrangement of the conductors 30e to 33e, and 30o to 33o described in the first embodiment with reference to FIG. 3.

Subsequently, a sectional structure of the memory cell array 10 in the third embodiment will be described with reference to FIGS. 20 to 23. FIGS. 20 to 23 are cross-section views of the memory cell array 10 taken along lines A-A', B-B', C-C', and D-D' in FIG. 19, respectively.

As illustrated in FIGS. 20 to 23, the arrangement of the conductors 20e to 23e is the same as the arrangement of the conductors 20e to 23e described in the second embodiment with reference to FIGS. 14 and 15, and the arrangement of the conductors 20o to 23o is the same as the arrangement of the conductors 20o to 23o described in the second embodiment with reference to FIGS. 14 and 16. The arrangement of the conductors 30e to 33e is the same as the arrangement of the conductors 30e to 33e described in the first embodiment with reference to FIGS. 4 and 5, and the arrangement of the conductors 30o to 33o is the same as the arrangement of the conductors 30o to 33o described in the first embodiment with reference to FIGS. 4 and 6.

Then, in the above described structure of the memory cell array 10, the memory cells MCL and MCU are provided in regions where conductors corresponding to bit lines BL and conductors corresponding to word lines WL intersect in adjacent wiring layers as in the first and second embodiments.

[3-2] Effect of Third Embodiment

As described above, in the semiconductor memory device 1 according to the third embodiment, the positions of stacked bit lines BL and word lines WL are shifted in the in-plane direction in each wiring layer. That is, since memory cells in the bit line BL direction and the word line WL direction are shifted in the in-plane directions, respectively, the interval between a selected memory cell and an unselected memory cell around the selected memory cell corresponds to that obtained by combining the first and second embodiments.

Specifically, in both of an unselected memory cell sharing a word line WL with the selected memory cell and located adjacent to the selected memory cell and an unselected memory cell sharing a bit line BL with the selected memory cell and located adjacent to the selected memory cell, an interval between the unselected memory cell and the selected memory cell becomes larger than that in the comparative example described in the first and second embodiments. In the semiconductor memory device 1 according to the third embodiment, since the number of unselected memory cells provided in the vicinity of the selected memory cell is larger than that in the first and second embodiments, the number of objects to which heat is dispersed is larger than that in the first and second embodiments.

Accordingly, the semiconductor memory device 1 according to the third embodiment may suppress the amount of heat propagating to unselected memory cells in vicinity of a selected memory cell during various operations compared to that of the first and second embodiments. Accordingly, the semiconductor memory device 1 according to the third embodiment may suppress the influence of disturbance caused by the heat generated in the selected memory cell compared to that of the first and second embodiments, thereby improving the reliability of data stored in the memory cells MC compared to that of the first and second embodiments.

[4] Fourth Embodiment

Hereinafter, a semiconductor memory device 1 according to a fourth embodiment will be described. The semiconductor memory device 1 according to the fourth embodiment relates to a wiring method when a word line WL described in the first embodiment is connected to the word line driver 17.

[4-1] Configuration

Figure 24:
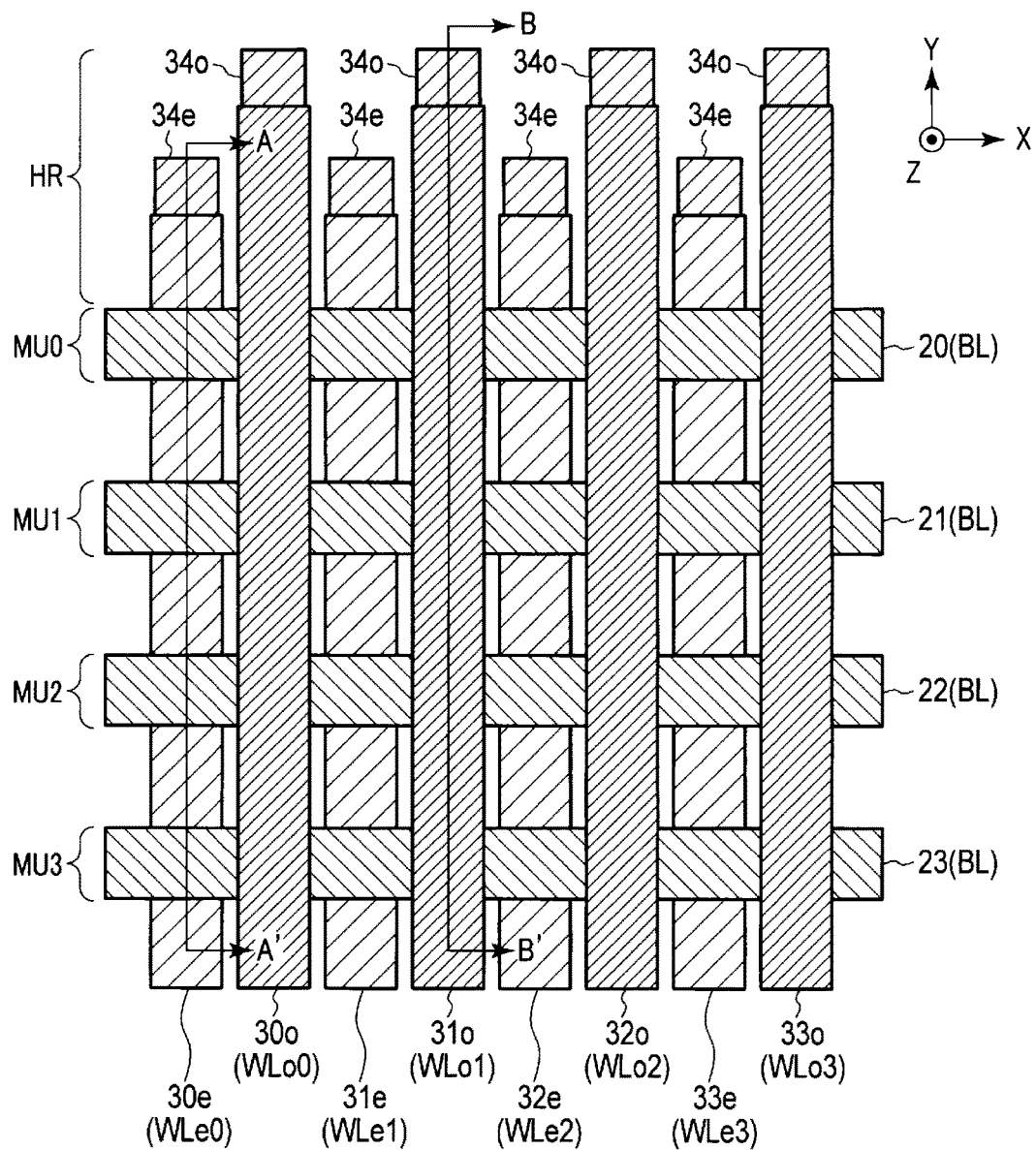
FIG. 24 is a plan view layout diagram of a memory cell array provided in a semiconductor memory device according to a fourth embodiment.
Figure 25:
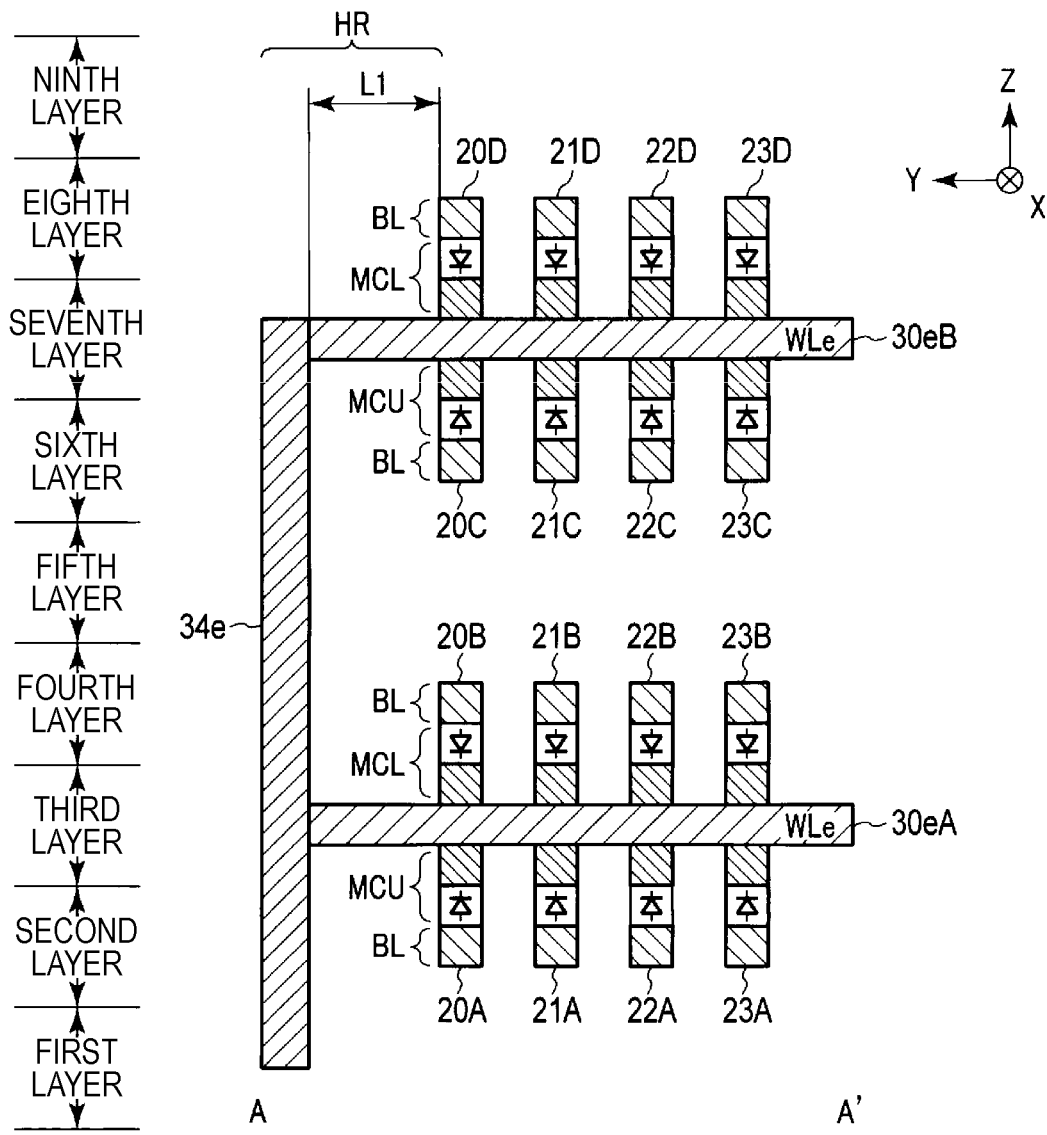
FIG. 25 is a cross-section view of the memory cell array taken along line A-A' in FIG. 24.
Figure 26:
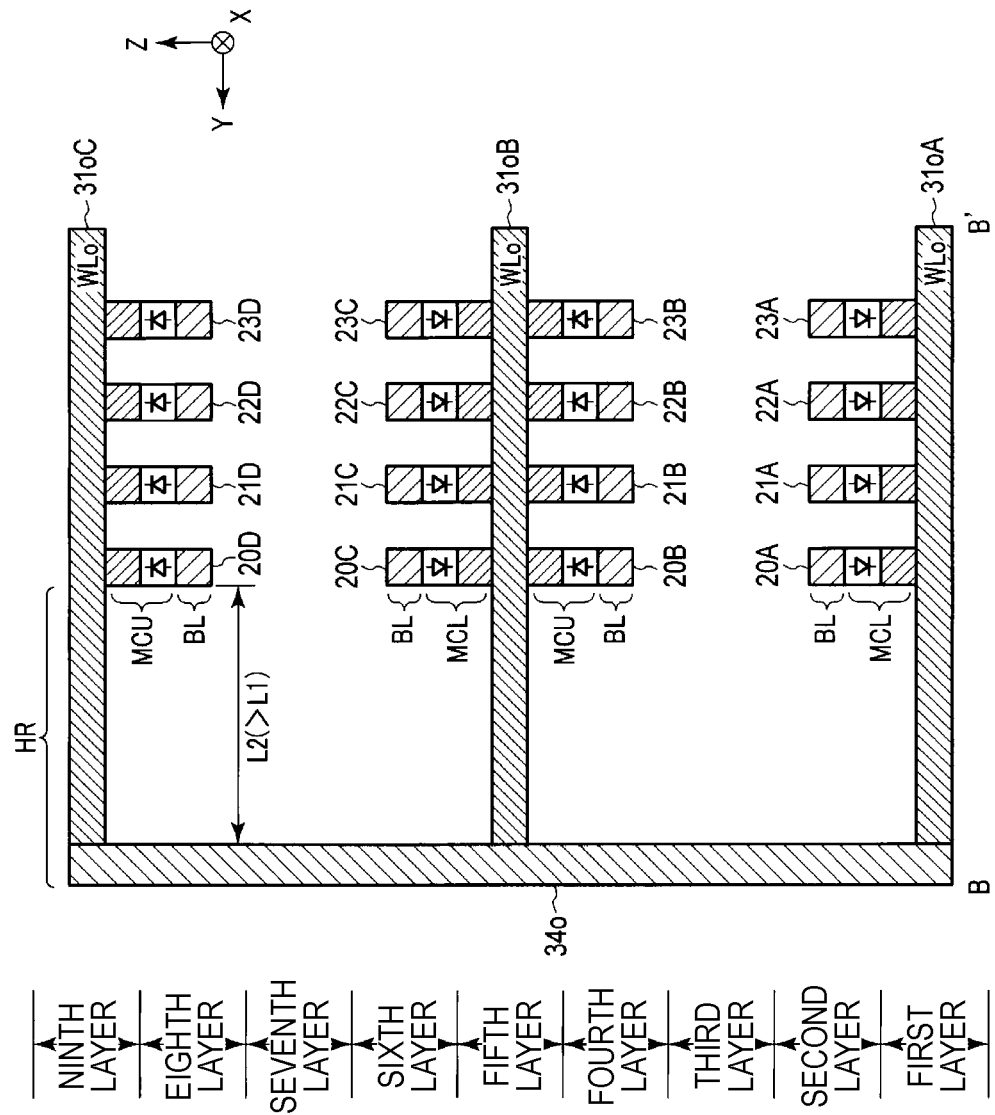
FIG. 26 is a cross-section view of the memory cell array taken along line B-B' in FIG. 24.

Hereinafter, the configuration of the semiconductor memory device 1 according to the fourth embodiment will be described with reference to FIGS. 24 to 26. FIG. 24 illustrates an example of a plan view layout in the memory cell array 10. FIGS. 25 and 26 are cross-section views of the memory cell array 10 taken along lines A-A' and B-B' in FIG. 24, respectively. Constituent elements corresponding to a memory cell MC, a bit line BL, and a word line WL illustrated in FIGS. 25 and 26 are the same as those described in the first embodiment with reference to FIGS. 5 and 6, and thus descriptions thereof will be omitted.

The plan view layout of the memory cell array 10 illustrated in FIG. 24 is different from the plan view layout of the memory cell array 10 described in the first embodiment with reference to FIG. 3, in that a region HR where word lines WLe and WLo provided in different wiring layers are connected in common is illustrated. In the region HR, conductors 30$o$, 31$o$, 32$o$, and 33$o$ corresponding to the word lines WLo are drawn toward the outside of the memory cell array 10, compared to conductors 30$e$, 31$e$, 32$e$, and 33$e$ corresponding to the word lines WLe. Then, conductors 34$e$ are provided at ends of the conductors 30$e$, 31$e$, 32$e$, and 33$e$ in the Y direction, respectively, and conductors 34$o$ are provided at ends of the conductors 30$o$, 31$o$, 32$o$, and 33$o$ in the Y direction, respectively.

As illustrated in FIG. 25, a conductor 34$e$ is provided to extend in the Z direction, and to short-circuit corresponding word lines WLe. Specifically, the conductor 34$e$ is in contact with corresponding conductors 30$e$A and 30$e$B, and electrically connects the conductors 30$e$A and 30$e$B to each other. Hereinafter, an interval in the Y direction between a memory cell MC closest to the region HR and the conductor 34$e$ will be referred to as L1. In FIG. 25, the conductor 34$e$ extends from the first layer to the seventh layer, but the present disclosure is not limited thereto. For example, the conductor 34$e$ may extend to the top of a semiconductor substrate.

As illustrated in FIG. 26, the conductor 34$o$ is provided to extend in the Z direction, and to short-circuit corresponding word lines WLo. Specifically, the conductor 34$o$ is in contact with corresponding conductors 31$o$A, 31$o$B, and 31$o$C, and electrically connects the conductors 31$o$A, 31$o$B, and 31$o$C to each other. An interval L2 in the Y direction between a memory cell MC closest to the region HR and the conductor 34$o$ is longer than the interval L1. In FIG. 26, the conductor 34$o$ extends from the first layer to the ninth layer, but the present disclosure is not limited thereto. For example, the conductor 34$o$ may extend to the top of a semiconductor substrate.

[4-2] Effect of Fourth Embodiment

In the semiconductor memory device 1 according to the fourth embodiment as described above, the process difficulty level of the memory cell array 10 may be suppressed. Hereinafter, details of the effect will be described.

In a semiconductor memory device in which word lines WLo and WLe are arranged on a straight line along the stacking direction, when the word lines WLo and WLe provided in different wiring layers are respectively connected, it is necessary to bend wirings in the wiring layers or between the wiring layers. Otherwise, in such a semiconductor memory device, when the word lines WLo and WLe provided in different wiring layers are respectively connected, it is necessary to draw out the word lines WLo from one side of the memory cell array 10 and to draw out the word lines WLe from the other side of the memory cell array 10.

On the other hand, in the semiconductor memory device 1 according to the fourth embodiment, the word lines WLo and WLe are arranged such that the word lines WLo and WLe do not overlap in the stacking direction. That is, in the semiconductor memory device 1 according to the fourth embodiment, the conductors corresponding to the word lines WLo arranged in the stacking direction, and the conductors corresponding to the word lines WLe arranged in the stacking direction may be respectively connected by the conductors 34, which are linearly provided.

Accordingly, compared to the case where the word lines WLo and WLe are arranged on a straight line along the stacking direction, in the semiconductor memory device 1 according to the fourth embodiment, a wiring for short-circuiting wiring layers corresponding to word lines WL may be easily formed. Accordingly, the semiconductor memory device 1 according to the fourth embodiment may suppress the process difficulty level of the memory cell array 10.

In the semiconductor memory device 1 according to the fourth embodiment, the drawing-out length of the word lines WLo is designed to be longer than the drawing-out length of the word lines WLe. In such a case, the semiconductor memory device 1 according to the fourth embodiment may suppress a risk of short-circuiting of adjacent conductors 34$o$ and 34$e$ when the conductors 34$o$ and 34$e$ are provided for adjacent word lines WLo and WLe, respectively.

In the semiconductor memory device 1 according to the fourth embodiment, the word lines WLe arranged in the stacking direction and the word lines WLo arranged in the stacking direction are short-circuited, respectively. That is, in the semiconductor memory device 1 according to the fourth embodiment, the number of word lines WL driven by the word line driver 17 is substantially reduced. Accordingly, the semiconductor memory device 1 according to the fourth embodiment may suppress a circuit area required for selecting and driving a word line WL, thereby suppressing the circuit area of the semiconductor memory device 1.

In the semiconductor memory device 1 according to the fourth embodiment, since a process difficulty level is reduced, it is possible to easily achieve drawing-out of both word lines WLe and WLo from one side of the memory cell array 10.

In the above description, descriptions are made on a case in which in the region HR, the conductors 30o, 31o, 32o, and 33o corresponding to the word lines WLo are drawn toward the outside of the memory cell array 10, compared to the conductors 30e, 31e, 32e, and 33e corresponding to the word lines WLe, as an example, but the present disclosure is not limited thereto. For example, the conductors 30e, 31e, 32e and 33e corresponding to the word lines WLe may be drawn toward the outside of the memory cell array 10 compared to the conductors 30o, 31o, 32o, and 33o. Even in such a case, the same effect as that described above may be obtained.

[5] Fifth Embodiment

Hereinafter, a semiconductor memory device 1 according to a fifth embodiment will be described. The fifth embodiment relates to a selection order of memory cells MC in which various operations are executed in the case where the semiconductor memory device 1 includes a plurality of memory cell arrays 10.

[5-1] Configuration

Figure 27:
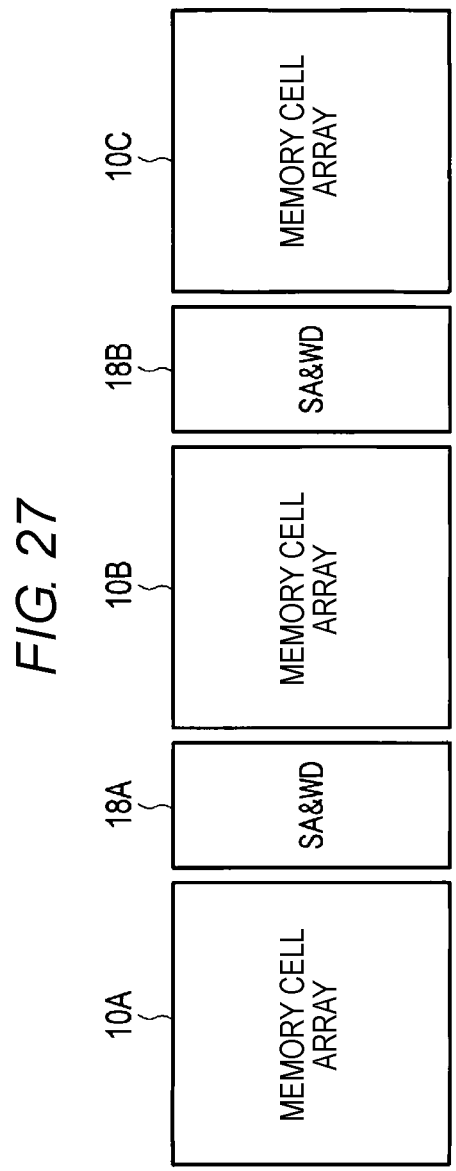
FIG. 27 is a block diagram of a semiconductor memory device according to a fifth embodiment.

The configuration of the semiconductor memory device 1 according to the fifth embodiment will be described with reference to FIG. 27. FIG. 27 illustrates a block diagram of the semiconductor memory device 1 according to the fifth embodiment. As illustrated in FIG. 27, the semiconductor memory device 1 includes a plurality of memory cell arrays 10 and a plurality of SA&WDs 18. Specifically, the semiconductor memory device 1 includes, for example, memory cell arrays 10A, 10B, and 10C, and SA&WDs 18A and 18B.

The configuration of each of the memory cell arrays 10A, 10B, and 10C is the same as that of the memory cell array 10 described in the above embodiments, in which the memory cell arrays 10A, 10B, and 10C are arranged in this order in, for example, the column direction (the bit line direction).

The SA&WD 18 corresponds to a set of the write driver 13 and the sense amplifier 14 as described in the first embodiment with reference to FIGS. 1 and 2. For example, the SA&WD 18A is disposed between the memory cell arrays 10A and 10B, and the SA&WD 18B is disposed between the memory cell arrays 10B and 10C. The SA&WD 18 disposed between adjacent memory cell arrays 10 may be shared by, for example, the adjacent memory cell arrays 10, or may be configured to be drivable in parallel. Other configurations are the same as the configuration of the semiconductor memory device 1 described in the first to fourth embodiments, and thus descriptions thereof will be omitted.

[5-2] Operation

Figure 28:
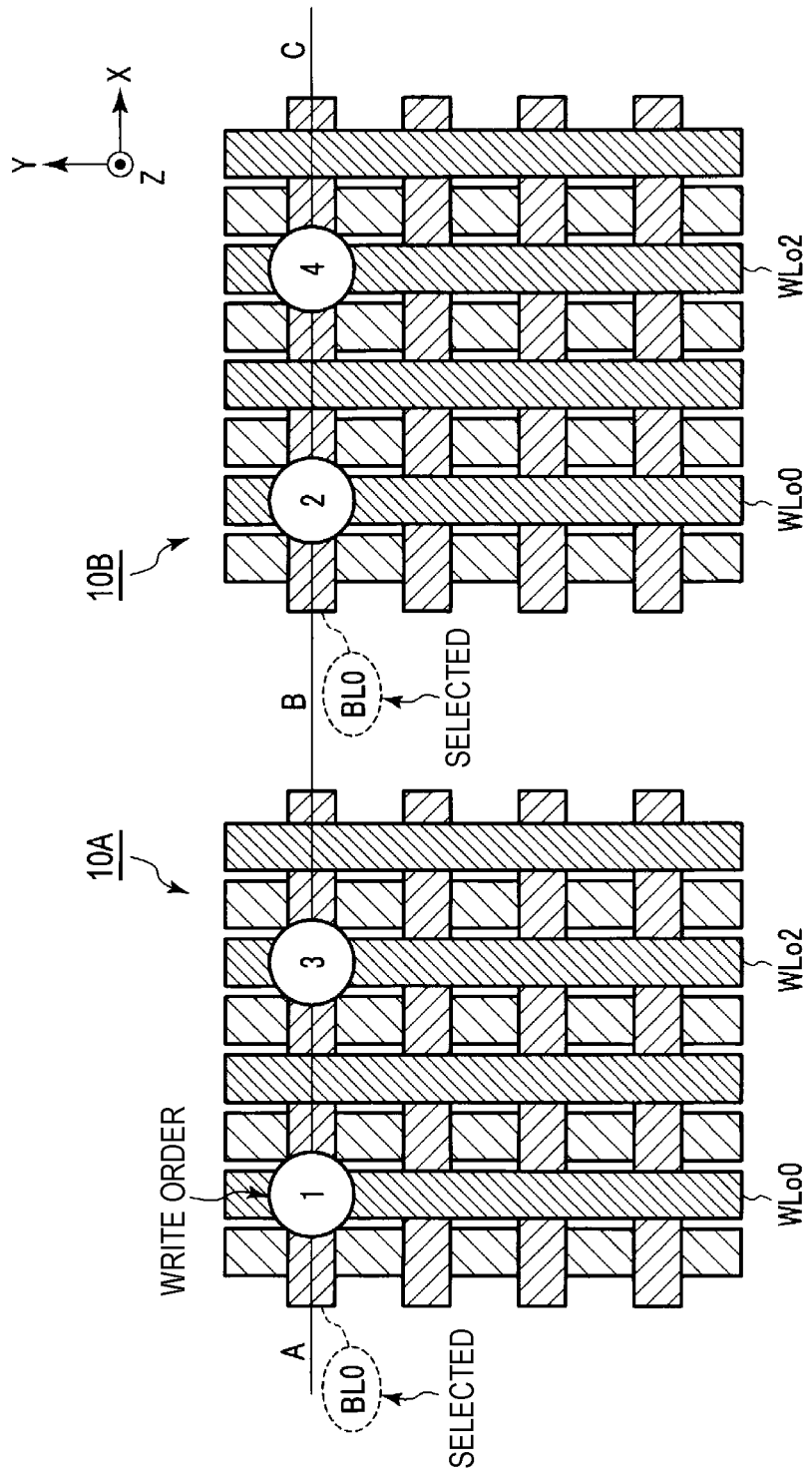
FIG. 28 is a plan view layout diagram of a memory cell array, which illustrates an operation sequence of the semiconductor memory device according to the fifth embodiment.

Hereinafter, the operation of the semiconductor memory device 1 according to the fifth embodiment will be described with reference to FIG. 28. FIG. 28 is a view of a plan view layout of a memory cell array in which an example of an operation sequence in a write operation of the semiconductor memory device 1 is illustrated, and the operations for the memory cell arrays 10A and 10B are illustrated.

As illustrated in FIG. 28, the controller 11 executes a write operation according to a "WRITE ORDER" as depicted with ordinal labels 1, 2, 3, 4. First, the controller executes at a write operation in which a bit line BL0 and a word line WLo0 of the memory cell array 10A are selected (location 1). Thereafter, the controller 11 executes a write operation in which a bit line BL0 and a word line WLo0 of the memory cell array 10B are selected (location 2). Similarly, the controller 11 sequentially executes a write operation in which the bit line BL0 and the word line WLo2 of the memory cell array 10A are selected (location 3) and a write operation in which the bit line BL0 and the word line WLo2 of the memory cell array 10B are selected (location 4).

In the above description, descriptions are made on the case where the bit line BL and the word line WL selected for the write operation when the memory cell array 10A is selected correspond to the bit line BL and the word line WL selected for the subsequent write operation when the memory cell array 10B is selected, as an example, but the present disclosure is not limited thereto. For example, after executing a write operation in which the bit line BL0 and the word line WLo0 of the memory cell array 10A are selected, the controller 11 may execute a write operation in which another bit line BL0 and another word line WL of the memory cell array 10B are selected.

[5-3] Effect of Fifth Embodiment

Figure 29:
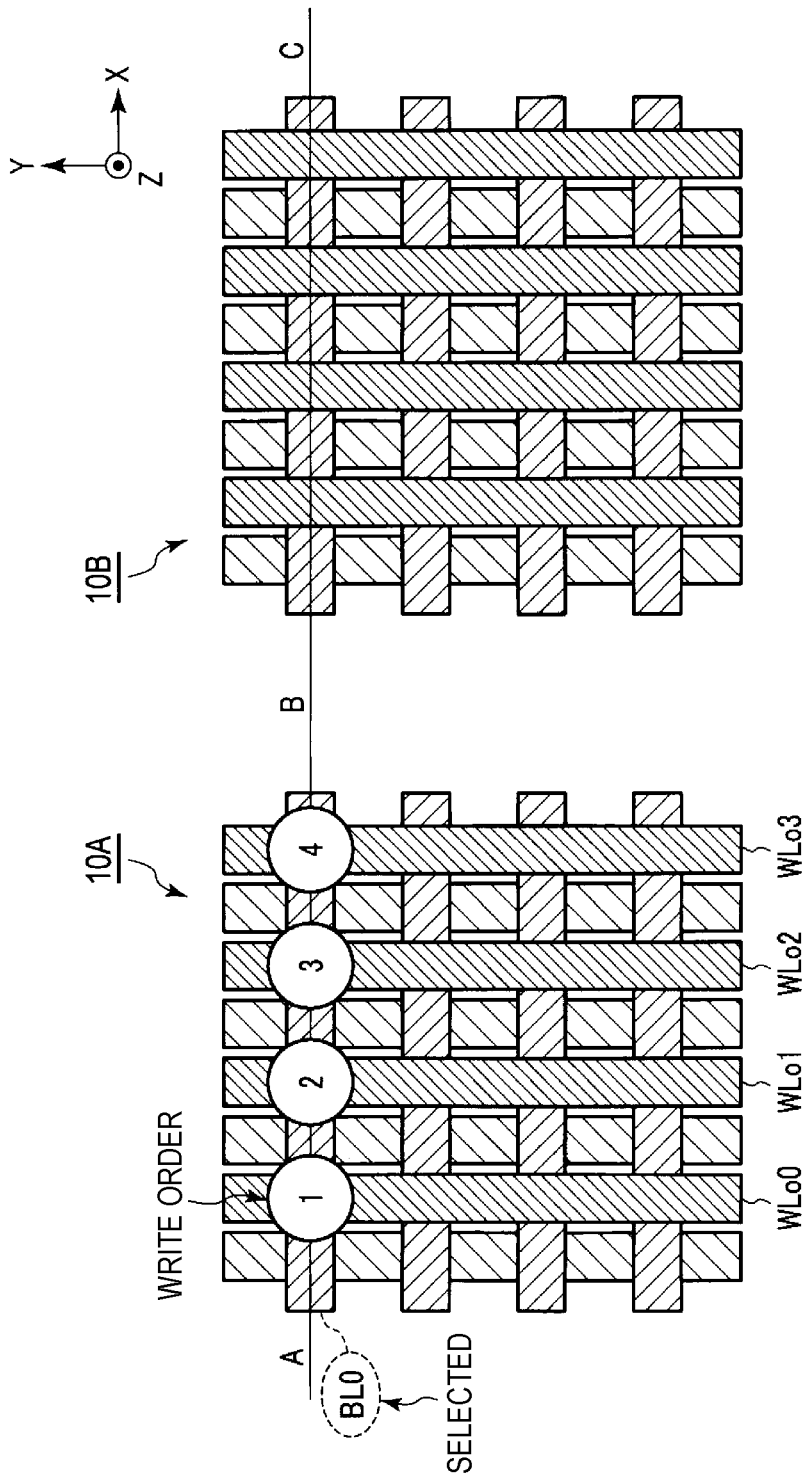
FIG. 29 is a plan view layout diagram of a memory cell array, which illustrates an operation sequence of the semiconductor memory device according to a comparative example of the fifth embodiment.

As described above, in the semiconductor memory device 1 according to the fifth embodiment, an operation in which the memory cell array 10A is selected, and a write operation in which the memory cell array 10B is selected are alternately executed. Here, the effect of the fifth embodiment will be described with reference to a comparative example illustrated in FIG. 29. FIG. 29 illustrates an example of an operation sequence in a write operation of the semiconductor memory device 1 according to the comparative example of the fifth embodiment.

Figure 30:
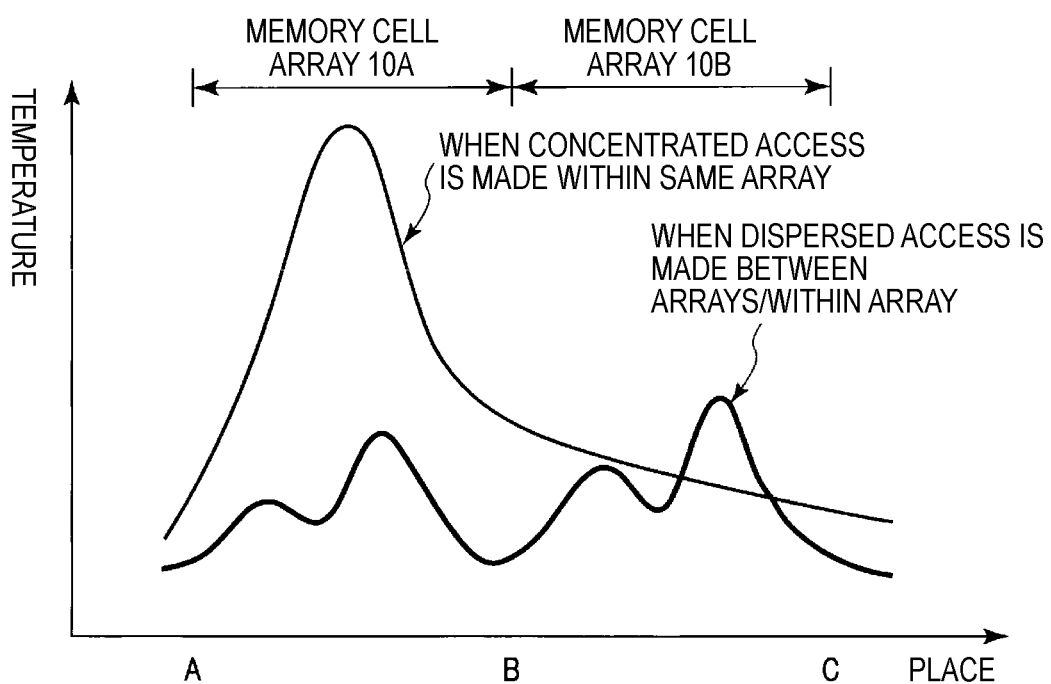
FIG. 30 is a waveform diagram illustrating temperature distribution of memory cell arrays in the fifth embodiment and a comparative example of the fifth embodiment.

As illustrated in FIG. 29, in the comparative example, the controller 11 executes a write operation according to a "WRITE ORDER" depicted with ordinal labels 1, 2, 3, 4. In this comparative example, first, the controller executes a write operation in which a bit line BL0 of the memory cell array 10A is selected and word lines WLo0 (location 1), WLo1 (location 2), WLo2 (location 3), and WLo3 (location 4) are sequentially selected. That is, in the comparative example, the controller 11 consecutively executes write operations in which the same memory cell array 10 is selected. In this case, a temperature distribution of the semiconductor memory device 1 after the write operation in the fifth embodiment described with reference to FIG. 28, and a temperature distribution of the semiconductor memory device 1 after the write operation in the comparative example described with reference to FIG. 29 are as illustrated in, for example, FIG. 30. FIG. 30 illustrates an example of a temperature distribution of the memory cell array 10 along the line A-B-C in each of FIGS. 28 and 29. In FIG. 30, the "PLACE" axis references position/place along the depicted line A-B-C in FIG. 28 and FIG. 29.

As illustrated in FIG. 30, when a concentrated access is made for the same memory cell array 10 as in the comparative example described with reference to FIG. 29, the temperature of the memory cell array 10A for which the concentrated access is made is greatly increased. When an access is made for a plurality of memory cell arrays 10 in a dispersed manner, as in the fifth exemplary embodiment described with reference to FIG. 28, the heat generated during the access of the memory cell array 10A is dispersed to the memory cell array 10B. Similarly, the heat generated during the access of the memory cell array 10B is dispersed to the memory cell array 10A.

Thus, in the semiconductor memory device 1 according to the fifth embodiment, a temperature rise width of the memory cell arrays 10A and 10B when the write operation is executed is smaller than that in the comparative example. Accordingly, the semiconductor memory device 1 according to the fifth embodiment may suppress the influence of disturbance caused by the heat during the write operation, thereby improving the reliability of data stored in the memory cell MC.

In the semiconductor memory device 1 according to the fifth embodiment, memory cells MC consecutively accessed in the same memory cell array 10 are set not to be adjacent to each other. That is, when the controller 11 selects the same memory cell array 10 again, the write operation is executed in a state where between a previously accessed memory cell MC and a subsequent accessed memory cell MC, another memory cell MC is disposed.

In this case, an unselected memory cell MC adjacent to a selected memory cell MC is kept at a relatively low temperature because the write operation is not executed at a position close to the unselected memory cell MC. That is, in the semiconductor memory device 1 according to the fifth embodiment, the heat generated in the selected memory cell MC may be dispersed to adjacent memory cells MC. Accordingly, the semiconductor memory device 1 according to the fifth embodiment may suppress a temperature rise of the selected memory cell MC, thereby further suppressing the influence of disturbance caused by heat during the write operation.

The above descriptions are made using a write operation as an example, but the present disclosure is not limited thereto. For example, the operation sequence described above may also be applied to a read operation. In such a case, the semiconductor memory device 1 according to the fifth embodiment may achieve the same effect as that described above.

The above described operation of the semiconductor memory device 1 may be implemented when an external memory controller designates an address or when the row decoder 16 changes a decoding method of row address information. When the decoding method is changed, the row decoder 16 decodes row address information such that, for example, from consecutive address information, a plurality of memory cell arrays 10 are alternately selected and adjacent memory cells MC are not consecutively selected within the same memory cell array 10.

[6] Sixth Embodiment

Hereinafter, a semiconductor memory device 1 according to a sixth embodiment will be described. In the semiconductor memory device 1 according to the sixth embodiment, a conductor corresponding to a bit line BL and a semiconductor substrate are connected to each other so that heat generated in a selected memory cell MC during various operations is diffused to the semiconductor substrate.

[6-1] Configuration

Figure 31:
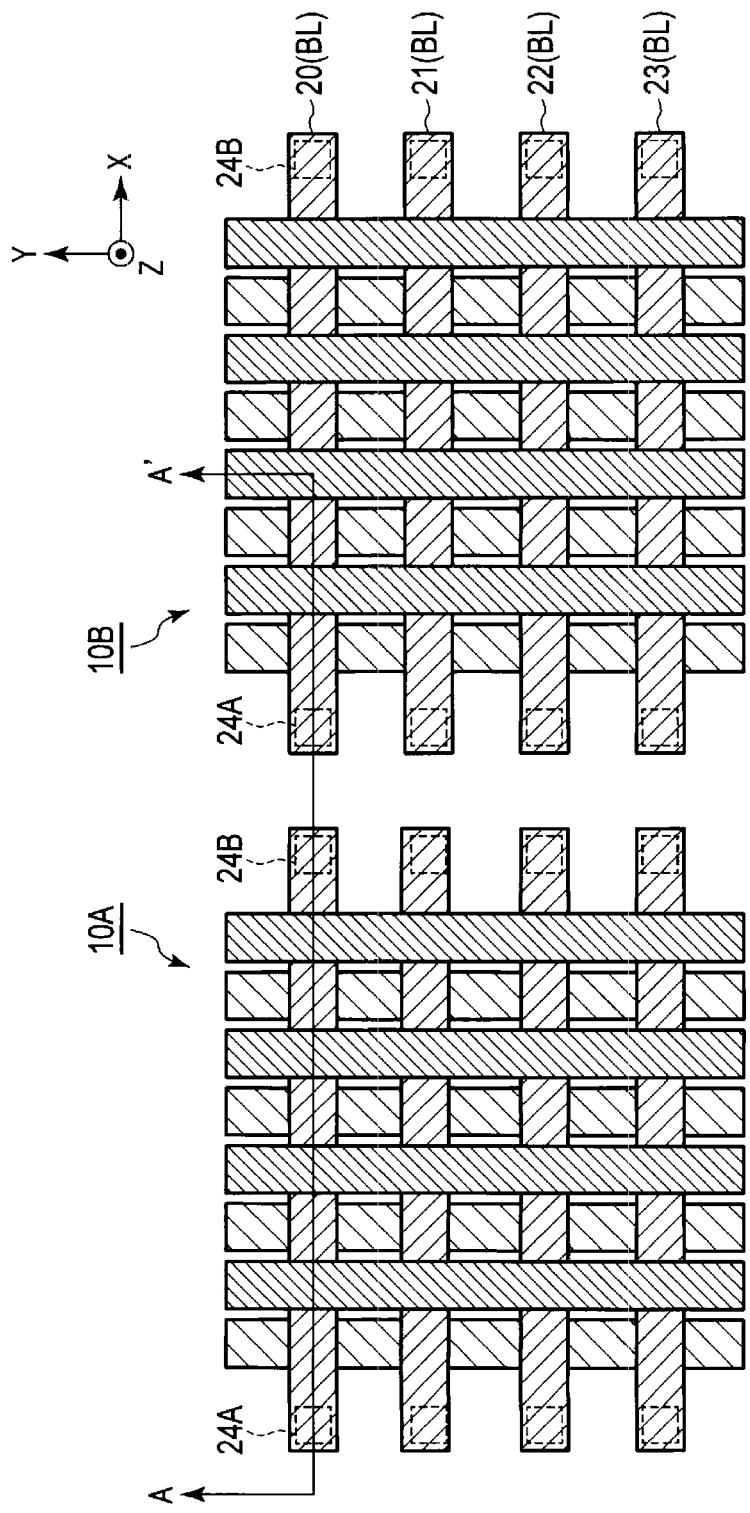
FIG. 31 is a plan view layout diagram of a memory cell array provided in a semiconductor memory device according to a sixth embodiment.
Figure 32:
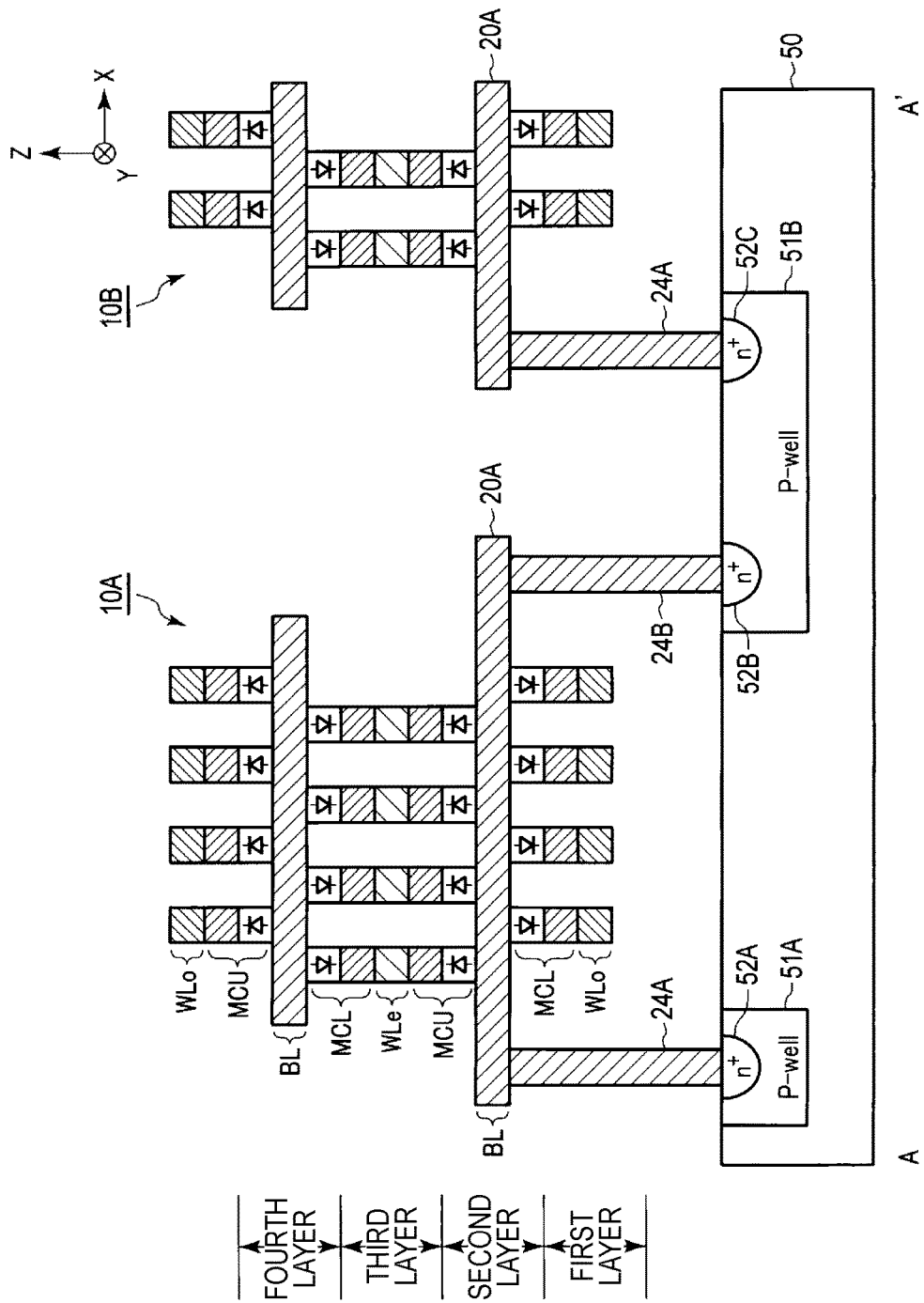
FIG. 32 is a cross-section view of the memory cell array taken along line A-A' in FIG. 31.

Hereinafter, the configuration of the semiconductor memory device 1 according to the sixth embodiment will be described with reference to FIGS. 31 and 32. FIG. 31 illustrates an example of a plan view layout of the memory cell array 10 in the sixth embodiment. FIG. 32 is a cross-section view of the memory cell array 10 taken along line A-A' in FIG. 31.

As illustrated in FIG. 31, memory cell arrays 10A and 10B are arranged in the X direction. The configuration of the memory cell array 10 illustrated in FIG. 31 is different from the configuration of the memory cell array 10 described in, for example, the first embodiment with reference to FIG. 3, in that via contacts 24A and 24B are provided at one end and the other end of a conductor corresponding to a bit line BL, respectively. The via contact 24 is formed of, for example, a conductor such as a metal. The material constituting the via contact 24 is not limited thereto and any material may be used.

The cross-section view of the memory cell array 10 illustrated in FIG. 32 corresponds to the first to fifth layers, which are extracted from the cross-section view of the memory cell array 10 described in the first embodiment with reference to FIG. 4. FIG. 32 is different from FIG. 4 in that a semiconductor substrate 50 and the end regions of the bit lines BL are illustrated.

As illustrated in FIG. 32, on the semiconductor substrate 50 of the semiconductor memory device 1, P-type well regions 51A and 51B are formed. An n+ impurity diffusion region 52A is formed in the surface of the P-type well region 51A, and n+ impurity diffusion regions 52B and 52C are formed in the surface of the P-type well region 51B. The diffusion regions 52A, 52B, and 52C are diffusion regions that do not constitute a field effect transistor. Then, in the second layer, one end of a conductor 20A provided in the memory cell array 10A is connected to the diffusion region 52A via the via contact 24A, and the other end is connected to the diffusion region 52B via the via contact 24B. Similarly, in the second layer, one end of a conductor 20A provided in the memory cell array 10B is connected to the diffusion region 52C via the via contact 24A.

[6-2] Effect of Sixth Embodiment

As described above, in the semiconductor memory device 1 according to the sixth embodiment, the conductor 20A corresponding to the bit line BL is connected to the n+ impurity diffusion region 52 that does not constitute the field effect transistor. Since the n+ impurity diffusion region 52 is formed in the surface of the P-type well region 51, the direction from the bit line BL to the P-type well region 51 is a reverse bias direction of the PN junction.

That is, in the semiconductor memory device 1 according to the sixth embodiment, although the bit line BL is connected to the diffusion region 52 via the via contact 24, a current hardly flows from the bit line BL toward the semiconductor substrate 50 due to the PN junction in the reverse bias direction. The PN junction does not have a rectifying effect on heat flow, and thus the heat generated in a selected memory cell MC can be diffused to the semiconductor substrate 50 through the bit line BL and the via contact 24.

Figure 33:
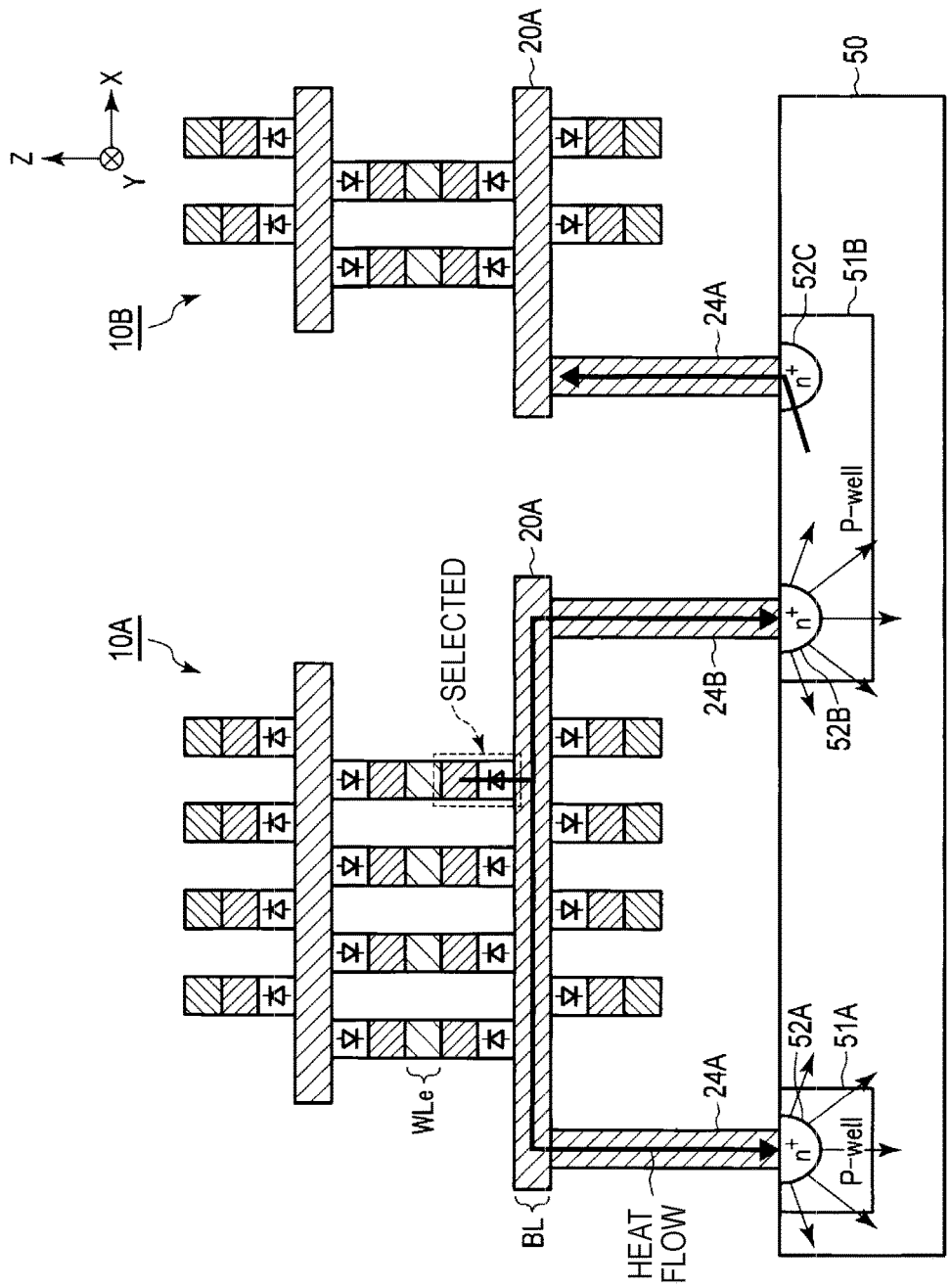
FIG. 33 is a cross-section view of a memory cell array, which illustrates an operation in the semiconductor memory device according to the sixth embodiment.

Here, with reference to FIG. 33, descriptions will be made on the movement heat (a heat flow) when the heat generated in a selected memory cell MC is diffused. FIG. 33 illustrates an example of a heat flow when a memory cell MC connected to the conductor 20A of the memory cell array 10A illustrated in FIG. 32 is selected. As illustrated in FIG. 33, the heat generated by a current flowing through the selected memory cell MC is transmitted to the diffusion regions 52A and 52B through the conductor 20A and the via contacts 24A and 24B. Since the PN junction composed of the P-type well region 51 and the diffusion region 52 does not have a rectifying effect on heat flow, the heat flow generated in the selected memory cell MC is diffused into the semiconductor substrate 50. Then, the heat flow diffused to the semiconductor substrate 50 is diffused to the memory cell array 10B through the via contact 24A formed on the diffusion region 52C.

In this manner, the semiconductor memory device 1 according to the sixth embodiment may diffuse the heat generated in the memory cell array 10A to the semiconductor substrate 50, and then diffuse the heat to the adjacent memory cell array 10B.

Accordingly, the semiconductor memory device 1 according to the sixth embodiment may suppress a temperature rise of the memory cell array 10 on which various operations are executed. Thus, the semiconductor memory device 1 according to the sixth embodiment may suppress disturbance caused by heat generated in the selected memory cell during various operations, thereby improving the reliability of data stored in the memory cell MC.

For the semiconductor memory device 1 according to the sixth embodiment, a particularly significant effect may be achieved when the via contact 24 is made of a metal material having a high thermal conductivity. Without being limited thereto, a material with a high thermal conductivity may be used as the material for the via contact 24.

In the present embodiment, descriptions are made on the case where one end and the other end of a conductor 20A corresponding to a bit line BL of the lowermost layer are connected to a diffusion region 52 through a via contact 24, as one example, but the present disclosure is not limited thereto. For example, only one end or the other end of the conductor 20A may be connected to the diffusion region 52 through the via contact 24. Also, a conductor corresponding to a bit line BL provided in another wiring layer may be connected to the diffusion region 52 formed in the surface of the P-type well region 51 through the via contact 24 similarly to the conductor 20A as described above.

In the present embodiment, descriptions are made on the case where the PN junction is composed of the P-type well region 51 and the n+ impurity diffusion region 52, as an example, but the present disclosure is not limited thereto. For example, instead of the P-type well region 51, an N-type well region formed on the semiconductor substrate 50 may be used. In this case, a p+ impurity diffusion region is formed in the surface of the N-type well region, and the PN junction is composed of the N-type well region and the p+ impurity diffusion region. Then, in a semiconductor memory device having such a configuration, the via contact 24 may be connected to the p+ impurity diffusion region so that the same effect as that of the sixth embodiment as described above may be achieved.

[7] Seventh Embodiment

In the seventh embodiment, heat is diffused to the semiconductor substrate 50 via a word line WL, whereas in the sixth embodiment, heat is diffused to the semiconductor substrate 50 via a bit line BL.

[7-1] Configuration

Figure 34:
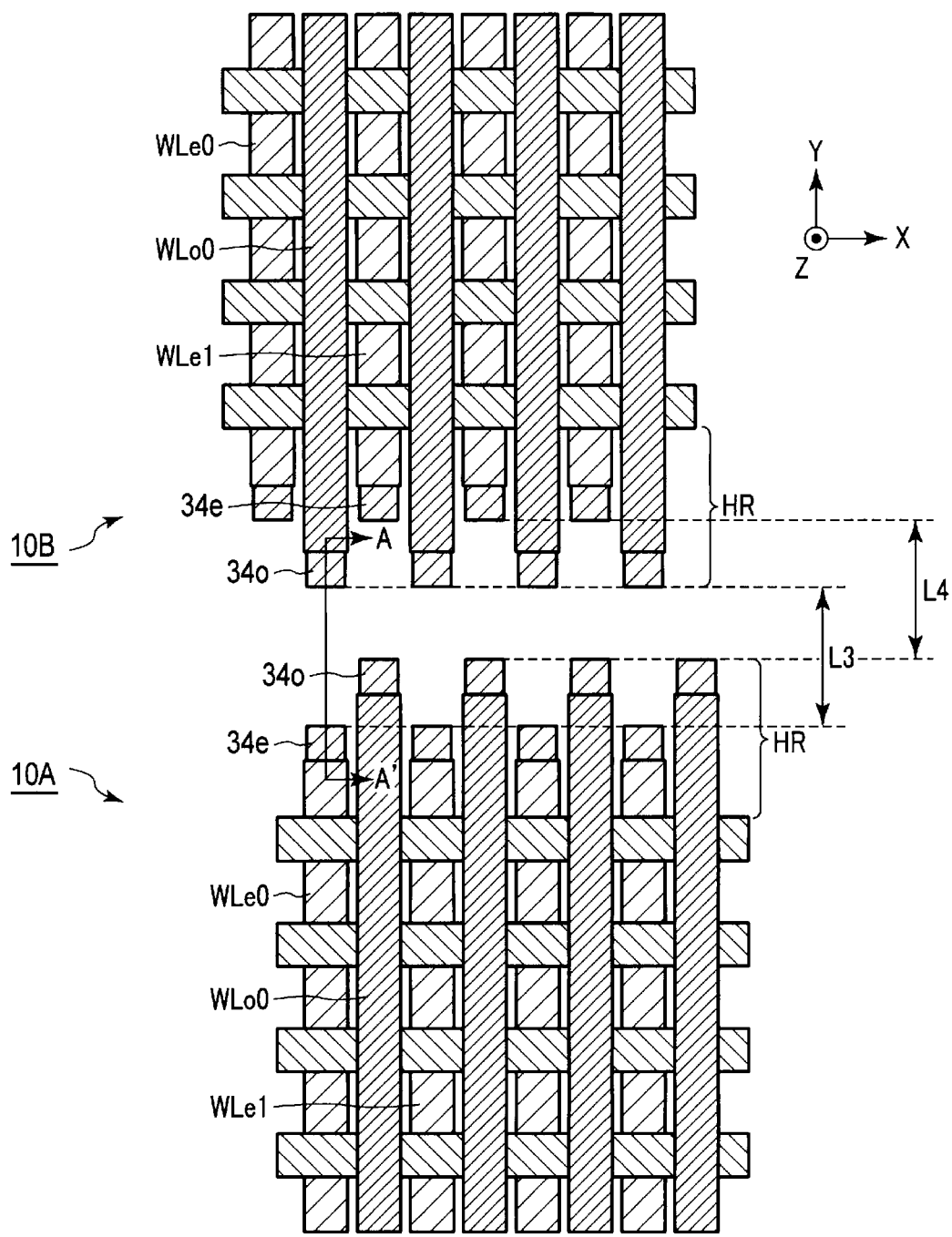
FIG. 34 is a plan view layout diagram of a memory cell array provided in a semiconductor memory device according to a seventh embodiment.
Figure 35:
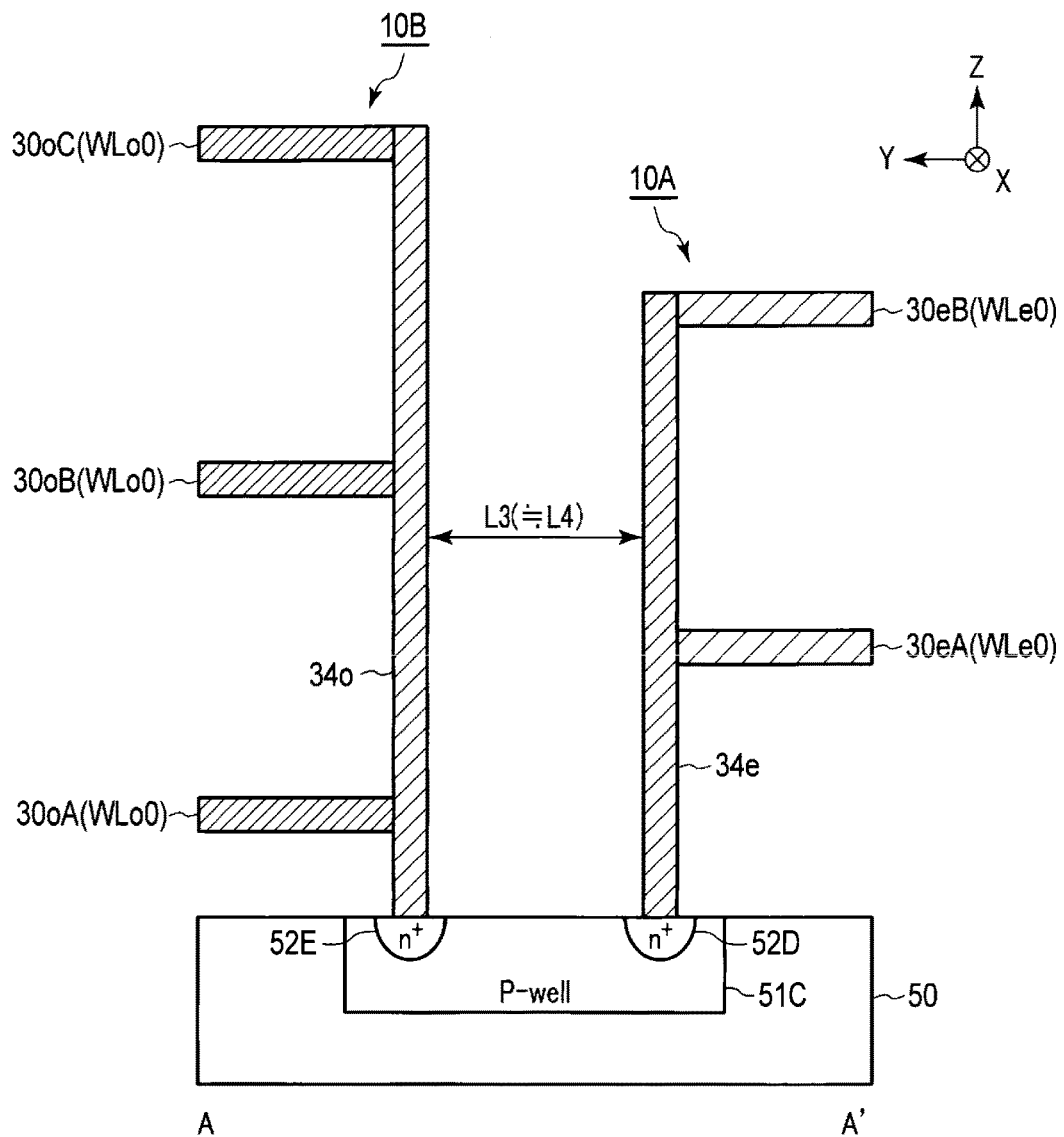
FIG. 35 is a cross-section view of the memory cell array taken along line A-A' in FIG. 34.

Hereinafter, the configuration of the semiconductor memory device 1 according to the seventh embodiment will be described with reference to FIGS. 34 and 35. FIG. 34 illustrates an example of a plan view layout of the memory cell array 10 in the seventh embodiment. FIG. 35 is a cross-sectional view of the memory cell array 10 taken along line A-A' in FIG. 34.

In the example illustrated in FIG. 34, the memory cell arrays 10A and 10B, described in the fourth embodiment with reference to FIG. 24, are arranged in the Y direction, and the memory cell array 10B is inverted with the X axis as a symmetry axis. The memory cell arrays 10A and 10B are also shifted in the X direction such that the conductors 34e of the memory cell array 10A face the conductors 34o of the memory cell array 10B, and the conductors 34o of the memory cell array 10A face the conductors 34e of the memory cell array 10B.

An interval L3 between the conductor 34e of the memory cell array 10A and the conductor 34o of the memory cell array 10B, and an interval L4 between the conductor 34o of the memory cell array 10A and the conductor 34e of the memory cell array 10B are substantially the same as each other. The intervals L3 and L4 are set in order to minimize the distance from conductors 34e and 34o of the memory cell array 10A to the conductors 34e and 34o of the memory cell array 10B, for example, in a process design.

The section of the memory cell array 10A illustrated in FIG. 35 corresponds to a sectional structure in the region HR described in the fourth embodiment with reference to FIG. 25, and the section of the memory cell array 10B corresponds to a Y-direction inverted structure of a sectional structure in the region HR described in the fourth embodiment with reference to FIG. 26.

As illustrated in FIG. 35, a P-type well region 51C is formed on the semiconductor substrate 50 of the semiconductor memory device 1. In the surface of the P-type well region 51C, n+ impurity diffusion regions 52D and 52E are formed. The diffusion regions 52D and 52E correspond to diffusion regions that do not constitute a field effect transistor. Then, a conductor 34e of the memory cell array 10A is connected to the diffusion region 52D, and a conductor 34o of the memory cell array 10B is connected to the diffusion region 52E.

[7-2] Effect of Seventh Embodiment

Through the above described configuration, the semiconductor memory device 1 according to the seventh embodiment may diffuse heat to the semiconductor substrate 50 through conductors corresponding to word lines WL as in the sixth embodiment. Specifically, the semiconductor memory device 1 according to the seventh embodiment may diffuse the heat generated in a selected memory cell MC of, for example, the memory cell array 10A to the semiconductor substrate 50, and then diffuse the heat to the adjacent memory cell array 10B.

Accordingly, the semiconductor memory device 1 according to the seventh embodiment may suppress a temperature rise of the memory cell array 10 in which various operations are executed. Thus, the semiconductor memory device 1 according to the seventh embodiment may suppress the influence of disturbance caused by heat generated in the selected memory cell during various operations, thereby improving the reliability of data stored in the memory cell MC.

In the semiconductor memory device 1 according to the seventh embodiment, the memory cell arrays 10A and 10B are shifted. Specifically, the wiring lead-out portions of the word lines WLo and the wiring lead-out portions of the word lines WLe are arranged to face each other. In this case, the distance between the end portions of adjacent memory cell arrays 10 may be made uniform.

Accordingly, the semiconductor memory device 1 according to the seventh embodiment may suppress the deviation of heat conducted in the adjacent memory cell arrays 10, thereby improving the efficiency in diffusing the heat between the adjacent memory cell arrays 10.

In the present embodiment, descriptions are made on the case where the PN junction is composed of the P-type well region 51 and the n+ impurity diffusion region 52, as an example, but the present disclosure is not limited thereto. For example, instead of the P-type well region 51, an N-type well region formed on the semiconductor substrate 50 may be used. In this case, a p+ impurity diffusion region is formed in the surface of the N-type well region, and the PN junction is composed of the N-type well region and the p+ impurity diffusion region. Then, in a semiconductor memory device having such a configuration, the conductor 34 may be connected to the p+ impurity diffusion region so that the same effect as that of the seventh embodiment as described above may be achieved.

[8] Eighth Embodiment

In the eighth embodiment, the semiconductor memory device 1 includes a plurality of memory cell arrays 10, and further includes a circuit for detecting a temperature in the vicinity of the memory cell array 10.

[8-1] Configuration

Figure 36:
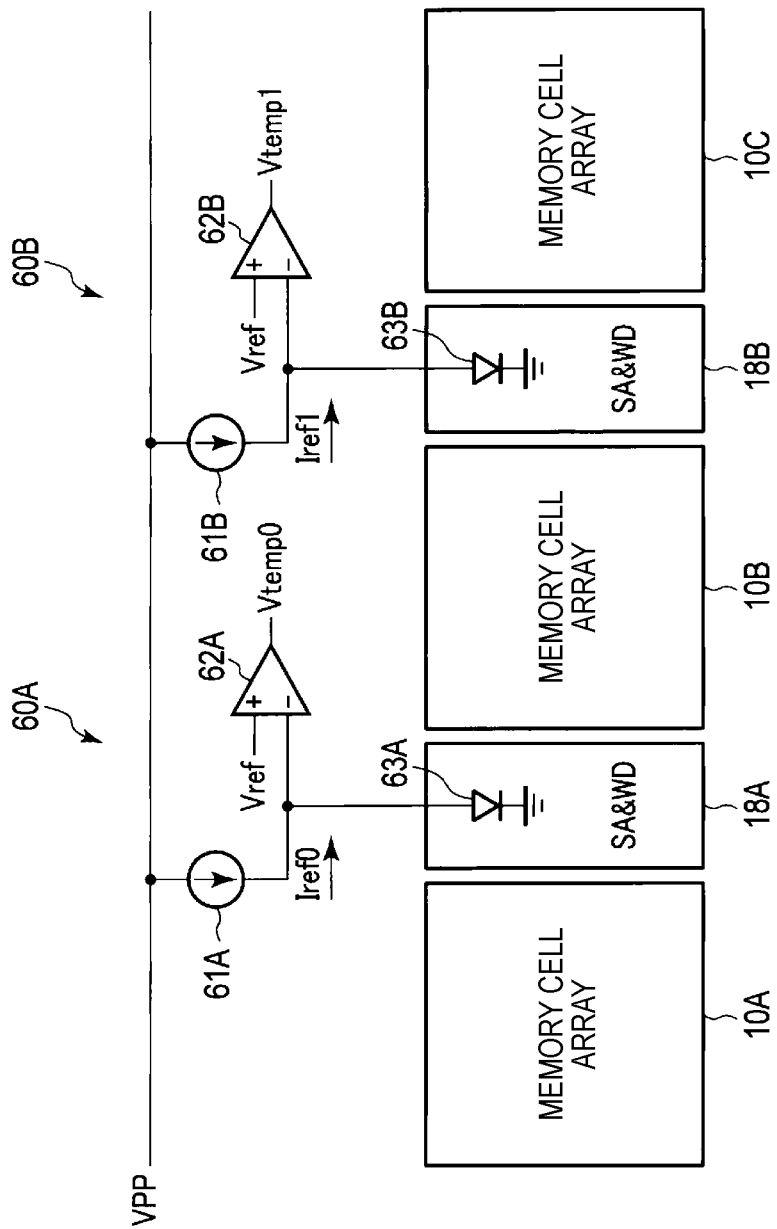
FIG. 36 is a circuit diagram of a temperature detection circuit provided in a semiconductor memory device according to an eighth embodiment.

Hereinafter, the configuration of the semiconductor memory device 1 according to the eighth embodiment will be described with reference to FIG. 36. FIG. 36 is a block diagram illustrating the same semiconductor memory device 1 as depicted in FIG. 27 having a temperature detection circuit 60 added thereto. As illustrated in FIG. 36, the depicted semiconductor memory device 1 includes two temperature detection circuits 60A and 60B.

Each temperature detection circuit 60 detects the temperature of a particular portion, and the controller 11 controls the operation of the semiconductor memory device 1 based on the temperature(s). The temperature detection circuit 60A includes a constant current source 61A, a comparator 62A, and a diode element 63A.

The constant current source 61A is connected between a power supply line VPP and a first input node of the comparator 62A to supply a constant current Iref. A reference voltage Vref is input to a second input node of the comparator 62A and a comparison signal Vtemp0 is output. An anode of the diode element 63A is connected to the first input node of the comparator 62A, and a cathode of the diode element 63A is grounded in the region of, for example, a SA&WD 18A. The configuration of the temperature detection circuit 60B is the same as that of the temperature detection circuit 60A, except that a comparison signal Vtemp1 is output from a comparator 62B, and a diode element 63B is grounded in the region of a SA&WD 18B.

[8-2] Effect of Eighth Embodiment

Through the above-described configuration according to the seventh embodiment, the semiconductor memory device 1 according to the eighth embodiment may sense the temperature in the vicinity of the memory cell array 10. For example, when the temperature of a portion in which the diode elements 63A and 63B are connected is changed, a voltage drop occurs based on a threshold voltage-temperature dependency of the diode elements 63A and 63B. On the other hand, the comparators 62A and 62B may determine whether the temperature of the diode elements 63A and 63B exceeds a predetermined temperature (for example, whether the temperature is presently high or low) by setting of a proper reference voltage Vref.

That is, the controller 11 may receive the comparison signals Vtemp0 and Vtemp1 output from the comparators 62A and 62B, and thereby detect the temperature state in the vicinity of the memory cell arrays 10A and 10B.

For example, the controller 11 switches the memory cell arrays 10 as a target of various operations based on the comparison signal Vtemp. Specifically, in the example illustrated in FIG. 36, it may be considered that when the temperature detection circuits 60A and 60B are in a high temperature state and a low temperature state, respectively, the controller 11 restricts an access to the memory cell arrays 10A and 10B, thereby preferentially executing an operation for which the memory cell array 10C is selected.

Accordingly, the semiconductor memory device 1 according to the eighth embodiment may avoid various operations for the memory cell array 10 when it is in a high temperature state. Thus, the semiconductor memory device 1 according to the eighth embodiment may suppress the influence of any disturbance caused by the heat during various operations, thereby improving the reliability of data stored in the memory cell MC.

[9] Ninth Embodiment

Hereinafter, a semiconductor memory device 1 according to a ninth embodiment will be described. The ninth embodiment relates to a combination of memory cell arrays 10 in which various operations are executed in parallel in the case where the semiconductor memory device 1 includes a plurality of memory cell arrays 10 arranged in a matrix form.

[9-1] Configuration

Figure 37:
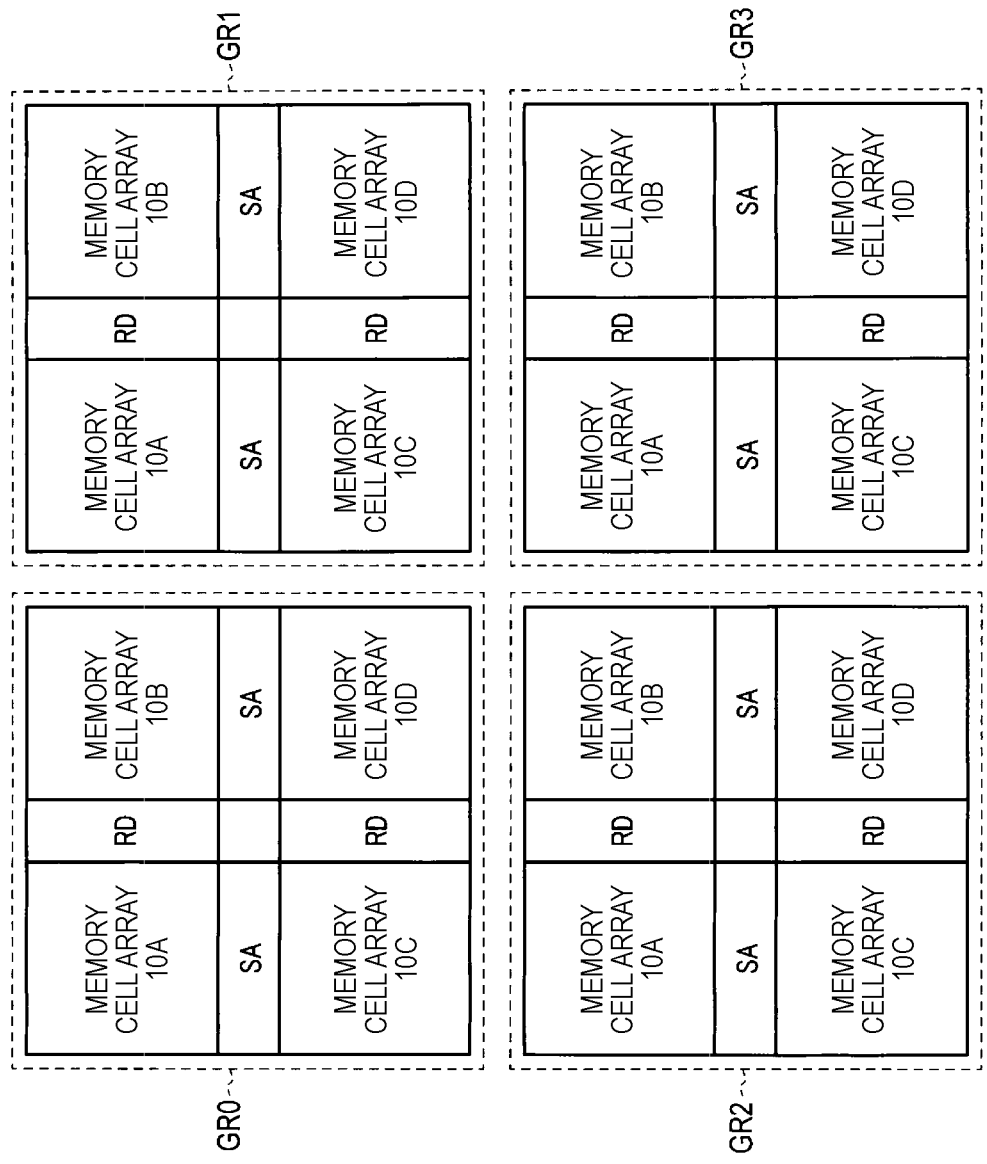
FIG. 37 is a block diagram of a semiconductor memory device according to a ninth embodiment.

First, the configuration of the semiconductor memory device 1 according to the ninth embodiment will be described with reference to FIG. 37. FIG. 37 illustrates a block diagram of the semiconductor memory device 1 according to the ninth embodiment. As illustrated in FIG. 37, the semiconductor memory device 1 includes memory groups GR0 to GR3 arranged in a matrix form.

Each memory group GR includes memory cell arrays 10A, 10B, 10C, and 10D arranged in a matrix form. Row decoders RD are provided between the memory cell arrays 10A and 10B and between the memory cell arrays 10C and 10D, respectively, and sense amplifiers SA are provided between the memory cell arrays 10A and 10C and between the memory cell arrays 10B and 10D, respectively. The sense amplifier SA and the row decoder RD illustrated in FIG. 37 correspond to circuits for driving a bit line BL and a word line WL, respectively, and other circuits may be provided between adjacent memory cell arrays.

In the above described semiconductor memory device 1, in the row direction (the word line direction), the memory cell arrays 10B and 10D of the memory group GR0 are adjacent to the memory cell arrays 10A and 10C of the memory group GR1, respectively, and the memory cell arrays 10B and 10D of the memory group GR2 are adjacent to the memory cell arrays 10A and 10C of the memory group GR3, respectively. In the column direction (the bit line direction), the memory cell arrays 10C and 10D of the memory group GR0 are adjacent to the memory cell arrays 10A and 10B of the memory group GR2, respectively, and the memory cell arrays 10C and 10D of the memory group GR1 are adjacent to the memory cell arrays 10A and 10B of the memory group GR3, respectively. Other configurations are the same as those of the semiconductor memory device 1 described in the first to eighth embodiments, and thus descriptions thereof will be omitted.

[9-2] Operation

Figure 38:
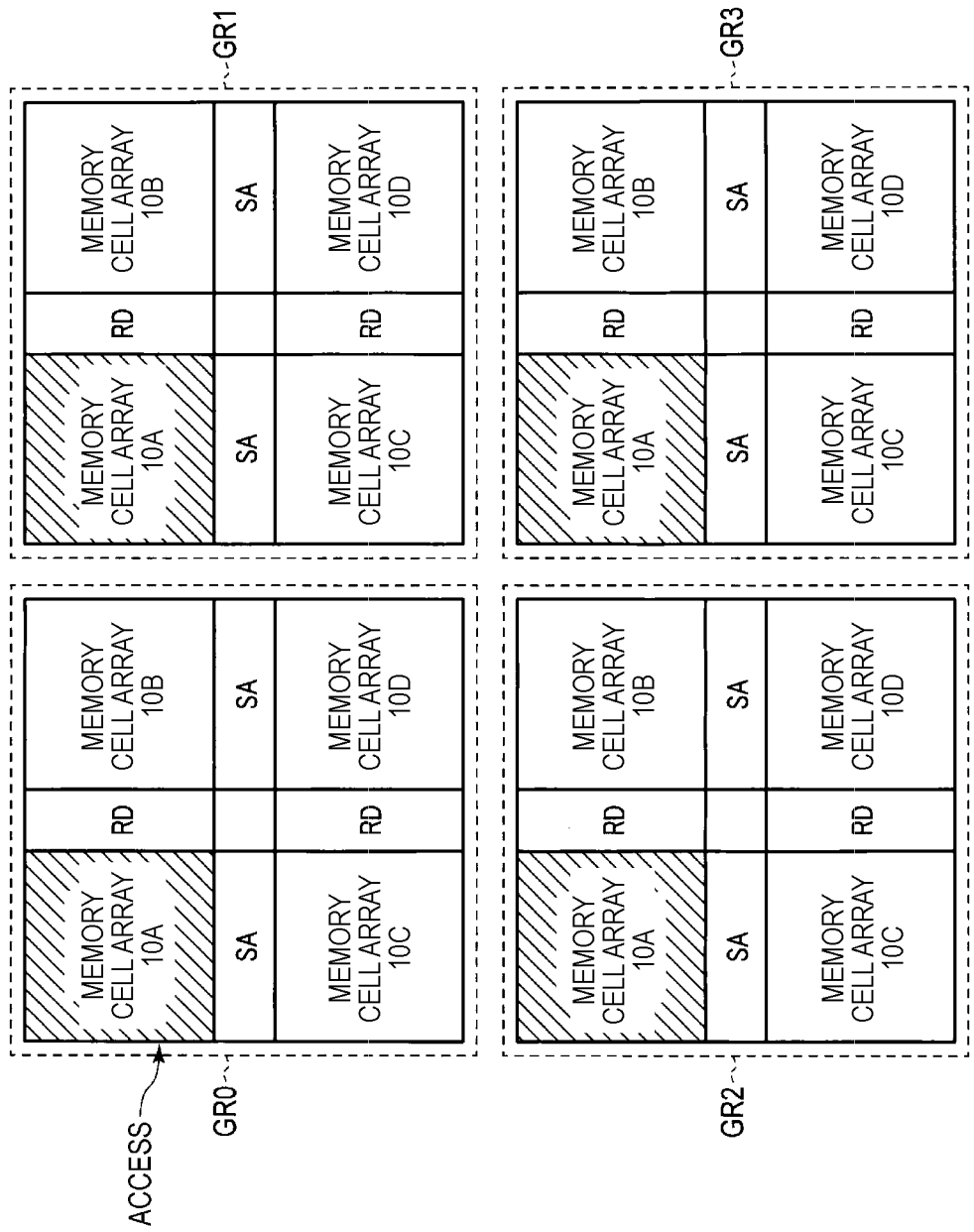
FIG. 38 is a block diagram illustrating an operation sequence of the semiconductor memory device according to the ninth embodiment.
Figure 39:
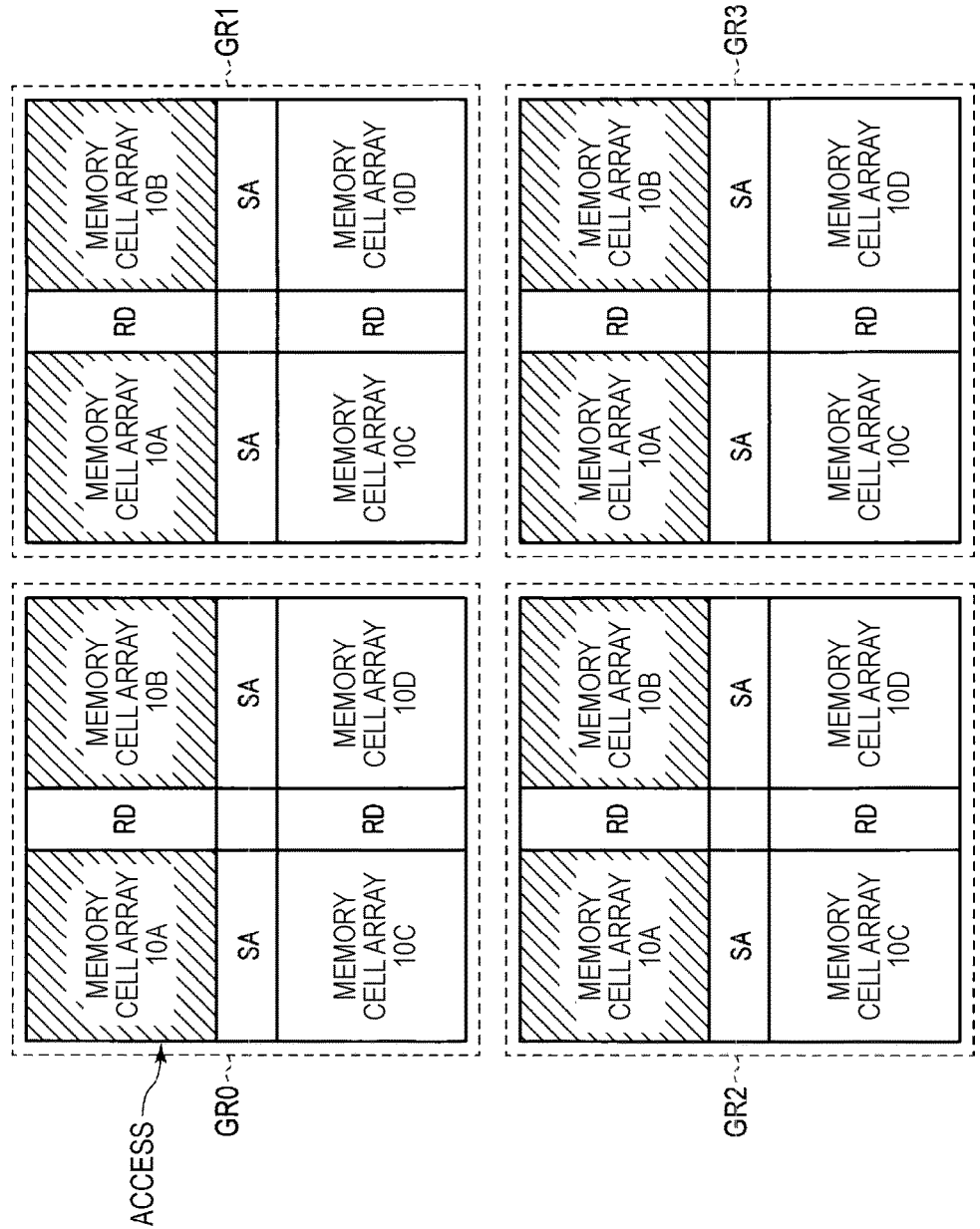
FIG. 39 is a block diagram illustrating an operation sequence of the semiconductor memory device according to the ninth embodiment.
Figure 40:
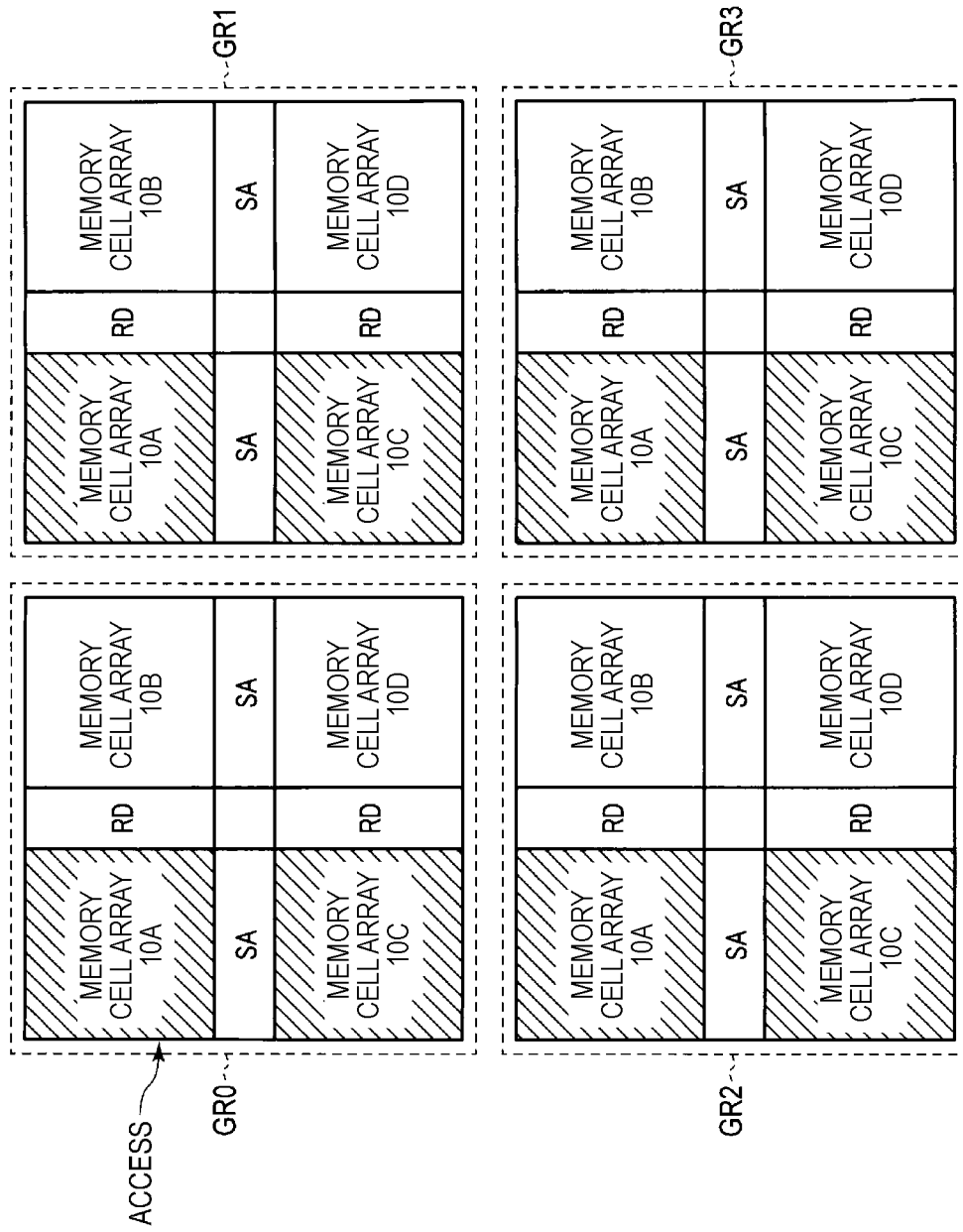
FIG. 40 is a block diagram illustrating an operation sequence of the semiconductor memory device according to the ninth embodiment.

In the above described semiconductor memory device 1, the controller 11 may execute various operations in parallel by controlling a plurality of memory cell arrays 10. Here, descriptions will be made on a combination of memory cell arrays 10 in which the controller 11 executes various operations in parallel in the ninth embodiment with reference to FIGS. 38 to 40. FIGS. 38 to 40 illustrate examples of a combination of the memory cell arrays 10 in which the controller 11 executes various operations in parallel in the semiconductor memory device 1 according to the ninth embodiment.

In the example illustrated in FIG. 38, the controller 11 accesses one memory cell array located at the same place of each memory group GR. Specifically, the controller 11 accesses the memory cell arrays 10A of the memory groups GR0 to GR3 in parallel. Meanwhile, the controller 11 does not access the memory cell arrays 10B, 10C and 10D of the memory groups GR0 to GR3. Likewise, in each of the cases of accessing the memory cell arrays 10B of the memory groups GR0 to GR3 in parallel, accessing the memory cell arrays 10C of the memory groups GR0 to GR3 in parallel, and accessing the memory cell arrays 10D of the memory groups GR0 to GR3 in parallel, the controller 11 does not access other memory cell arrays 10. That is, in this example, various operations are not executed in memory cell arrays 10 adjacent to memory cell arrays 10 in which various operations are being executed.

In the example illustrated in FIG. 39, the controller 11 accesses the memory cell arrays 10 located in a stripe shape in the row direction. Specifically, the controller 11 accesses the memory cell arrays 10A and 10B of the memory group GR0 and the memory cell arrays 10A and 10B of the memory group GR1, which are arranged in the row direction, and the memory cell arrays 10A and 10B of the memory group GR2 and the memory cell arrays 10A and 10B of the memory group GR3, which are arranged in the row direction, in parallel. Meanwhile, the controller 11 does not access the memory cell arrays 10C and 10D of the memory groups GR0 to GR3. Likewise, when accessing, in parallel, the memory cell arrays 10C and 10D of the memory group GR0, and the memory cell arrays 10C and 10D of the memory group GR1, which are arranged in the row direction, and the memory cell arrays 10C and 10D of the memory group GR2 and the memory cell arrays 10C and 10D of the memory group GR3, which are arranged in the row direction, the controller 11 does not access the memory cell arrays 10A and 10B of the memory groups GR0 to GR3. That is, operations are not executed in memory cell arrays 10 adjacent to, in the column direction, memory cell arrays 10 in which operations are being executed.

In the example illustrated in FIG. 40, the controller 11 accesses the memory cell arrays 10 located in a stripe shape in the column direction. Specifically, the controller 11 accesses the memory cell arrays 10A and 10C of the memory group GR0 and the memory cell arrays 10A and 10C of the memory group GR2, which are arranged in the column direction, and the memory cell arrays 10A and 10C of the memory group GR1 and the memory cell arrays 10A and 10C of the memory group GR3, which are arranged in the column direction, in parallel. The controller 11 does not access the memory cell arrays 10B and 10D of the memory groups GR0 to GR3. Likewise, when accessing, in parallel, the memory cell arrays 10B and 10D of the memory group GR0, and the memory cell arrays 10B and 10D of the memory group GR2, which are arranged in the column direction, and the memory cell arrays 10B and 10D of the memory group GR1 and the memory cell arrays 10B and 10D of the memory group GR3, which are arranged in the column direction, the controller 11 does not access the memory cell arrays 10A and 10C of the memory groups GR0 to GR3. That is, operations are not executed in memory cell arrays 10 adjacent to, in the row direction, memory cell arrays 10 in which operations are being executed.

[9-3] Effect of Ninth Embodiment

As described above, the semiconductor memory device 1 according to the ninth embodiment includes memory cell arrays 10 in which various operations are not executed when the controller 11 accesses a plurality of memory cell arrays 10 in parallel.

For example, in the example illustrated in FIG. 38, heat generated in the memory cell array 10A within each memory group GR is diffused to the adjacent memory cell arrays 10B and 10C, and is further diffused to the adjacent memory cell arrays 10 in other memory groups GR. Specifically, for example, heat generated in the memory cell array 10A of the group GR1 is diffused to the memory cell array 10B of the memory group GR0, and heat generated in the memory cell array 10A of the memory group GR2 is diffused to the memory cell array 10C of the memory group GR0. Likewise in the examples illustrated in FIGS. 39 and 40, heat generated in the memory cell array 10 accessed by the controller 11 is diffused to the adjacent memory cell arrays 10 in which operations are not executed.

Accordingly, the semiconductor memory device 1 according to the ninth embodiment may suppress a temperature rise of the memory cell array 10 during execution of various operations. Thus, the semiconductor memory device 1 according to the ninth embodiment may suppress the influence of disturbance caused by heat during various operations, thereby improving the reliability of data stored in the memory cell MC.

In the above, descriptions are made for the case where the memory cell arrays 10 are arranged in a 4×4 matrix form, but the present disclosure is not limited thereto. For example, the operation described in the ninth embodiment may be similarly applied to the case where the total number of memory cell arrays 10 is larger or smaller than the number of memory cell arrays 10 illustrated in FIG. 37.

The combinations of memory cell arrays 10 in which various operations can be executed in parallel are not limited to the above-described ones. For example, in the example described with reference to FIG. 38, accesses to the memory cell arrays 10 located on the diagonal line in each memory group GR may be performed in parallel. In this case, the controller 11 accesses, for example, the memory cell arrays 10A and 10D of each memory group GR in parallel.

In FIGS. 39 and 40, an example of a case where the controller 11 accesses the memory cell arrays 10 located in a stripe form, but the present disclosure is not limited thereto. For example, in the example illustrated in FIG. 39, selection and unselection of the memory cell arrays 10 in the row direction are alternately set, but a plurality of unselected memory cell arrays 10 may be arranged between the memory cell arrays 10 being accessed. Likewise in the example illustrated in FIG. 40, a plurality of unselected memory cell arrays 10 may be arranged between the memory cell arrays 10 to be accessed by the controller 11.

[10] Modification, Etc.

The semiconductor memory device 1 in the above example embodiments includes first to seventh conductors. A first conductor (e.g., FIG. 4, 31e) extends in the first direction (e.g., FIG. 4, the Y direction. A second conductor extends in the second direction (e.g., FIG. 4, the X direction) different from the first direction above the first conductor. Third and fourth conductors (e.g., FIG. 4, 30o and 31o) extend in the first direction and are adjacent to each other in the second direction above the second conductor. A fifth conductor (e.g., FIG. 4, MCL) includes a variable resistance unit, and is provided between the first and second conductors. A sixth conductor (e.g., FIG. 4, MCU) includes a variable resistance unit, and is provided between the third and second conductors. A seventh conductor (e.g., FIG. 4, MCU) includes a variable resistance unit, and is provided between the fourth and second conductors. In the plane formed by the first and second directions, the center of the fifth conductor in the second direction is located between the sixth conductor and the seventh conductor.

Accordingly, it is possible to provide a semiconductor memory device capable of improving the reliability of data stored in a memory cell.

In the above example embodiments, a phase change memory is described as an example of the semiconductor memory device 1, but the present disclosure is not limited thereto. Each embodiment may also be applicable to other resistance change memories such as, for example, a resistance random access memory (ReRAM).

In the above example embodiments, descriptions are made for cases where the memory cell MC is provided between a conductor corresponding to a bit line BL and a conductor corresponding to a word line WL, as an example, but the present disclosure is not limited thereto. For example, the memory cell MC may include other conductors, and another conductor may be interposed between the variable resistance unit 40 and the diode unit 41.

In the above example embodiments, descriptions are made on the case where bit lines BL corresponding to each memory unit MU are arranged in the Z direction, as an example, but the present disclosure is not limited thereto. The arrangement of the bit lines BL corresponding to each memory unit MU may be changed based on a connection relationship between conductors corresponding to the bit lines BL and the bit line driver 15. For example, a group of bit lines BL provided in the same wiring layer may be associated with one memory unit MU. In this case, the global bit line GBL diverges for each wiring layer while diverging in the plane. As described above, the above embodiments may also be applied to the case where the design of the memory unit MU varies, and the semiconductor memory device 1 may achieve the same effect.

In the above embodiments, descriptions are of the case where as the diode DI used for the memory cell MC, is a PN junction diode or a Schottky diode, but the present disclosure is not limited thereto. A rectifying element having other characteristics and structures may be employed. For example, a bidirectional diode such as a metal insulator metal (MIM) diode as illustrated in FIG. 41 or a diode using a chalcogenide system as illustrated in FIG. 42 may be used.

The bidirectional diode allows a current to flow depending on a voltage value even when applied with a voltage which corresponds to a reverse bias in a normal diode having a function of passing a current only in one direction. Even when such a rectifying element having other rectifying characteristics is used, the above embodiments may be implemented by properly changing voltage conditions according to characteristics related to rectification.

Figure 41:
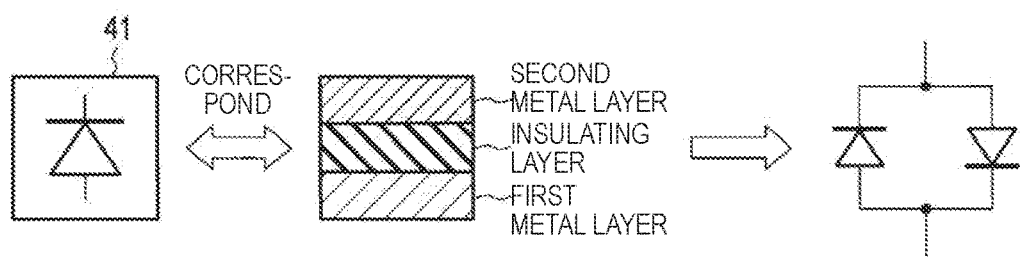
FIG. 41 is a cross-section view of a diode disposed in a memory cell provided in a semiconductor memory device according to a modification of the first to eighth embodiments.
Figure 42:
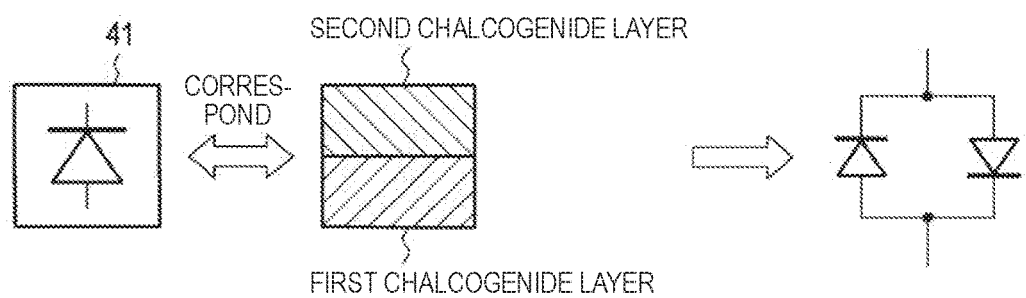
FIG. 42 is a cross-section view of a diode disposed in a memory cell provided in a semiconductor memory device according to a modification of the first to eighth embodiments.

As illustrated in FIG. 41, when the diode DI is an MIM (metal-insulator-metal) diode, the diode unit 41 has a structure in which a first metal layer, an insulating layer, and a second metal layer are sequentially stacked. As illustrated in FIG. 42, when the diode DI is a diode using a chalcogenide system, the diode unit 41 has a structure in which a first chalcogenide layer and a second chalcogenide layer are sequentially stacked. As the chalcogenide-based material used for the chalcogenide layer illustrated in FIG. 42, AgTe, GeTe, SbTe, SbSe and the like may be used as examples. As a rectifying element utilizing the chalcogenide-based material, an element having a very short retention time may be used. Specifically, a rectifying element, which has a low resistance during a rising voltage application and has a high resistance immediately when the voltage falls, may be used.

In the configuration according to the above embodiments, one end of each rectifying element (diode) within a memory cell MC is connected to a bit line BL, and the other end is connected to a variable resistance element VR, and a direction from the bit line BL toward the variable resistance element VR is forward-biased. If a rectifying element having other rectifying characteristics is used, the arrangement within the memory cell MC may be changed as required.

In the above embodiments, descriptions were made for the case in which a set of conductors corresponding to the same word line WL or a set of conductors corresponding to a bit line BL corresponding to the same memory unit MU is disposed on a straight line along the stacking direction within a region of the device, as an example, but the present disclosure is not limited thereto. For example, in the structure of the semiconductor memory device 1, in the set of conductors corresponding to the same word line WL, the conductors corresponding to the upper layer may be slightly shifted in one direction, and also the direction in which the conductors corresponding to the upper layer are shifted is inverted halfway. In this manner, in the semiconductor memory device 1 according to each embodiment, it is possible to arbitrarily set a shifting direction or distance between respective wiring layers.

In the first embodiment, descriptions are made on the case where the word lines WLo and WLe sharing the bit line BL do not overlap in the plan view layout, as an example, but the present disclosure is not limited thereto. For example, in the semiconductor memory device 1, there is a possibility that a misalignment caused by a processing error or the like may occur. In such a case, the conductor 30o, corresponding to the word line WLo0, and the conductor 30e, corresponding to the word line WLe0, may partially overlap. Likewise, the conductor 30o, corresponding to the word line WLo0, and the conductor 31e, corresponding to the word line WLe1, may partially overlap.

Even in such a case, when memory cells MCL and MCU sharing a bit line BL and located adjacent to each other are shifted to some extent, the semiconductor memory device 1 may still sufficiently obtain an effect of dispersing heat. Specifically, the distance between centers of the memory cells MCL and MCU may be equal to or larger than a radius of each memory cell MC in the bit line direction (e.g., the X direction illustrated in FIG. 4). Here, when the memory cell is a cylindrical pillar, the "radius" corresponds to a radius of a cylinder, or when the memory cell is a rectangular pillar, it is assumed that the largest cylinder is formed inside the pillar, and the "radius" here corresponds to a radius of a the largest cylinder fitting within the perimeter of the rectangular pillar.

Similarly, in the second embodiment, descriptions are made on the case where the bit lines BLo and BLe sharing the word line WL do not overlap in the plan view layout, as an example, but the present disclosure is not limited thereto. For example, due to a misalignment caused by processing errors or the like, in the memory unit MU0, the conductor 20o, corresponding to the bit line BLo, and the conductor 20e, corresponding to the bit line BLe, may partially overlap. Similarly, the conductor 20o, corresponding to the bit line BLo of the memory unit MU0, and the conductor 21e, corresponding to the bit line BLe of the memory unit MU1, may partially overlap.

Even in such a case, when memory cells MCL and MCU sharing a word line WL and located adjacent to each other are shifted to some extent, the semiconductor memory device 1 may still sufficiently obtain an effect of dispersing heat. Specifically, the distance between centers of the formed memory cells MCL and MCU may be equal to or larger than a radius of the memory cell MC in the word line direction (e.g., the Y direction illustrated in FIG. 14).

The above described supplementary explanation of the misalignment caused by processing errors in the first embodiment and the second embodiment may be similarly applied to the third embodiment as a combination of the first and second embodiments.

In the above embodiments, descriptions have been made for the case in which each memory cell MC holds one bit of data, but the present disclosure is not limited thereto. For example, the memory cell MC may hold data of two or more bits. In such a case, the variable resistance element VR provided in the memory cell MC may take at least three or more different resistance states. For example, since the variable resistance element VR takes three or more different resistance states, a reference current generation circuit (not specifically illustrated) is also configured to generate a plurality of corresponding reference currents in the same manner.

In this specification, "connection" generally indicates an electrical connection, and does not exclude, for example, a case in which another conductive element is interposed in the connection. In this specification, "disconnection" or "disconnected" indicates that a switch is in an OFF state, but does not exclude, for example, a case in which a minute leakage current such as a leakage current through a transistor flows through the switch.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a first conductor extending in a first direction;
   a second conductor extending in a second direction different from the first direction, the second conductor being above the first conductor in a third direction orthogonal to the first and second directions;
   third and fourth conductors each extending in the first direction and adjacent to each other in the second direction, the third and fourth conductors being above the second conductor in the third direction;
   a fifth conductor including a variable resistance unit and between the first and second conductors in the third direction;
   a sixth conductor including a variable resistance unit and between the third and second conductors in the third direction;
   a seventh conductor including a variable resistance unit and between the fourth and second conductors in the third direction;
   a sense amplifier electrically connectable to any one of the first conductor, the third conductor, and the fourth conductor, wherein
   a center point of the fifth conductor along a width of the fifth conductor in the second direction does not fully overlap with either of the sixth or seventh conductors along the third direction,
   the first conductor, the third conductor, and the fourth conductor are each a separately addressable bit line,
   the second conductor is a word line, and
   the fifth conductor, the sixth conductor, and the seventh conductor are each a memory cell.

2. The semiconductor memory device according to claim 1, wherein
   a first end of the fifth conductor in the third direction is in contact with the first conductor,
   a second end of the fifth conductor in the third direction and opposite the first end of the fifth conductor is in contact with the second conductor,
   a first end of the sixth conductor in the third direction is in contact with the third conductor,
   a second end of the sixth conductor in the third direction and opposite first end of the sixth conductor is in contact with the second conductor,
   a first end of the seventh conductor in the third direction is in contact with the fourth conductor, and
   a second end of the seventh conductor in the third direction and opposite the first end of the seventh conductor is in contact with the second conductor.

3. The semiconductor memory device according to claim 1, wherein
   each of the fifth, sixth, and seventh conductors includes a diode unit,
   in the fifth conductor, the variable resistance unit is above the diode unit in the third direction,
   in the sixth conductor, the diode unit is above the variable resistance unit in the third direction, and
   in the seventh conductor, the diode unit is above the variable resistance unit in the third direction.

4. The semiconductor memory device according to claim 1, further comprising:
   an eighth conductor extending in the second direction and above the third and fourth conductors in the third direction;
   a ninth conductor extending in the first direction and above the eighth conductor in the third direction;
   a tenth conductor including a variable resistance unit and between the third conductor and the eighth conductor in the third direction;
   an eleventh conductor including a variable resistance unit and between the fourth conductor and the eighth conductor in the third direction; and
   a twelfth conductor including a variable resistance unit and between the eighth conductor and the ninth conductor in the third direction, wherein, the fifth and twelfth conductors overlap each other along the third direction, the sixth and tenth conductors overlap each other along the third direction, and the seventh and eleventh conductors overlap each other along the third direction, and
   a center point of the twelfth conductor along a width of the twelfth conductor in the second direction is at a point that does not overlap with either of the tenth conductor or the eleventh conductor along the third direction.

5. The semiconductor memory device according to claim 1, further comprising:
   eighth and ninth conductors each extending in the second direction and adjacent to each other in the first direction, the eighth and ninth conductors being below the first conductor in the third direction;
   a tenth conductor including a variable resistance unit and between the first conductor and the eighth conductor in the third direction; and
   an eleventh conductor including a variable resistance unit and between the first conductor and the ninth conductor in the third direction, wherein the center point of the fifth conductor does not overlap with either of the tenth conductor or the eleventh conductor along the third direction.

6. The semiconductor memory device according to claim 5, wherein
- a first end of the fifth conductor in the third direction is in contact with the first conductor,
- a second end of the fifth conductor in the third direction and opposite the first end of the fifth conductor is in contact with the second conductor,
- a first end of the sixth conductor in the third direction is in contact with the third conductor,
- a second end of the sixth conductor in the third direction and opposite the first end of the sixth conductor is contact with the second conductor
- a first end of the seventh conductor in the third direction is in contact with the fourth conductor,
- a second end of the seventh conductor in the third direction and opposite the first end of the seventh conductor is in contact with the second conductor,
- a first end of the tenth conductor in the third direction is in contact with the first conductor,
- a second end of the tenth conductor in the third direction and opposite the first end of the tenth conductor is in contact with eighth conductor, and
- a first end of the eleventh conductor in the third direction is in contact with the first conductor, and
- a second end of the eleventh conductor in the third direction and opposite the first end of the eleventh conductor is in contact with the ninth conductor.

7. The semiconductor memory device according to claim 5, further comprising:
- a sense amplifier electrically connectable to any one of the first conductor, the third conductor, and the fourth conductor, wherein
- the second conductor, the eighth conductor, and the ninth conductor are each a separately addressable word line,
- the first conductor, the third conductor, and the fourth conductor are each a separately addressable bit line, and
- the fifth conductor, the sixth conductor, the seventh conductor, the tenth conductor, and the eleventh conductor are each a memory cells.

8. The semiconductor memory device according to claim 7, wherein
- each of the fifth conductor, the sixth conductor, the seventh conductor, the tenth conductor and the eleventh conductor includes a diode unit,
- in the fifth conductor, the variable resistance unit is above the diode unit in the third direction,
- in the sixth conductor, the diode unit is above the variable resistance unit in the third direction,
- in the seventh conductor, the diode unit is above the variable resistance unit in the third direction,
- in the tenth conductor, the diode unit is above the variable resistance unit in the third direction, and
- in the eleventh conductor, the diode unit is above the variable resistance unit in the third direction.

9. The semiconductor memory device according to claim 1, wherein at least one variable resistance unit includes germanium, tellurium, or antimony.

* * * * *